(12) United States Patent
Hampden-Smith et al.

(10) Patent No.: US 6,730,245 B2
(45) Date of Patent: May 4, 2004

(54) CHEMICAL-MECHANICAL PLANARIZATION SLURRIES AND POWDERS AND METHODS FOR USING SAME

(75) Inventors: Mark J. Hampden-Smith, Albuquerque, NM (US); Toivo T. Kodas, Albuquerque, NM (US); James Caruso, Albuquerque, NM (US); Daniel J. Skamser, Albuquerque, NM (US); Quint H. Powell, Albuquerque, NM (US)

(73) Assignee: Superior MicroPowders, Albuquerque, NM (US)

( * ) Notice: Subject to any disclaimer, the term of this patent is extended or adjusted under 35 U.S.C. 154(b) by 476 days.

(21) Appl. No.: 09/753,026

(22) Filed: Jan. 2, 2001

(65) Prior Publication Data

US 2002/0003225 A1 Jan. 10, 2002

Related U.S. Application Data

(62) Division of application No. 09/028,628, filed on Feb. 24, 1998.
(60) Provisional application No. 60/038,263, filed on Feb. 24, 1997, and provisional application No. 60/039,450, filed on Feb. 24, 1997.

(51) Int. Cl.[7] ................................. B29B 9/10
(52) U.S. Cl. ................... 264/7; 264/9; 264/13
(58) Field of Search .................... 264/7, 9, 13

(56) References Cited

U.S. PATENT DOCUMENTS

| | | | |
|---|---|---|---|
| 4,871,489 A | 10/1989 | Ketcham | 264/9 |
| 4,910,155 A | 3/1990 | Cote et al. | 437/8 |
| 4,919,868 A | 4/1990 | Huang | 264/65 |
| 4,929,257 A | 5/1990 | Miyazaki et al. | 51/309 |
| 4,954,142 A | 9/1990 | Carr et al. | 51/309 |
| 5,209,816 A | 5/1993 | Yu et al. | 156/636 |
| 5,225,034 A | 7/1993 | Yu et al. | 156/636 |
| 5,264,010 A | 11/1993 | Brancaleoni et al. | 51/308 |
| 5,302,368 A | 4/1994 | Harato et al. | 423/625 |
| 5,362,700 A | 11/1994 | Doumaux, Jr. | 502/208 |
| 5,384,306 A | 1/1995 | König et al. | 501/152 |
| 5,389,352 A | 2/1995 | Wang | 423/263 |
| 5,417,874 A | 5/1995 | Carlson et al. | 252/74 |
| 5,429,647 A | 7/1995 | Larmie | 51/295 |
| 5,527,423 A | 6/1996 | Neville et al. | 156/636.1 |
| 5,650,619 A | 7/1997 | Hudson | 250/302 |
| 5,693,239 A | 12/1997 | Wang et al. | 216/88 |
| 5,697,992 A | 12/1997 | Ueda et al. | 51/307 |
| 5,891,205 A | 4/1999 | Picardi et al. | 51/308 |

(List continued on next page.)

OTHER PUBLICATIONS

Vallet–Regi et al., "Synthesis and Characterization of CeO2 Obtained by Spray Pyrolysis Method", Materials Science Forum, vol. 235–238, pp. 291–296 (1997).

Mani et al., "Sol–Spray Technique for Fine–Grained Ceria Particles", Ceramics International, pp. 125–128, published in 1993.

Korman et al., "Distribution Systems for CMP: The New Challenge", Journal of Electronic Materials, vol. 25, No. 10, pp. 1608–1611, published in 1996.

(List continued on next page.)

Primary Examiner—Mary Lynn Theisen
(74) Attorney, Agent, or Firm—Marsh Fischmann & Breyfogle LLP

(57) ABSTRACT

Chemical-mechanical planarization slurries and methods for using the slurries wherein the slurry includes abrasive particles. The abrasive particles have a small particle size, narrow size distribution and a spherical morphology and the particles are substantially unagglomerated.

49 Claims, 44 Drawing Sheets

U.S. PATENT DOCUMENTS

| | | | |
|---|---|---|---|
| 5,916,855 A | | 6/1999 | Avanzino et al. .............. 51/307 |
| 5,958,794 A | | 9/1999 | Bruxvoort et al. ........... 438/692 |
| 5,993,685 A | | 11/1999 | Currie et al. ............... 252/79.1 |
| 6,165,247 A | * | 12/2000 | Kodas et al. .................. 75/331 |
| 6,241,586 B1 | | 6/2001 | Yancey ......................... 451/41 |
| 6,270,395 B1 | | 8/2001 | Towery et al. ................. 451/41 |
| 6,277,169 B1 | * | 8/2001 | Hampden-Smith et al. ... 75/336 |
| 6,313,039 B1 | | 11/2001 | Small et al. ................. 438/693 |
| 6,338,809 B1 | * | 1/2002 | Hampden-Smith et al. .... 264/7 |
| 6,436,811 B1 | | 8/2002 | Wake et al. ................. 438/633 |

OTHER PUBLICATIONS

Hasewaga et al., "Effect of Additive Oxides on Ultrafine CeO2 Particles Synthesized by the Spray–ICP Technique", The Journal of Material Science Letters, pp. 1608–1611, published in 1996.

Pohl et al., "The Importance of Particle Size to the Performance of Abrasive Particles in the CMP Process", Journal of Electronic Materials, vol. 25, No. 10, published in 1996.

* cited by examiner

102 → AEROSOL GENERATOR 106 —[108]→ FURNACE 110 —[112]→ PARTICLE COLLECTOR 114 —[116]→

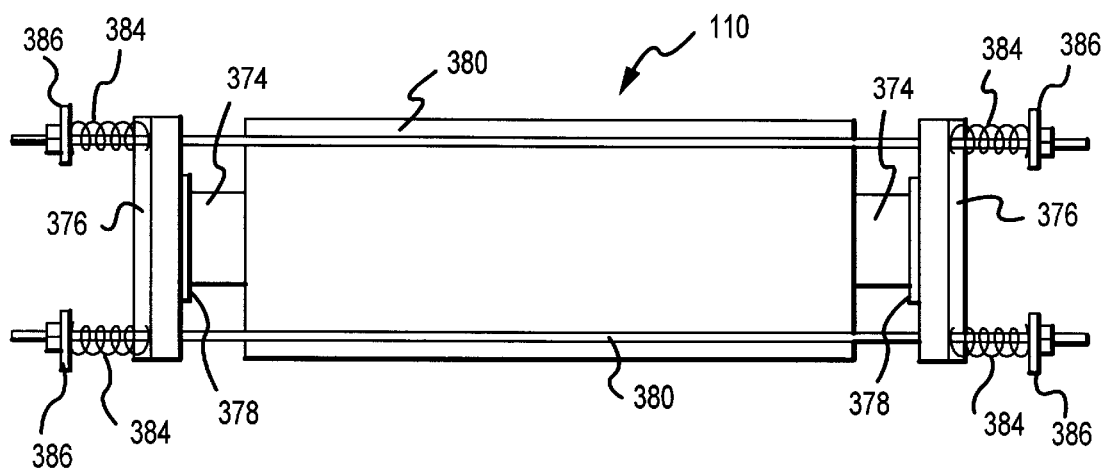
FIG.2
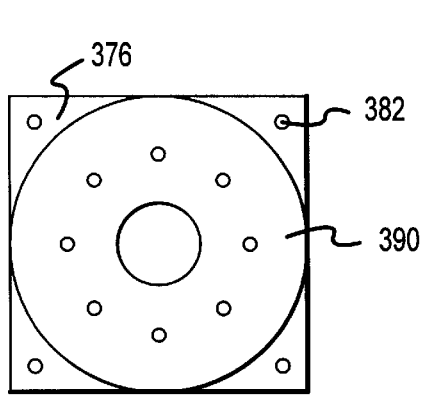 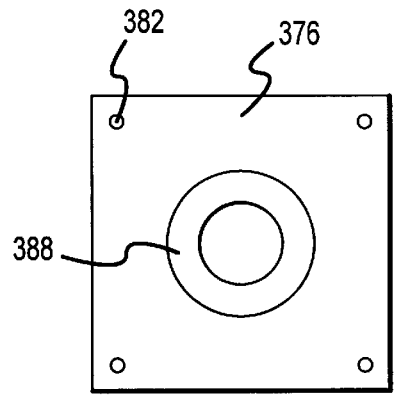
FIG.3　　　　　　　　FIG.4

FIG.25

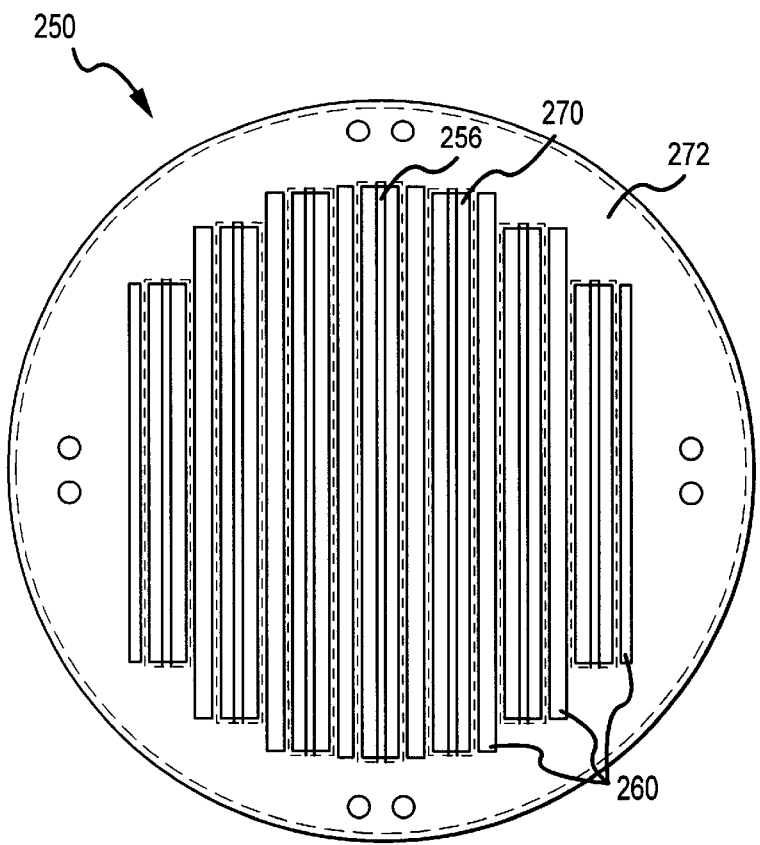
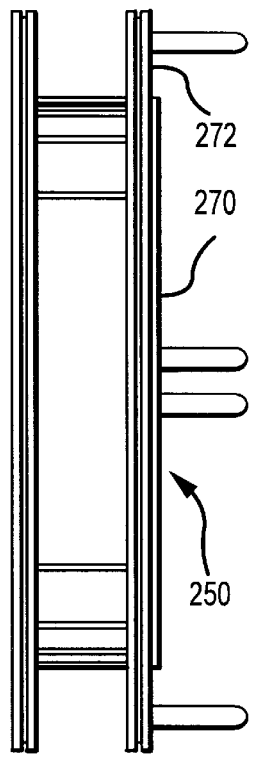
FIG.30
FIG.32
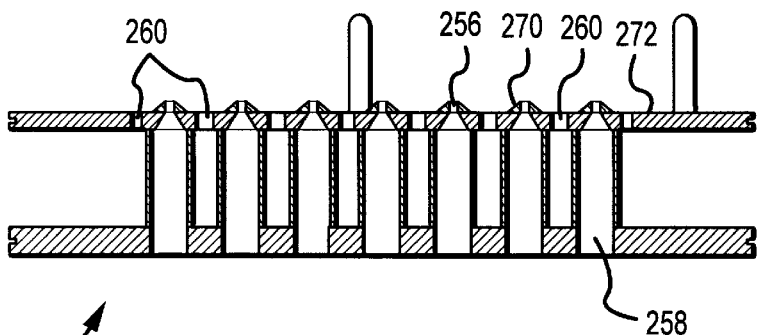
FIG.31

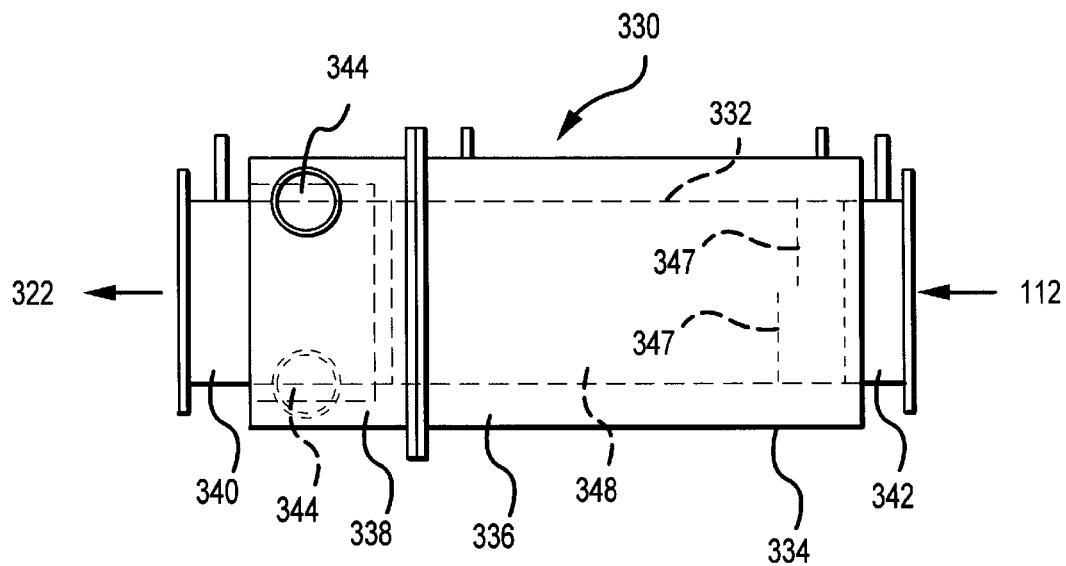
FIG. 41
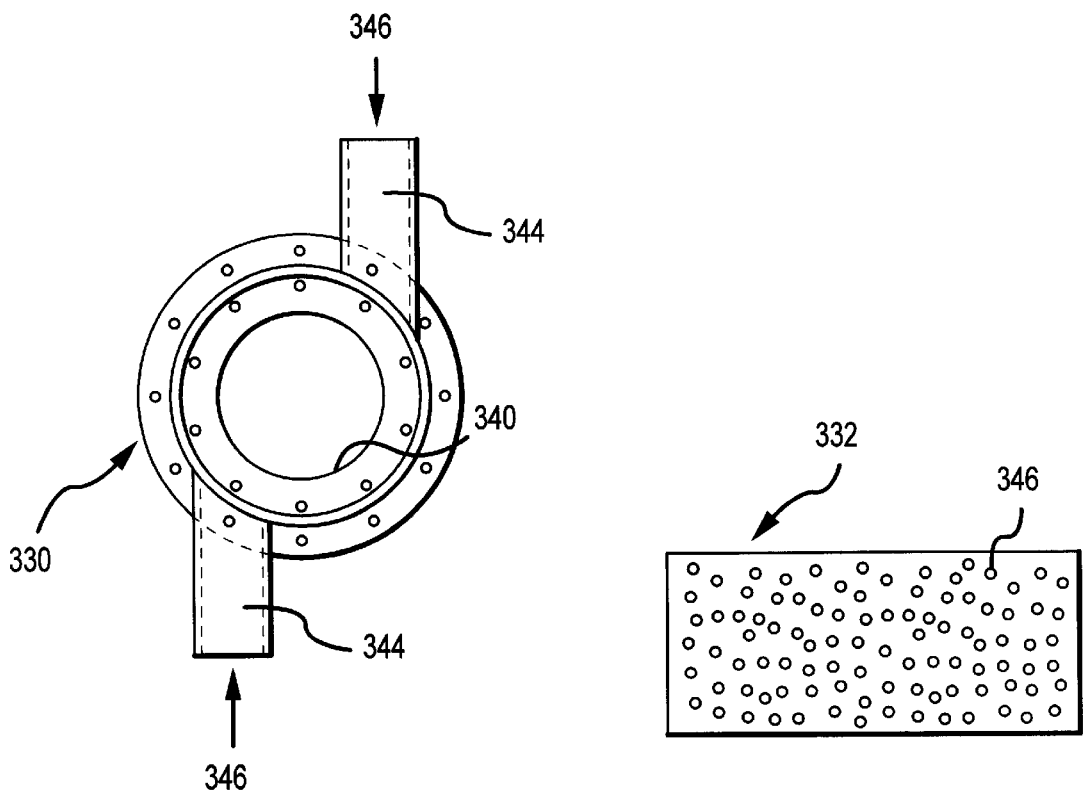
FIG. 42
FIG. 43

102 → AEROSOL GENERATOR 106 →108 FURNACE 110 →112 PARTICLE COATER 350 →352 PARTICLE COLLECTOR 114 → 116

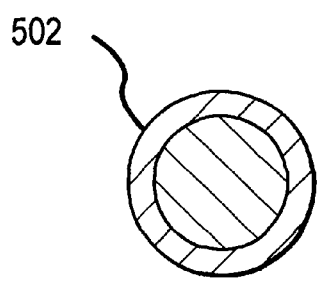
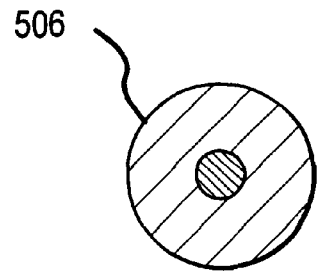
FIG.47(a)     FIG.47(b)
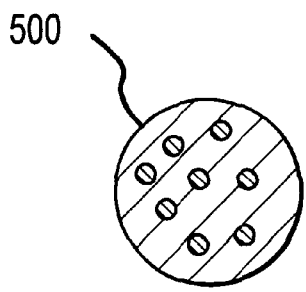
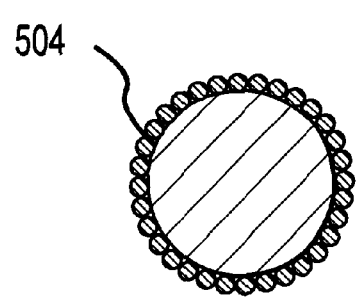
FIG.47(c)     FIG.47(d)
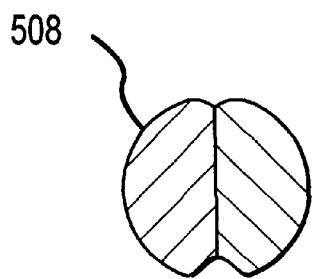
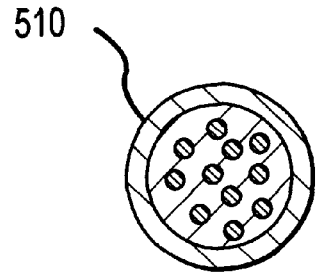
FIG.47(e)     FIG.47(f)

102 → [AEROSOL GENERATOR 106] —108→ 119 →[FURNACE 110] —112→ [PARTICLE COLLECTOR 114] →116

CHEMICAL-MECHANICAL PLANARIZATION SLURRIES AND POWDERS AND METHODS FOR USING SAME

This application is a divisional application of U.S. patent application Ser. No. 09/028,628, filed on Feb. 24, 1998, now U.S. Pat. No. 6,602,439, which claims the benefit of U.S. Provisional Application No. 60/038,263 filed on Feb. 24, 1997 and U.S. Provisional Application No. 60/039,450, filed on Feb. 24, 1997.

BACKGROUND OF THE INVENTION

1. Field of the Invention

The present invention relates to abrasive powders and slurries containing the powders, as well as chemical mechanical planarization processes utilizing the slurries. In particular, the present invention is directed to such powders and slurries wherein the abrasive powder has a small average particle size, controlled particle size distribution, spherical morphology and is substantially unagglomerated.

2. Description of Related Art

Slurries consisting of abrasive and/or chemically reactive particles in a liquid medium are used for a variety of polishing and planarizing applications. Some applications include polishing of technical glass, magnetic memory disks, native silicon wafers and stainless steel used in medical devices. Chemical-mechanical planarization (CMP) is a method to flatten and smooth a workpiece to a very high degree of uniformity. CMP is used in a variety of applications including polishing of glass products such as flat panel display glass faceplates and planarization of wafer-based devices during semiconductor manufacture. In particular, the semiconductor industry utilizes CMP to planarize dielectric, metal film as well as patterned metal layers in the various stages of integrated circuit manufacture.

CMP consists of moving a nonplanarized, unpolished surface against a polishing pad at several PSI of pressure with a CMP slurry disposed between the pad and the surface being treated. This is typically accomplished by coating the pad with a slurry and spinning the pad against the substrate at relatively low speeds. The CMP slurry includes at least one of two components: an abrasive powder for mechanical action and solution reactants for chemical action. The solution reactants are typically simple complexing agents or oxidizers, depending on the materials to be polished, and acids or bases to tailor the pH. For polishing metal layers, the slurry will predominately polish the metal through the action of the solution reactants. The abrasive powder is primarily responsible for the mechanical abrasion at the surface, but can also contribute to the chemical action near the surface.

As the powder abrades the surface, protrusions and other irregularities are removed. The chemical species in the slurry can perform different functions, such as aiding in the dissolution of the mechanically removed material by dissolving it into solution or oxidizing the surface layers to form a protective oxide layer. The particular solution chemistry is primarily dependent upon the material being worked upon. The presence of an abrasive material, however, is common to all CMP slurries.

Conventional abrasive powders are hard agglomerates (i.e. aggregates) typically with an average aggregate size of less than about 1 μm in diameter. The particles are typically agglomerates of smaller particles having an irregular shape, which decreases the performance of the slurry. Larger non-spherical particles and particle agglomerates in the slurry result in scratching of the surface as well as uneven and unpredictable polishing rates. As a result, semiconductor device manufacturers are forced to dispose of a significant number of defective devices, increasing the production cost.

CMP slurries can be placed into categories based on the materials to be polished. Oxide polishing refers to the polishing of the oxide or interlayer dielectrics in integrated circuits, while metal polishing is the polishing of metal interconnects (plugs) in integrated circuits. Silica ($SiO_2$) and alumina ($Al_2O_3$) are most widely used as abrasives for metal polishing, while silica is used almost exclusively for oxide polishing. Ceria ($CeO_2$) is also used for some applications, including metal polishing and polymer polishing.

Many examples of CMP processes are illustrated in the prior art, particularly slurries for use in CMP. For example, U.S. Pat. No. 4,910,155 by Cote et al. discloses a chemical mechanical polishing process for planarizing insulators wherein a slurry of particulates at an elevated temperature is disposed between a rotating polish pad and the insulator surface to be polished. U.S. Pat. No. 4,954,142 by Carr et al. discloses a chemical mechanical polishing method including the use of a slurry comprising abrasive particles, a transition metal chelated salt and a solvent for the salt. The salt selectively etches certain features, such as copper vias, on the surface of an electronic component substrate.

U.S. Pat. No. 5,209,816 by Yu et al. discloses a semiconductor planarization method particularly useful for aluminum containing metal layers. The method includes the use of a mechanical polishing slurry comprising phosphoric acid and hydrogen peroxide. The hydrogen peroxide is an oxidizing agent that oxidizes the aluminum to alumina, which is subsequently etched by the phosphoric acid. U.S. Pat. No. 5,225,034 by Yu discloses a semiconductor planarization method particularly useful for planarization of copper containing layers. The method utilizes a slurry which includes at least one of $HNO_3$, $H_2SO_4$ and $AgNO_3$.

Some work has been directed to the tailoring of the abrasive particle component. For example, U.S. Pat. No. 5,264,010 by Brancaleoni et al. discloses an abrasive composition for use in planarizing the surface of a work piece, wherein the abrasive portion includes 30 to 50 weight percent cerium oxide, 8 to 20 weight percent fumed silica and 15 to 45 weight percent precipitated silica. It is disclosed that the combination of the three types of abrasive provides good planarization.

U.S. Pat. No. 5,527,423 by Neville et al. discloses a slurry for use in chemical mechanical polishing of metal layers. The slurry includes abrasive particles that are agglomerates of very small particles and are formed from fumed silicas or fumed aluminas. The agglomerated particles, typical of fumed materials, have a jagged, irregular shape. It is disclosed that the particles have a surface area of 40 to 430 $m^2/g$, an aggregate size distribution less than about 1 μm and a mean aggregate diameter of less than about 0.4 μm.

U.S. Pat. No. 5,389,352 by Wang disclosed a process for preparing a chemically active oxide particle composed primarily of $CeO_2$. The method includes forming an aqueous solution of a cerium salt and an oxidizing agent and aging the mixture for at least about 4 hours. The particle size of the powder was on the order of about 0.1 μm. U.S. Pat. No. 5,429,647 by Larmie discloses a method for preparing an abrasive grain which includes both alumina and ceria.

U.S. Pat. No. 5,693,239 by Wang et al. discloses a CMP slurry which includes abrasive particles wherein about 1 to 50 weight percent of the particles and crystalline alumina and the remainder of the particles are less abrasive materials such as aluminum hydroxides, silica and the like.

Each of the foregoing U.S. patents is incorporated herein by reference, in their entirety.

Conventional CMP powders typically consist of agglomerated particles having an agglomerate shape that is inadequate for reproducible CMP performance. As a result, integrated circuit manufacturers scrap significant amounts of product due to defects formed during the CMP step. Furthermore, as integrated circuit dimensions continue to decrease in size, there will be an increasing demand for higher CMP performance and reliability, particularly for damascene and dual damascene structures.

Conventional CMP powders are produced using a flame combustion process which produces small particles that are highly agglomerated. These particles are commonly referred to as fumed. Due to the high degree of agglomeration, these particles have angular and irregular shapes which lowers the reliability of the CMP process by virtue of uncontrollable polishing and removal rates. The elongated and angular particles behave like miniature knife blades cutting into the surface of the integrated circuit. Non-spherical particles also tend to abrade the metal portions at too high of an abrasion rate.

There is a need for abrasive powders for CMP slurries that will permit better control over the planarization process. It would be particularly advantageous if such powders could be produced in large quantities on a continuous basis.

BRIEF DESCRIPTION OF THE DRAWINGS

FIG. 1 is a process block diagram showing one embodiment of the process of the present invention.

FIG. 2 is a side view of a furnace and showing one embodiment of the present invention for sealing the end of a furnace tube.

FIG. 3 is a view of the side of an end cap that faces away from the furnace shown in FIG. 2.

FIG. 4 is a view of the side of an end cap that faces toward the furnace shown in FIG. 2.

FIG. 25 is a process block diagram of one embodiment in the present invention including an aerosol concentrator.

FIG. 42 is an end view of the gas quench cooler shown in FIG. 41.

FIG. 43 is a side view of a perforated conduit of the quench cooler shown in FIG. 41.

FIG. 45 is a process block diagram of one embodiment of the present invention including a particle coater.

FIG. 47 shows cross sections of various particle morphologies of some composite particles manufacturable according to the present invention.

FIG. 49 is a block diagram of one embodiment of the process of the present invention including the addition of a dry gas between the aerosol generator and the furnace.

DETAILED DESCRIPTION OF THE INVENTION

Figure 5:
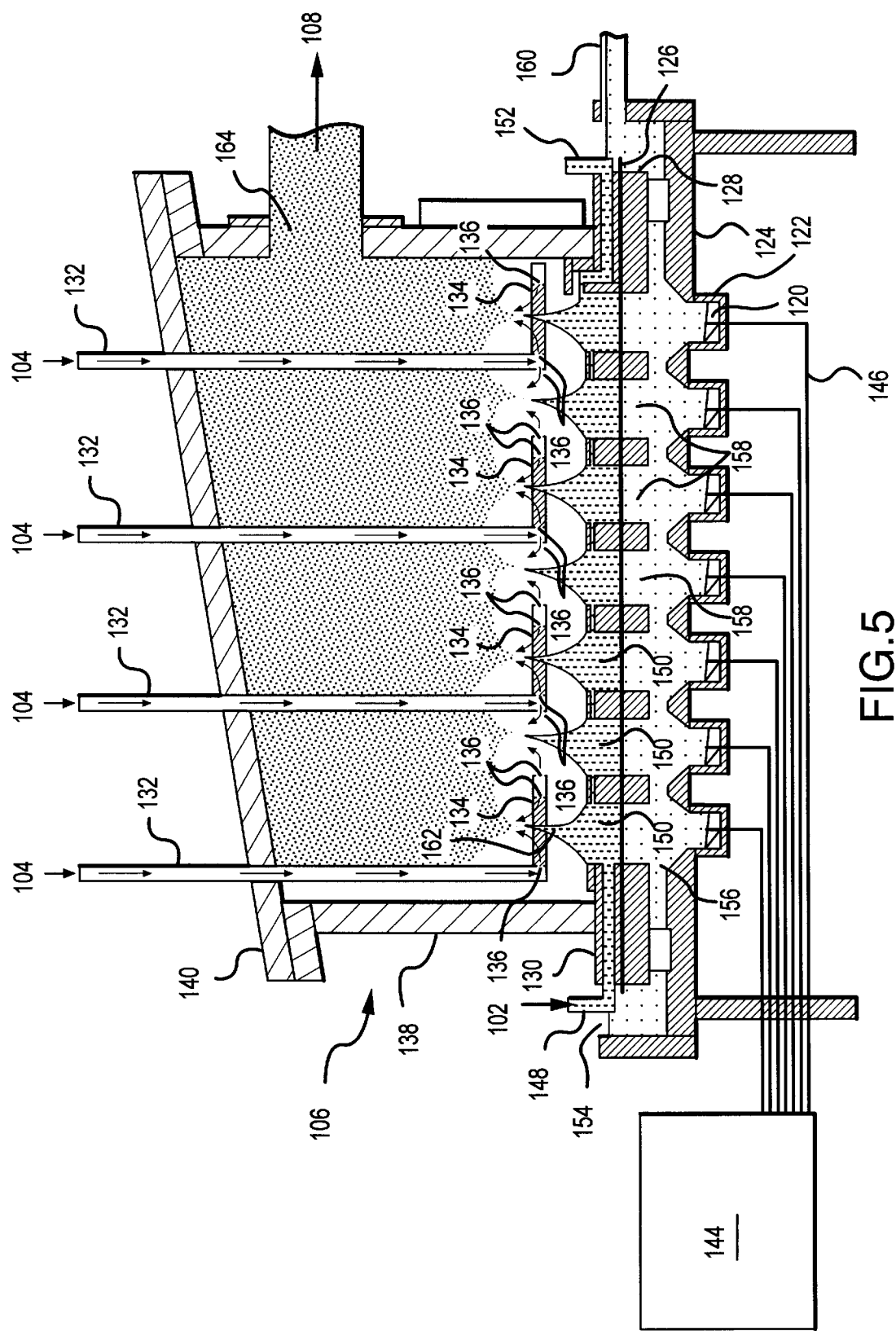
FIG. 5 is a side view in cross section of one embodiment of aerosol generator of the present invention.

The present invention is generally directed to abrasive particles and methods for making abrasive particles and slurries incorporating the abrasive particles.

In one aspect, the present invention provides a method for preparing a particulate product. A feed of liquid-containing, flowable medium, including at least one precursor for the desired particulate product, is converted to aerosol form, with droplets of the medium being dispersed in and suspended by a carrier gas. Liquid from the droplets in the aerosol is then removed to permit formation in a dispersed state of the desired particles. Typically, the feed precursor is pyrolyzed in a furnace to make the particles. In one embodiment, the particles are subjected, while still in a dispersed state, to compositional or structural modification, if desired. Compositional modification may include, for example, coating the particles. Structural modification may include, for example, crystallization, recrystallization or morphological alteration of the particles. The term powder is often used herein to refer to the particulate product of the present invention. The use of the term powder does not indicate, however, that the particulate product must be dry or in any particular environment. Although the particulate product is typically manufactured in a dry state, the particulate product may, after manufacture, be placed in a wet environment, such as in a paste or slurry.

The process of the present invention is particularly well suited for the production of particulate products of finely divided particles having a small weight average size. In addition to making particles within a desired range of weight average particle size, with the present invention the particles may be produced with a desirably narrow size distribution, thereby providing size uniformity that is desired for many applications.

In addition to control over particle size and size distribution, the method of the present invention provides significant flexibility for producing particles of varying composition, crystallinity and morphology. For example, the present invention may be used to produce homogeneous particles involving only a single phase or multi-phase particles including multiple phases. In the case of multi-phase particles, the phases may be present in a variety of morphologies. For example, one phase may be uniformly dispersed throughout a matrix of another phase. Alternatively, one phase may form an interior core while another phase forms a coating that surrounds the core. Other morphologies are also possible, as discussed more fully below.

Referring now to FIG. 1, one embodiment of the process of the present invention is described. A liquid feed 102, including at least one precursor for the desired particles, and a carrier gas 104 are fed to an aerosol generator 106 where an aerosol 108 is produced. The aerosol 108 is then fed to a furnace 110 where liquid in the aerosol 108 is removed to produce particles 112 that are dispersed in and suspended by gas exiting the furnace 110. The particles 112 are then collected in a particle collector 114 to produce a particulate product 116.

As used herein, the liquid feed 102 is a feed that includes one or more flowable liquids as the major constituent(s), such that the feed is a flowable medium. The liquid feed 102 need not comprise only liquid constituents. The liquid feed 102 may comprise only constituents in one or more liquid phase, or it may also include particulate material suspended in a liquid phase. The liquid feed 102 must, however, be capable of being atomized to form droplets of sufficiently small size for preparation of the aerosol 108. Therefore, if the liquid feed 102 includes suspended particles, those particles should be relatively small in relation to the size of droplets in the aerosol 108. Such suspended particles should typically be smaller than about 1 μm in size, preferably smaller than about 0.5 μm in size, and more preferably smaller than about 0.3 μm in size and most preferably smaller than about 0.1 μm in size. Most preferably, the suspended particles should be able to form a colloid. The suspended particles could be finely divided particles, or could be agglomerate masses comprised of agglomerated smaller primary particles. For example, 0.5 μm particles could be agglomerates of nanometer-sized primary particles. When the liquid feed 102 includes suspended particles, the particles typically comprise no greater than about 25 to 50 weight percent of the liquid feed.

As noted, the liquid feed 102 includes at least one precursor for preparation of the particles 112. The precursor may be a substance in either a liquid or solid phase of the liquid feed 102. Frequently, the precursor will be a material, such as a salt, dissolved in a liquid solvent of the liquid feed 102. The precursor may undergo one or more chemical reactions in the furnace 110 to assist in production of the particles 112. Alternatively, the precursor material may contribute to formation of the particles 112 without undergoing chemical reaction. This could be the case, for example, when the liquid feed 102 includes, as a precursor material, suspended particles that are not chemically modified in the furnace 110. In any event, the particles 112 comprise at least one component originally contributed by the precursor.

The liquid feed 102 may include multiple precursor materials, which may be present together in a single phase or separately in multiple phases. For example, the liquid feed 102 may include multiple precursors in solution in a single liquid vehicle Alternatively, one precursor material could be in a solid particulate phase and a second precursor material could be in a liquid phase. Also, one precursor material could be in one liquid phase and a second precursor material could be in a second liquid phase, such as could be the case when the liquid feed 102 comprises an emulsion. Different components contributed by different precursors may be present in the particles together in a single material phase, or the different components may be present in different material phases when the particles 112 are composites of multiple phases. Specific examples of preferred precursor materials are discussed more fully below.

The carrier gas 104 may comprise any gaseous medium in which droplets produced from the liquid feed 102 may be dispersed in aerosol form. Also, the carrier gas 104 may be inert, in that the carrier gas 104 does not participate in formation of the particles 112. Alternatively, the carrier gas may have one or more active component(s) that contribute to formation of the particles 112. In that regard, the carrier gas may include one or more reactive components that react in the furnace 110 to contribute to formation of the particles 112. Preferred carrier gas compositions are discussed more fully below.

The aerosol generator 106 atomizes the liquid feed 102 to form droplets in a manner to permit the carrier gas 104 to sweep the droplets away to form the aerosol 108. The droplets comprise liquid from the liquid feed 102. The droplets may, however, also include nonliquid material, such as one or more small particles held in the droplet by the liquid. For example, when the particles 112 are composite, or multi-phase, particles, one phase of the composite may be provided in the liquid feed 102 in the form of suspended precursor particles and a second phase of the composite may be produced in the furnace 110 from one or more precursors in the liquid phase of the liquid feed 102. Furthermore the precursor particles could be included in the liquid feed 102, and therefore also in droplets of the aerosol 108, for the purpose only of dispersing the particles for subsequent compositional or structural modification during or after processing in the furnace 110.

An important aspect of the present invention is generation of the aerosol 108 with droplets of a small average size, narrow size distribution. In this manner, the particles 112 may be produced at a desired small size with a narrow size distribution, which are advantageous for many applications.

The aerosol generator 106 is capable of producing the aerosol 108 such that it includes droplets having a weight average size in a range having a lower limit of about 1 μm and preferably about 2 μm; and an upper limit of about 10 μm; preferably about 7 μm, more preferably about 5 μm and most preferably about 4 μm. A weight average droplet size in a range of from about 2 μm to about 4 μm is more preferred for most applications, with a weight average droplet size of about 3 μm being particularly preferred for some applications. The aerosol generator is also capable of producing the aerosol 108 such that it includes droplets in a narrow size distribution. Preferably, the droplets in the aerosol are such that at least about 70 percent (more preferably at least about 80 weight percent and most preferably at least about 85 weight percent) of the droplets are smaller than about 10 μm and more preferably at least about 70 weight percent (more preferably at least about 80 weight percent and most preferably at least about 85 weight percent) are smaller than about 5 μm. Furthermore, preferably no greater than about 30 weight percent, more preferably no greater than about 25 weight percent and most preferably no greater than about 20 weight percent, of the droplets in the aerosol 108 are larger than about twice the weight average droplet size.

Another important aspect of the present invention is that the aerosol 108 may be generated without consuming excessive amounts of the carrier gas 104. The aerosol generator 106 is capable of producing the aerosol 108 such that it has a high loading, or high concentration, of the liquid feed 102 in droplet form. In that regard, the aerosol 108 preferably includes greater than about $1 \times 10^6$ droplets per cubic centimeter of the aerosol 108, more preferably greater than about $5 \times 10^6$ droplets per cubic centimeter, still more preferably greater than about $1 \times 10^7$ droplets per cubic centimeter, and most preferably greater than about $5 \times 10^7$ droplets per cubic centimeter. That the aerosol generator 106 can produce such a heavily loaded aerosol 108 is particularly surprising considering the high quality of the aerosol 108 with respect to small average droplet size and narrow droplet size distribution. Typically, droplet loading in the aerosol is such that the volumetric ratio of liquid feed 102 to carrier gas 104 in the aerosol 108 is larger than about 0.04 milliliters of liquid feed 102 per liter of carrier gas 104 in the aerosol 108, preferably larger than about 0.083 milliliters of liquid feed 102 per liter of carrier gas 104 in the aerosol 108, more preferably larger than about 0.167 milliliters of liquid feed 102 per liter of carrier gas 104, still more preferably larger than about 0.25 milliliters of liquid feed 102 per liter of carrier gas 104, and most preferably larger than about 0.333 milliliters of liquid feed 102 per liter of carrier gas 104.

This capability of the aerosol generator 106 to produce a heavily loaded aerosol 108 is even more surprising given the high droplet output rate of which the aerosol generator 106 is capable, as discussed more fully below. It will be appreciated that the concentration of liquid feed 102 in the aerosol 108 will depend upon the specific components and attributes of the liquid feed 102 and, particularly, the size of the droplets in the aerosol 108. For example, when the average droplet size is from about 2 $\mu$m to about 4 $\mu$m, the droplet loading is preferably larger than about 0.15 milliliters of aerosol feed 102 per liter of carrier gas 104, more preferably larger than about 0.2 milliliters of liquid feed 102 per liter of carrier gas 104, even more preferably larger than about 0.2 milliliters of liquid feed 102 per liter of carrier gas 104, and most preferably larger than about 0.3 milliliters of liquid feed 102 per liter of carrier gas 104. When reference is made herein to liters of carrier gas 104, it refers to the volume that the carrier gas 104 would occupy under conditions of standard temperature and pressure.

The furnace 110 may be any suitable device for heating the aerosol 108 to evaporate liquid from the droplets of the aerosol 108 and thereby permit formation of the particles 112. The maximum average stream temperature, or reaction temperature, refers to the maximum average temperature that an aerosol stream attains while flowing through the furnace. This is typically determined by a temperature probe inserted into the furnace. Preferred reaction temperatures according to the present invention are discussed more fully below.

Although longer residence times are possible, for many applications, residence time in the heating zone of the furnace 110 of shorter than about 4 seconds is typical, with shorter than about 2 seconds being preferred, shorter than about 1 second being more preferred, shorter than about 0.5 second being even more preferred, and shorter than about 0.2 second being most preferred. The residence time should be long enough, however, to assure that the particles 112 attain the desired maximum stream temperature for a given heat transfer rate. In that regard, with extremely short residence times, higher furnace temperatures could be used to increase the rate of heat transfer so long as the particles 112 attain a maximum temperature within the desired stream temperature range. That mode of operation, however, is not preferred. Also, it is preferred that, in most cases, the maximum stream temperature not be attained in the furnace 110 until substantially at the end of the heating zone in the furnace 110. For example, the heating zone will often include a plurality of heating sections that are each independently controllable. The maximum stream temperature should typically not be attained until the final heating section, and more preferably until substantially at the end of the last heating section. This is important to reduce the potential for thermophoretic losses of material. Also, it is noted that as used herein, residence time refers to the actual time for a material to pass through the relevant process equipment. In the case of the furnace, this includes the effect of increasing velocity with gas expansion due to heating.

Typically, the furnace 110 will be a tube-shaped furnace, so that the aerosol 108 moving into and through the furnace does not encounter sharp edges on which droplets could collect. Loss of droplets to collection at sharp surfaces results in a lower yield of particles 112. More important, however, the accumulation of liquid at sharp edges can result in re-release of undesirably large droplets back into the aerosol 108, which can cause contamination of the particulate product 116 with undesirably large particles. Also, over time, such liquid collection at sharp surfaces can cause fouling of process equipment, impairing process performance.

The furnace 110 may include a heating tube made of any suitable material. The tube material may be a ceramic material, for example, mullite, silica or alumina. Alternatively, the tube may be metallic. Advantages of using a metallic tube are low cost, ability to withstand steep temperature gradients and large thermal shocks, machinability and weldability, and ease of providing a seal between the tube and other process equipment. Disadvantages of using a metallic tube include limited operating temperature and increased reactivity in some reaction systems.

When a metallic tube is used in the furnace 110, it is preferably a high nickel content stainless steel alloy, such as a 330 stainless steel, or a nickel-based super alloy. As noted, one of the major advantages of using a metallic tube is that the tube is relatively easy to seal with other process equipment. In that regard, flange fittings may be welded directly to the tube for connecting with other process equipment. Metallic tubes are generally preferred for making particles that do not require a maximum tube wall temperature of higher than about 1100° C. during particle manufacture.

When higher temperatures are required, ceramic tubes are typically used. One major problem with ceramic tubes, however, is that the tubes can be difficult to seal with other process equipment, especially when the ends of the tubes are maintained at relatively high temperatures, as is often the case with the present invention.

One configuration for sealing a ceramic tube is shown in FIGS. 2, 3 and 4. The furnace 110 includes a ceramic tube 374 having an end cap 376 fitted to each end of the tube 374, with a gasket 378 disposed between corresponding ends of the ceramic tube 374 and the end caps 376. The gasket may be of any suitable material for sealing at the temperature encountered at the ends of the tubes 374. Examples of gasket materials for sealing at temperatures below about 250° C. include silicone, TEFLON™ and VITON™. Examples of gasket materials for higher temperatures include graphite, ceramic paper, thin sheet metal, and combinations thereof.

Tension rods 380 extend over the length of the furnace 110 and through rod holes 382 through the end caps 376. The tension rods 380 are held in tension by the force of springs 384 bearing against bearing plates 386 and the end caps 376. The tube 374 is, therefore, in compression due to the force of the springs 384. The springs 384 may be compressed any desired amount to form a seal between the end caps 376 and the ceramic tube 374 through the gasket 378. As will be appreciated, by using the springs 384, the tube 374 is free to move to some degree as it expands upon heating and contracts upon cooling. To form the seal between the end caps 376 and the ceramic tube 374, one of the gaskets 378 is seated in a gasket seat 388 on the side of each end cap 376 facing the tube 374. A mating face 390 on the side of each of the end caps 376 faces away from the tube 374, for mating with a flange surface for connection with an adjacent piece of equipment.

Also, although the present invention is described with primary reference to a furnace reactor, which is preferred, it should be recognized that, except as noted, any other thermal reactor, including a flame reactor or a plasma reactor, could be used instead. A furnace reactor is, however, preferred, because of the generally even heating characteristic of a furnace for attaining a uniform stream temperature.

The particle collector 114, may be any suitable apparatus for collecting particles 112 to produce the particulate product 116. One preferred embodiment of the particle collector 114 uses one or more filter to separate the particles 112 from gas. Such a filter may be of any type, including a bag filter. Another preferred embodiment of the particle collector uses one or more cyclone to separate the particles 112. Other apparatus that may be used in the particle collector 114 includes an electrostatic precipitator. Also, collection should normally occur at a temperature above the condensation temperature of the gas stream in which the particles 112 are suspended. Also, collection should normally be at a temperature that is low enough to prevent significant agglomeration of the particles 112.

Figure 6:
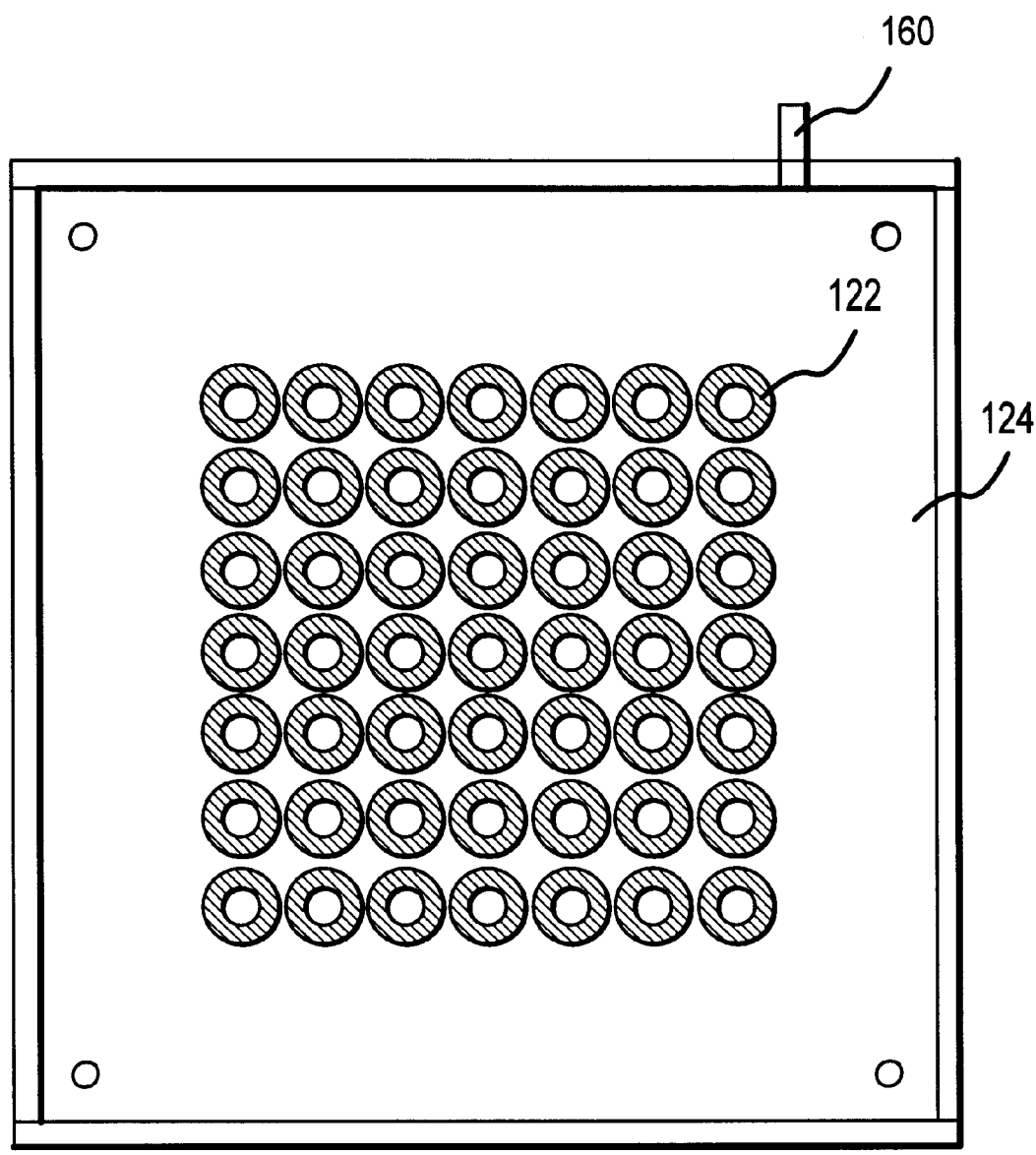
FIG. 6 is a top view of a transducer mounting plate showing a 49 transducer array for use in an aerosol generator of the present invention.

Of significant importance to the operation of the process of the present invention is the aerosol generator 106, which must be capable of producing a high quality aerosol with high droplet loading, as previously noted. With reference to FIG. 5, one embodiment of an aerosol generator 106 of the present invention is described. The aerosol generator 106 includes a plurality of ultrasonic transducer discs 120 that are each mounted in a transducer housing 122. The transducer housings 122 are mounted to a transducer mounting plate 124, creating an array of the ultrasonic transducer discs 120. Any convenient spacing may be used for the ultrasonic transducer discs 120. Center-to-center spacing of the ultrasonic transducer discs 120 of about 4 centimeters is often adequate. The aerosol generator 106, as shown in FIG. 5, includes forty-nine transducers in a 7×7 array. The array configuration is as shown in FIG. 6, which depicts the locations of the transducer housings 122 mounted to the transducer mounting plate 124.

With continued reference to FIG. 5, a separator 126, in spaced relation to the transducer discs 120, is retained between a bottom retaining plate 128 and a top retaining plate 130. Gas delivery tubes 132 are connected to gas distribution manifolds 134, which have gas delivery ports 136. The gas distribution manifolds 134 are housed within a generator body 138 that is covered by generator lid 140. A transducer driver 144, having circuitry for driving the transducer discs 120, is electronically connected with the transducer discs 120 via electrical cables 146.

During operation of the aerosol generator 106, as shown in FIG. 5, the transducer discs 120 are activated by the transducer driver 144 via the electrical cables 146. The transducers preferably vibrate at a frequency of from about 1 MHz to about 5 MHz, more preferably from about 1.5 MHz to about 3 MHz, and even more preferably at a frequency greater than about 1.7 MHz. A particularly preferred frequency is about 2.4 MHz. Furthermore, all of the transducer discs 110 should be operating at substantially the same frequency when an aerosol with a narrow droplet size distribution is desired. This is important because commercially available transducers can vary significantly in thickness, sometimes by as much as 10%. It is preferred, however, that the transducer discs 120 operate at frequencies within a range of 5% above and below the median transducer frequency, more preferably within a range of 2.5%, and most preferably within a range of 10%. This can be accomplished by careful selection of the transducer discs 120 so that they all preferably have thicknesses within 5% of the median transducer thickness, more preferably within 2.5%, and most preferably within 1%.

Liquid feed 102 enters through a feed inlet 148 and flows through flow channels 150 to exit through feed outlet 152. An ultrasonically transmissive fluid, typically water, enters through a water inlet 154 to fill a water bath volume 156 and flow through flow channels 158 to exit through a water outlet 160. A proper flow rate of the ultrasonically transmissive fluid is necessary to cool the transducer discs 120 and to prevent overheating of the ultrasonically transmissive fluid. Ultrasonic signals from the transducer discs 120 are transmitted, via the ultrasonically transmissive fluid, across the water bath volume 156, and ultimately across the separator 126, to the liquid feed 102 in flow channels 150.

The ultrasonic signals from the ultrasonic transducer discs 120 cause atomization cones 162 to develop in the liquid feed 102 at locations corresponding with the transducer discs 120. Carrier gas 104 is introduced into the gas delivery tubes 132 and delivered to the vicinity of the atomization cones 162 via gas delivery ports 136. Jets of carrier gas exit the gas delivery ports 136 in a direction so as to impinge on the atomization cones 162, thereby sweeping away atomized droplets of the liquid feed 102 that are being generated from the atomization cones 162 and creating the aerosol 108, which exits the aerosol generator 106 through an aerosol exit opening 164.

Efficient use of the carrier gas 104 is an important aspect of the aerosol generator 106. The embodiment of the aerosol generator 106 shown in FIG. 5 includes two gas exit ports per atomization cone 162, with the gas ports being positioned above the liquid medium 102 over troughs that develop between the atomization cones 162, such that the exiting carrier gas 104 is horizontally directed at the surface of the atomization cones 162, thereby efficiently distributing the carrier gas 104 to critical portions of the liquid feed 102 for effective and efficient sweeping away of droplets as they form about the ultrasonically energized atomization cones 162. Furthermore, it is preferred that at least a portion of the opening of each of the gas delivery ports 136, through which the carrier gas exits the gas delivery tubes, should be located below the top of the atomization cones 162 at which the carrier gas 104 is directed. This relative placement of the gas delivery ports 136 is very important to efficient use of carrier gas 104. Orientation of the gas delivery ports 136 is also important. Preferably, the gas delivery ports 136 are positioned to horizontally direct jets of the carrier gas 104 at the atomization cones 162. The aerosol generator 106 permits generation of the aerosol 108 with heavy loading with droplets of the carrier liquid 102, unlike aerosol generator designs that do not efficiently focus gas delivery to the locations of droplet formation.

Another important feature of the aerosol generator 106, as shown in FIG. 5, is the use of the separator 126, which protects the transducer discs 120 from direct contact with the liquid feed 102, which is often highly corrosive. The height of the separator 126 above the top of the transducer discs 120 should normally be kept as small as possible, and is often in the range of from about 1 centimeter to about 2 centimeters. The top of the liquid feed 102 in the flow channels above the tops of the ultrasonic transducer discs 120 is typically in a range of from about 2 centimeters to about 5 centimeters, whether or not the aerosol generator includes the separator 126, with a distance of about 3 to 4 centimeters being preferred. Although the aerosol generator 106 could be made without the separator 126, in which case the liquid feed 102 would be in direct contact with the transducer discs 120, the highly corrosive nature of the liquid feed 102 can often cause premature failure of the transducer discs 120. The use of the separator 126, in combination with use of the ultrasonically transmissive fluid in the water bath volume 156 to provide ultrasonic coupling, significantly extending the life of the ultrasonic transducers 120. One disadvantage of using the separator 126, however, is that the rate of droplet production from the atomization cones 162 is reduced, often by a factor of two or more, relative to designs in which the liquid feed 102 is in direct contact with the ultrasonic transducer discs 102. Even with the separator 126, however, the aerosol generator 106 used with the present invention is capable of producing a high quality aerosol with heavy droplet loading, as previously discussed. Suitable materials for the separator 126 include, for example, polyamides (such as Kapton™ membranes from DuPont) and other polymer materials, glass, and plexiglass. The main requirements for the separator 126 are that it be ultrasonically transmissive, corrosion resistant and impermeable.

One alternative to using the separator 126 is to bind a corrosion-resistant protective coating onto the surface of the ultrasonic transducer discs 120, thereby preventing the liquid feed 102 from contacting the surface of the ultrasonic transducer discs 120. When the ultrasonic transducer discs 120 have a protective coating, the aerosol generator 106 will typically be constructed without the water bath volume 156 and the liquid feed 102 will flow directly over the ultrasonic transducer discs 120. Examples of such protective coating materials include platinum, gold, TEFLON™, epoxies and various plastics. Such coating typically significantly extends transducer life. Also, when operating without the separator 126, the aerosol generator 106 will typically produce the aerosol 108 with a much higher droplet loading than when the separator 126 is used.

One surprising finding with operation of the aerosol generator 106 of the present invention is that the droplet loading in the aerosol may be affected by the temperature of the liquid feed 102. It has been found that when the liquid feed 102 includes an aqueous liquid at an elevated temperature, the droplet loading increases significantly. The temperature of the liquid feed 102 is preferably higher than about 30° C., more preferably higher than about 35° C. and most preferably higher than about 40° C. If the temperature becomes too high, however, it can have a detrimental effect on droplet loading in the aerosol 108. Therefore, the temperature of the liquid feed 102 from which the aerosol 108 is made should generally be lower than about 50° C., and preferably lower than about 45° C. The liquid feed 102 may be maintained at the desired temperature in any suitable fashion. For example, the portion of the aerosol generator 106 where the liquid feed 102 is converted to the aerosol 108 could be maintained at a constant elevated temperature. Alternatively, the liquid feed 102 could be delivered to the aerosol generator 106 from a constant temperature bath maintained separate from the aerosol generator 106. When the ultrasonic generator 106 includes the separator 126, the ultrasonically transmissive fluid adjacent the ultrasonic transducer disks 120 are preferably also at an elevated temperature in the ranges just discussed for the liquid feed 102.

The design for the aerosol generator 106 based on an array of ultrasonic transducers is versatile and is easily modified to accommodate different generator sizes for different specialty applications. The aerosol generator 106 may be designed to include a plurality of ultrasonic transducers in any convenient number. Even for smaller scale production, however, the aerosol generator 106 preferably has at least nine ultrasonic transducers, more preferably at least 16 ultrasonic transducers, and even more preferably at least 25 ultrasonic transducers. For larger scale production, however, the aerosol generator 106 includes at least 40 ultrasonic transducers, more preferably at least 100 ultrasonic transducers, and even more preferably at least 400 ultrasonic transducers. In some large volume applications, the aerosol generator may have at least 1000 ultrasonic transducers.

Figure 7:
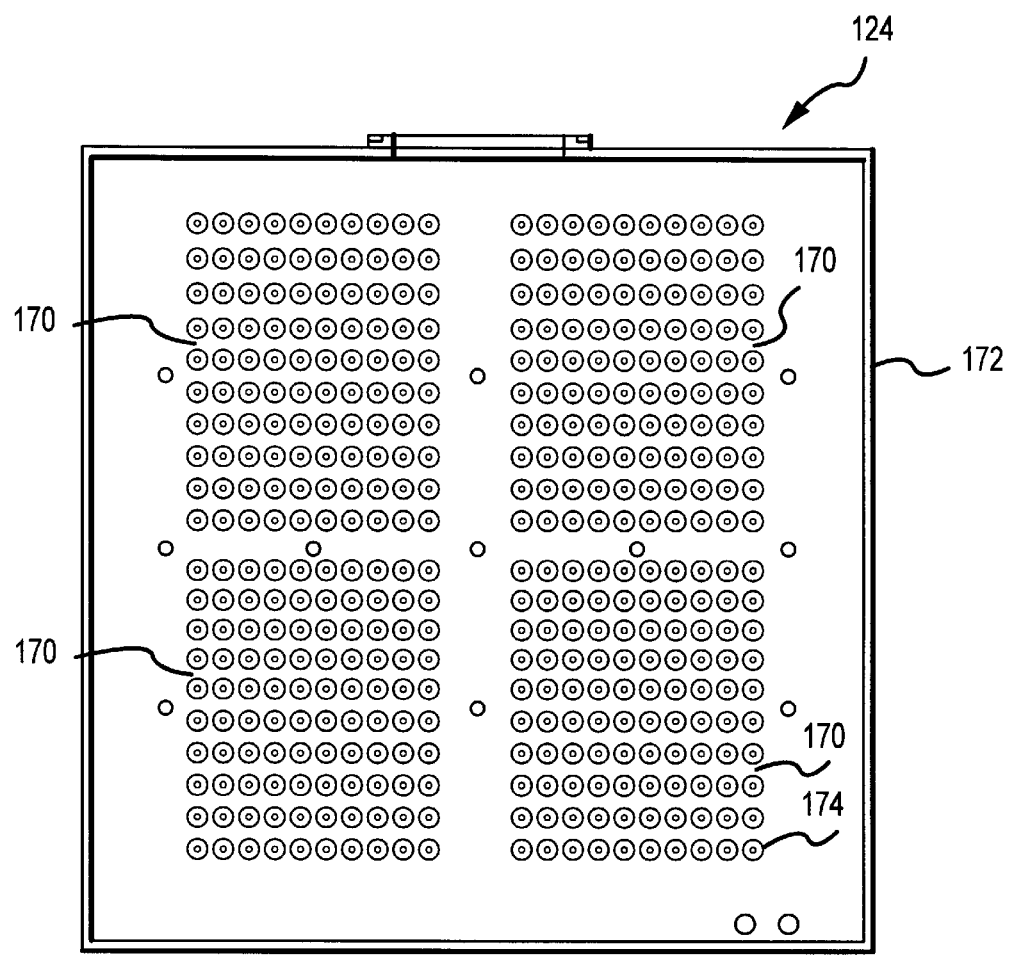
FIG. 7 is a top view of a transducer mounting plate for a 400 transducer array for use in an ultrasonic generator of the present invention.
Figure 8:
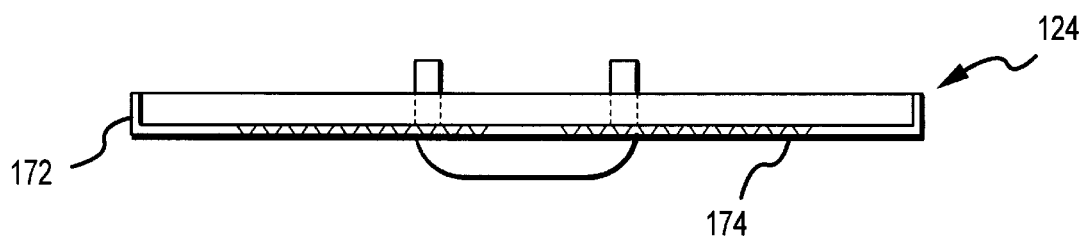
FIG. 8 is a side view of the transducer mounting plate shown in FIG. 7.

FIGS. 7–24 show component designs for an aerosol generator 106 including an array of 400 ultrasonic transducers. Referring first to FIGS. 7 and 8, the transducer mounting plate 124 is shown with a design to accommodate an array of 400 ultrasonic transducers, arranged in four subarrays of 100 ultrasonic transducers each. The transducer mounting plate 124 has integral vertical walls 172 for containing the ultrasonically transmissive fluid, typically water, in a water bath similar to the water bath volume 156 described previously with reference to FIG. 5.

Figure 9:
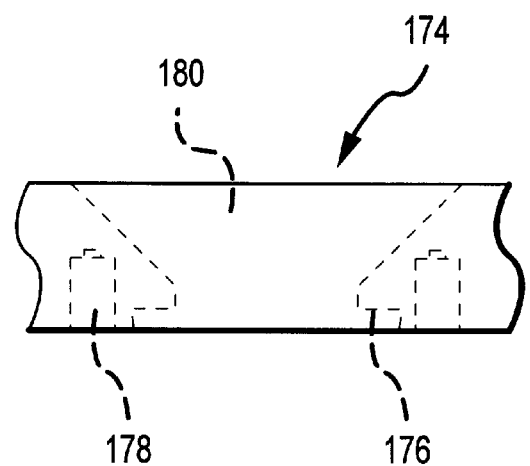
FIG. 9 is a partial side view showing the profile of a single transducer mounting receptacle of the transducer mounting plate shown in FIG. 7.

As shown in FIGS. 7 and 8, four hundred transducer mounting receptacles 174 are provided in the transducer mounting plate 124 for mounting ultrasonic transducers for the desired array. With reference to FIG. 9, the profile of an individual transducer mounting receptacle 174 is shown. A mounting seat 176 accepts an ultrasonic transducer for mounting, with a mounted ultrasonic transducer being held in place via screw holes 178. Opposite the mounting receptacle 176 is a flared opening 180 through which an ultrasonic signal may be transmitted for the purpose of generating the aerosol 108, as previously described with reference to FIG. 5.

Figure 10:
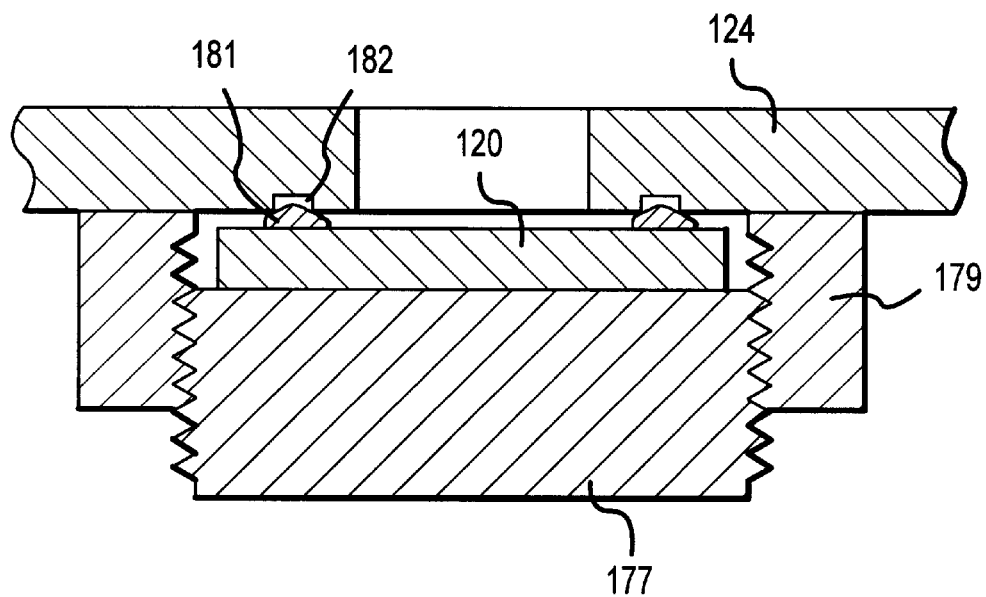
FIG. 10 is a partial side view in cross-section showing an alternative embodiment for mounting an ultrasonic transducer.

A preferred transducer mounting configuration, however, is shown in FIG. 10 for another configuration for the transducer mounting plate 124. As seen in FIG. 10, an ultrasonic transducer disc 120 is mounted to the transducer mounting plate 124 by use of a compression screw 177 threaded into a threaded receptacle 179. The compression screw 177 bears against the ultrasonic transducer disc 120, causing an o-ring 181, situated in an o-ring seat 182 on the transducer mounting plate, to be compressed to form a seal between the transducer mounting plate 124 and the ultrasonic transducer disc 120. This type of transducer mounting is particularly preferred when the ultrasonic transducer disc 120 includes a protective surface coating, as discussed previously, because the seal of the o-ring to the ultrasonic transducer disc 120 will be inside of the outer edge of the protective seal, thereby preventing liquid from penetrating under the protective surface coating from the edges of the ultrasonic transducer disc 120.

Figure 11:
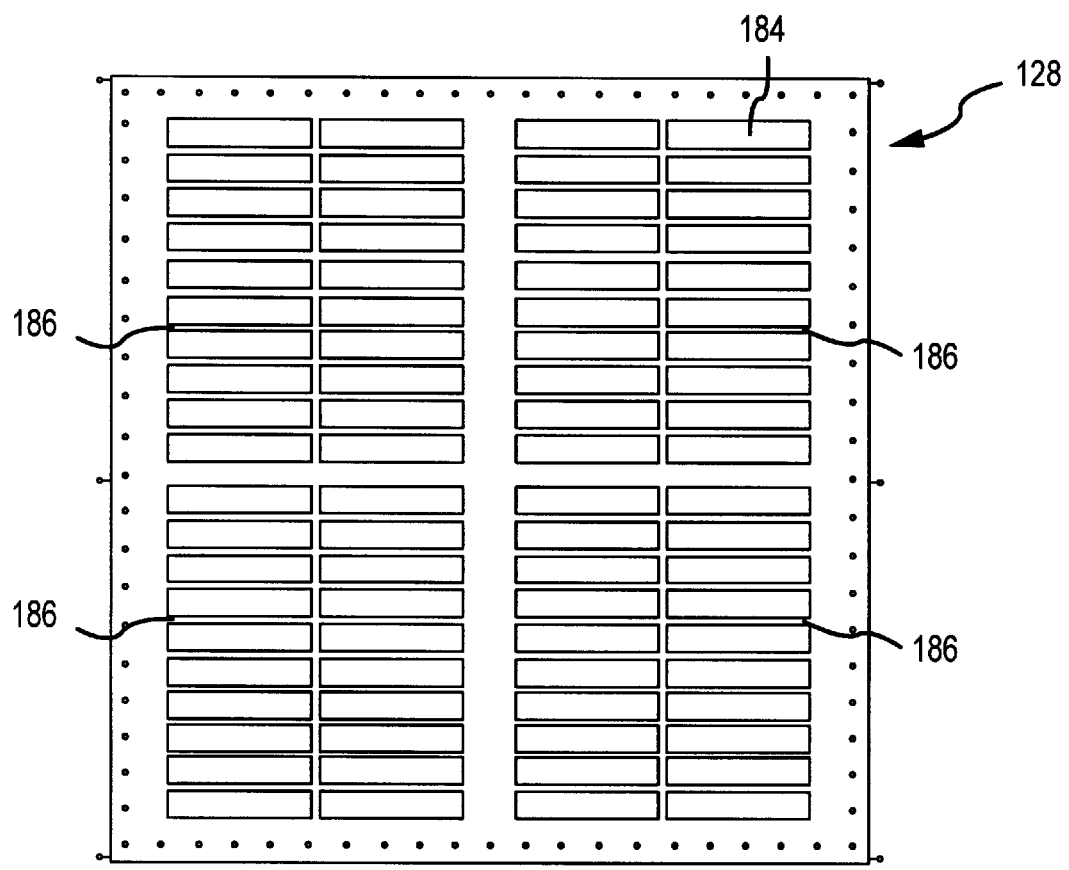
FIG. 11 is a top view of a bottom retaining plate for retaining a separator for use in an aerosol generator of the present invention.

Referring now to FIG. 11, the bottom retaining plate 128 for a 400 transducer array is shown having a design for mating with the transducer mounting plate 124 (shown in FIGS. 7–8). The bottom retaining plate 128 has eighty openings 184, arranged in four subgroups 186 of twenty openings 184 each. Each of the openings 184 corresponds with five of the transducer mounting receptacles 174 (shown in FIGS. 7 and 8) when the bottom retaining plate 128 is mated with the transducer mounting plate 124 to create a volume for a water bath between the transducer mounting plate 124 and the bottom retaining plate 128. The openings 184, therefore, provide a pathway for ultrasonic signals generated by ultrasonic transducers to be transmitted through the bottom retaining plate.

Figure 12:
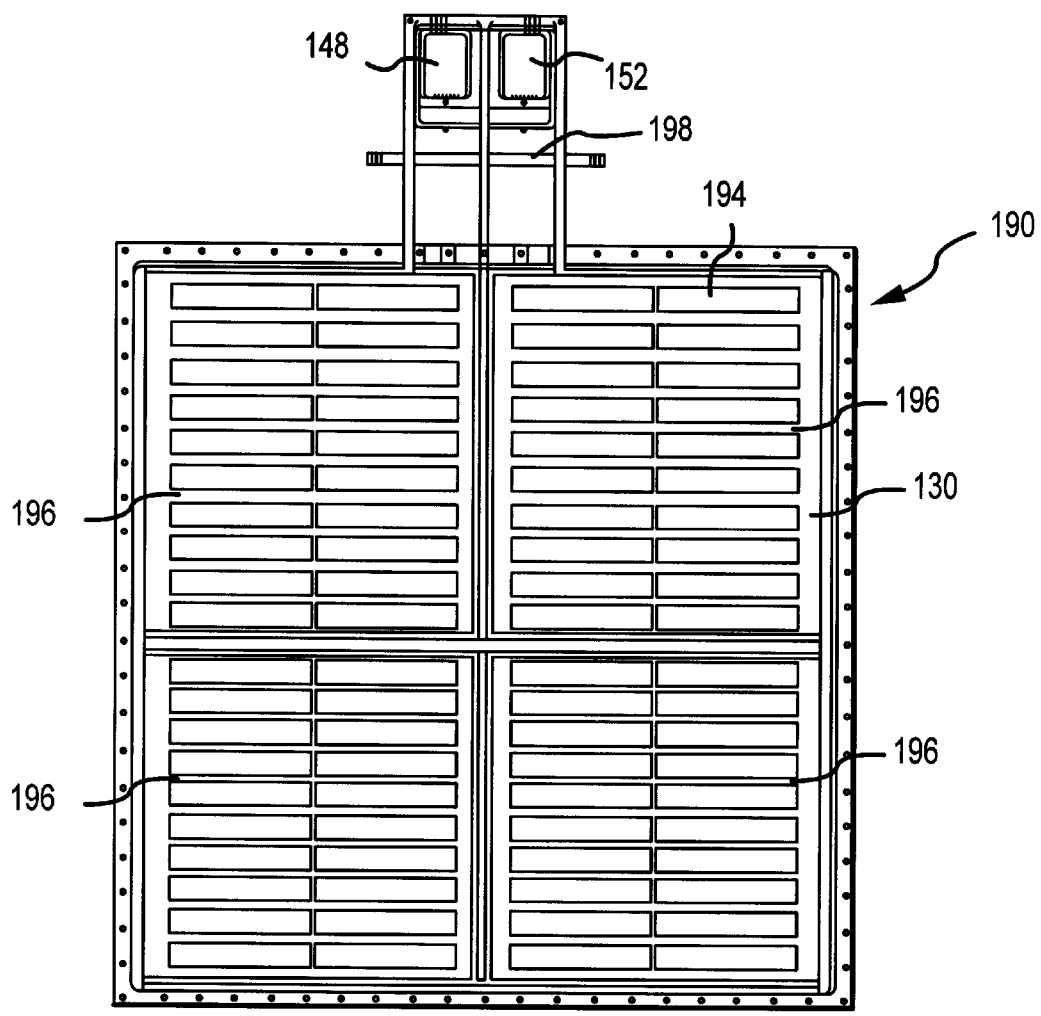
FIG. 12 is a top view of a liquid feed box having a bottom retaining plate to assist in retaining a separator for use in an aerosol generator of the present invention.
Figure 13:
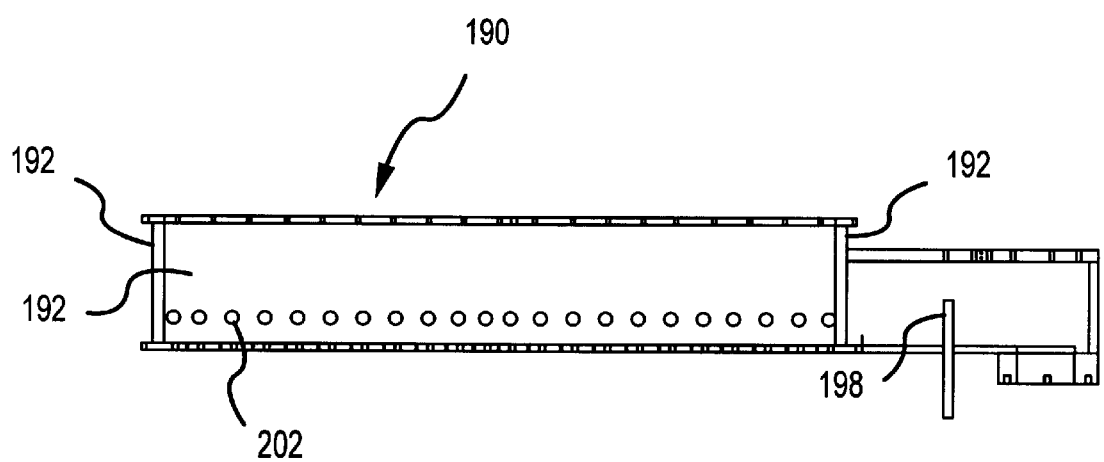
FIG. 13 is a side view of the liquid feed box shown in FIG. 8.

Referring now to FIGS. 12 and 13, a liquid feed box 190 for a 400 transducer array is shown having the top retaining plate 130 designed to fit over the bottom retaining plate 128 (shown in FIG. 11), with a separator 126 (not shown) being retained between the bottom retaining plate 128 and the top retaining plate 130 when the aerosol generator 106 is assembled. The liquid feed box 190 also includes vertically extending walls 192 for containing the liquid feed 102 when the aerosol generator is in operation. Also shown in FIGS. 12 and 13 is the feed inlet 148 and the feed outlet 152. An adjustable weir 198 determines the level of liquid feed 102 in the liquid feed box 190 during operation of the aerosol generator 106.

The top retaining plate 130 of the liquid feed box 190 has eighty openings 194 therethrough, which are arranged in four subgroups 196 of twenty openings 194 each. The openings 194 of the top retaining plate 130 correspond in size with the openings 184 of the bottom retaining plate 128 (shown in FIG. 11). When the aerosol generator 106 is assembled, the openings 194 through the top retaining plate 130 and the openings 184 through the bottom retaining plate 128 are aligned, with the separator 126 positioned therebetween, to permit transmission of ultrasonic signals when the aerosol generator 106 is in operation.

Figure 14:
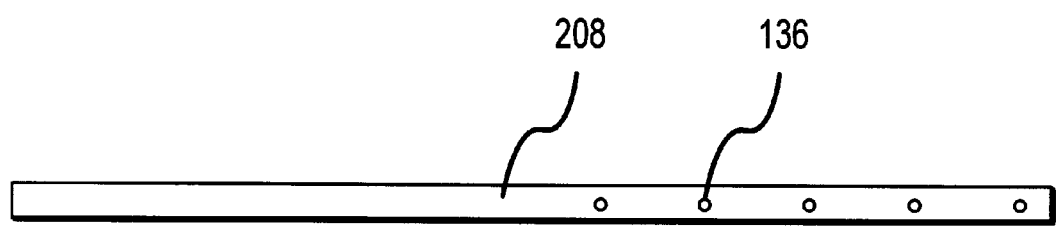
FIG. 14 is a side view of a gas tube for delivering gas within an aerosol generator of the present invention.

Referring now to FIGS. 12–14, a plurality of gas tube feed-through holes 202 extend through the vertically extending walls 192 to either side of the assembly including the feed inlet 148 and feed outlet 152 of the liquid feed box 190. The gas tube feed-through holes 202 are designed to permit insertion therethrough of gas tubes 208 of a design as shown in FIG. 14. When the aerosol generator 106 is assembled, a gas tube 208 is inserted through each of the gas tube feed-through holes 202 so that gas delivery ports 136 in the gas tube 208 will be properly positioned and aligned adjacent the openings 194 in the top retaining plate 130 for delivery of gas to atomization cones that develop in the liquid feed box 190 during operation of the aerosol generator 106. The gas delivery ports 136 are typically holes having a diameter of from about 1.5 millimeters to about 3.5 millimeters.

Figure 15:
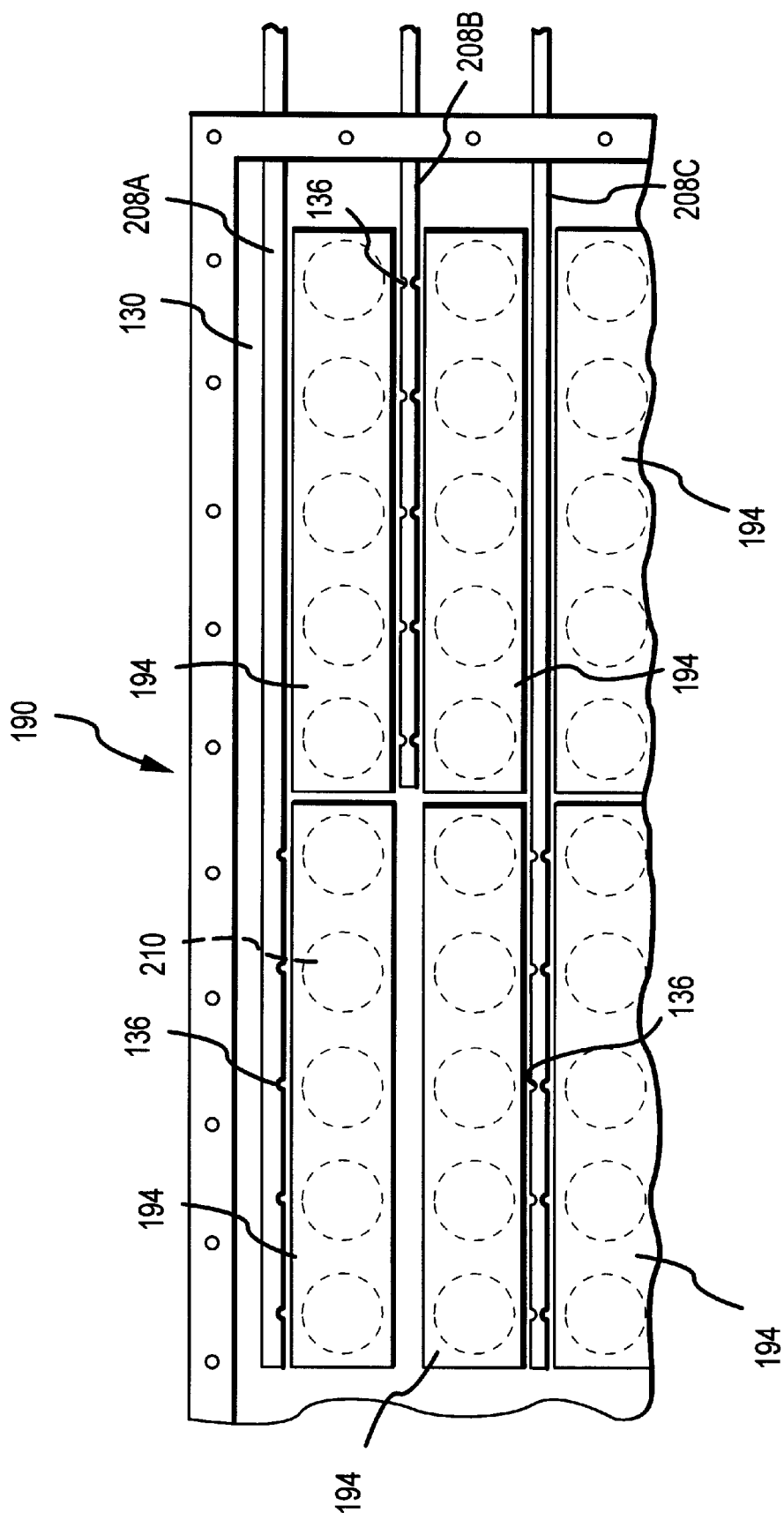
FIG. 15 shows a partial top view of gas tubes positioned in a liquid feed box for distributing gas relative to ultrasonic transducer positions for use in an aerosol generator of the present invention.

Referring now to FIG. 15, a partial view of the liquid feed box 190 is shown with gas tubes 208A, 208B and 208C positioned adjacent to the openings 194 through the top retaining plate 130. Also shown in FIG. 15 are the relative locations that ultrasonic transducer discs 120 would occupy when the aerosol generator 106 is assembled. As seen in FIG. 15, the gas tube 208A, which is at the edge of the array, has five gas delivery ports 136. Each of the gas delivery ports 136 is positioned to divert carrier gas 104 to a different one of atomization cones that develop over the array of ultrasonic transducer discs 120 when the aerosol generator 106 is operating. The gas tube 208B, which is one row in from the edge of the array, is a shorter tube that has ten gas delivery ports 136, five each on opposing sides of the gas tube 208B. The gas tube 208B, therefore, has gas delivery ports 136 for delivering gas to atomization cones corresponding with each of ten ultrasonic transducer discs 120. The third gas tube, 208C, is a longer tube that also has ten gas delivery ports 136 for delivering gas to atomization cones corresponding with ten ultrasonic transducer discs 120. The design shown in FIG. 15, therefore, includes one gas delivery port per ultrasonic transducer disc 120. Although this is a lower density of gas delivery ports 136 than for the embodiment of the aerosol generator 106 shown in FIG. 5, which includes two gas delivery ports per ultrasonic transducer disc 120, the design shown in FIG. 15 is, nevertheless, capable of producing a dense, high-quality aerosol without unnecessary waste of gas.

Figure 16:
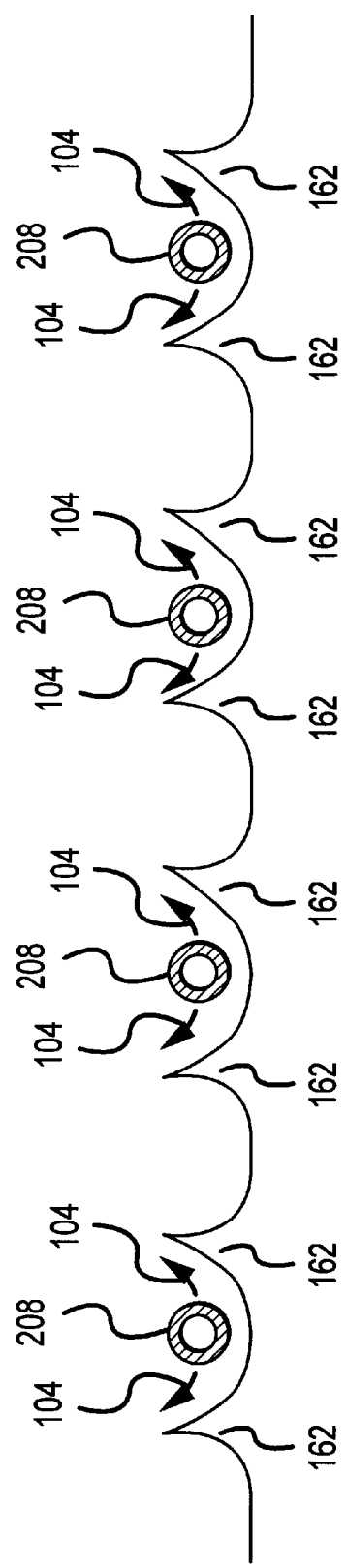
FIG. 16 shows one embodiment for a gas distribution configuration for the aerosol generator of the present invention.

Referring now to FIG. 16, the flow of carrier gas 104 relative to atomization cones 162 during operation of the aerosol generator 106 having a gas distribution configuration to deliver carrier gas 104 from gas delivery ports on both sides of the gas tubes 208, as was shown for the gas tubes 208A, 208B and 208C in the gas distribution configuration shown in FIG. 14. The carrier gas 104 sweeps both directions from each of the gas tubes 208.

Figure 17:
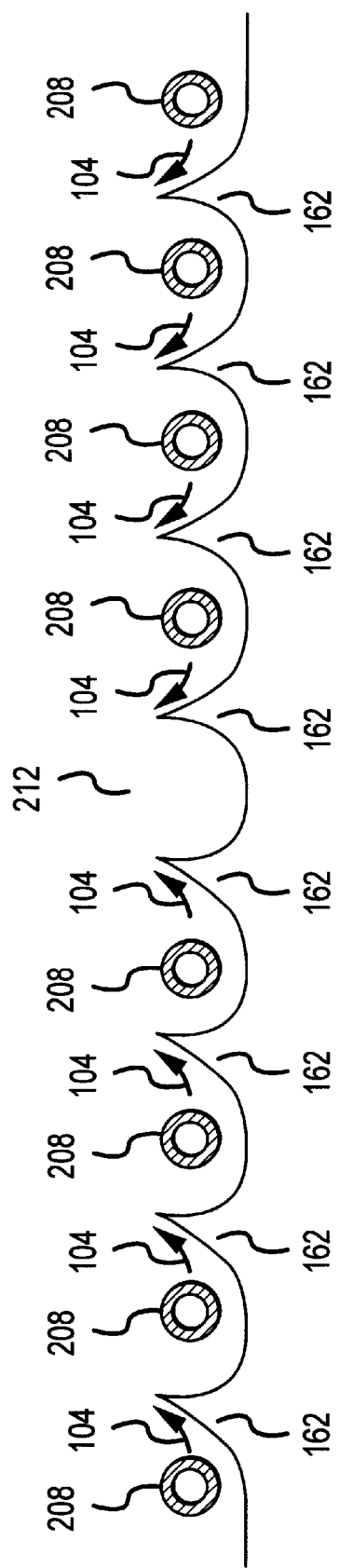
FIG. 17 shows another embodiment for a gas distribution configuration for the aerosol generator of the present invention.

An alternative, and preferred, flow for carrier gas 104 is shown in FIG. 17. As shown in FIG. 17, carrier gas 104 is delivered from only one side of each of the gas tubes 208. This results in a sweep of carrier gas from all of the gas tubes 208 toward a central area 212. This results in a more uniform flow pattern for aerosol generation that may significantly enhance the efficiency with which the carrier gas 104 is used to produce an aerosol. The aerosol that is generated, therefore, tends to be more heavily loaded with liquid droplets.

Figure 18:
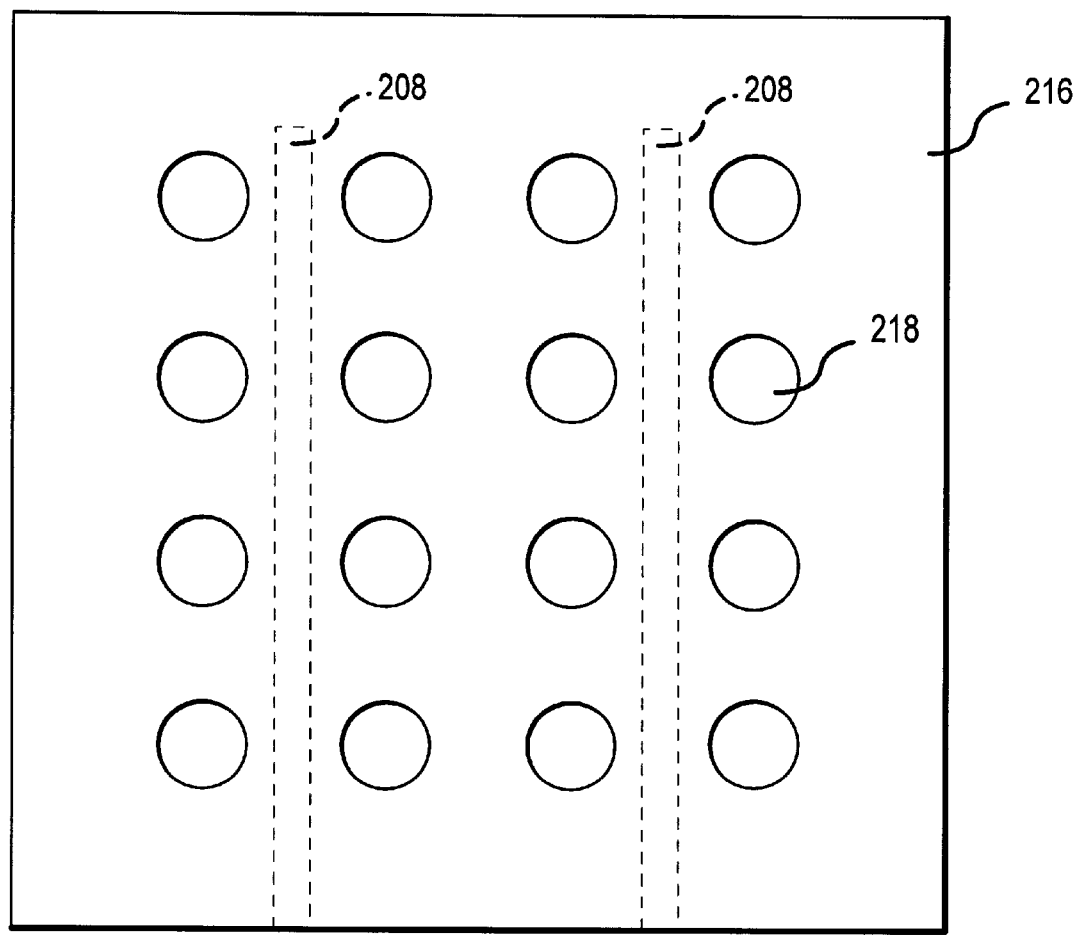
FIG. 18 is a top view of one embodiment of a gas distribution plate/gas tube assembly of the aerosol generator of the present invention.
Figure 19:
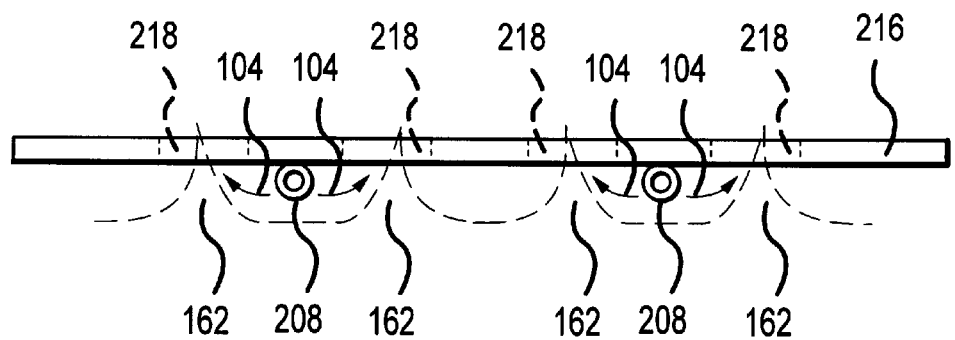
FIG. 19 is a side view of one embodiment of the gas distribution plate/gas tube assembly shown in FIG. 18.

Another configuration for distributing carrier gas in the aerosol generator 106 is shown in FIGS. 18 and 19. In this configuration, the gas tubes 208 are hung from a gas distribution plate 216 adjacent gas flow holes 218 through the gas distribution plate 216. In the aerosol generator 106, the gas distribution plate 216 would be mounted above the liquid feed, with the gas flow holes positioned to each correspond with an underlying ultrasonic transducer. Referring specifically to FIG. 19, when the ultrasonic generator 106 is in operation, atomization cones 162 develop through the gas flow holes 218, and the gas tubes 208 are located such that carrier gas 104 exiting from ports in the gas tubes 208 impinge on the atomization cones and flow upward through the gas flow holes. The gas flow holes 218, therefore, act to assist in efficiently distributing the carrier gas 104 about the atomization cones 162 for aerosol formation. It should be appreciated that the gas distribution plates 218 can be made to accommodate any number of the gas tubes 208 and gas flow holes 218. For convenience of illustration, the embodiment shown in FIGS. 18 and 19 shows a design having only two of the gas tubes 208 and only 16 of the gas flow holes 218. Also, it should be appreciated that the gas distribution plate 216 could be used alone, without the gas tubes 208. In that case, a slight positive pressure of carrier gas 104 would be maintained under the gas distribution plate 216 and the gas flow holes 218 would be sized to maintain the proper velocity of carrier gas 104 through the gas flow holes 218 for efficient aerosol generation. Because of the relative complexity of operating in that mode, however, it is not preferred.

Figure 20:
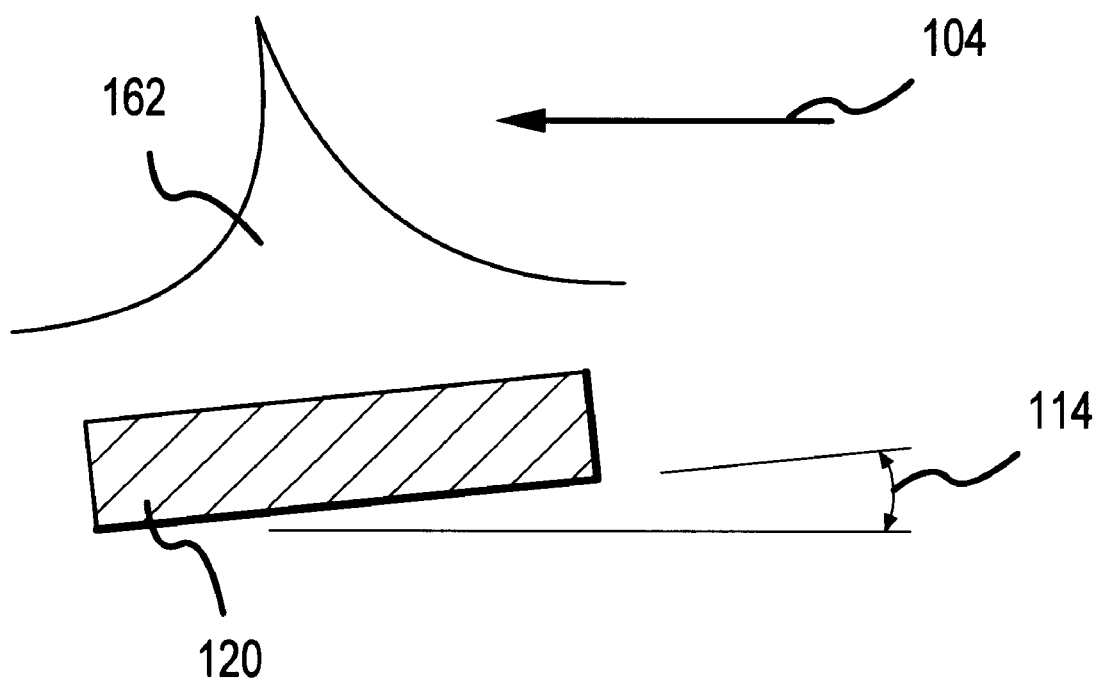
FIG. 20 shows one embodiment for orienting a transducer in the aerosol generator of the present invention.

Aerosol generation may also be enhanced through mounting of ultrasonic transducers at a slight angle and directing the carrier gas at resulting atomization cones such that the atomization cones are tilting in the same direction as the direction of flow of carrier gas. Referring to FIG. 20, an ultrasonic transducer disc 120 is shown. The ultrasonic transducer disc 120 is tilted at a tilt angle 114 (typically less than 10 degrees), so that the atomization cone 162 will also have a tilt. It is preferred that the direction of flow of the carrier gas 104 directed at the atomization cone 162 is in the same direction as the tilt of the atomization cone 162.

Figure 21:
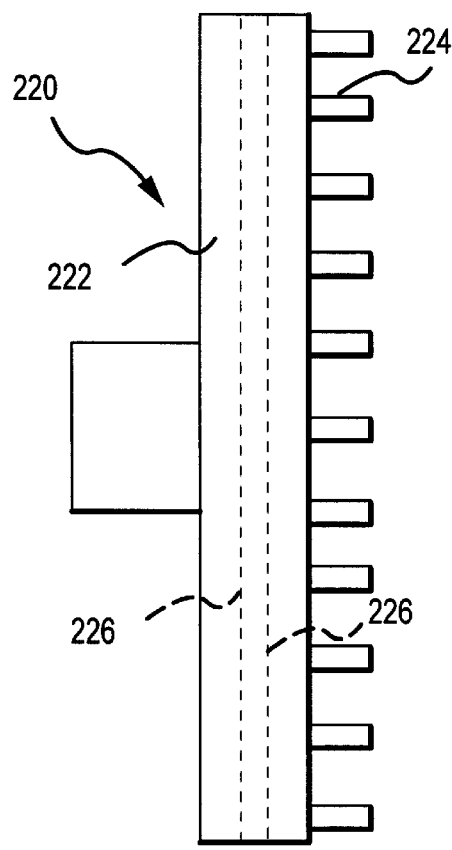
FIG. 21 is a top view of a gas manifold for distributing gas within an aerosol generator of the present invention.
Figure 22:
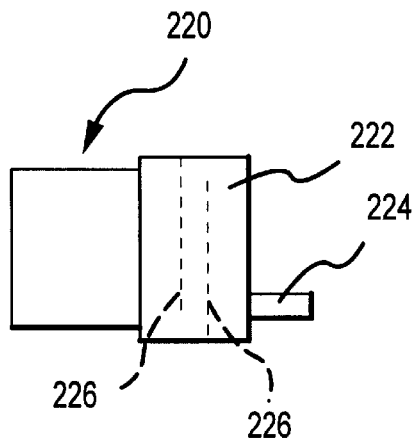
FIG. 22 is a side view of the gas manifold shown in FIG. 21.

Referring now to FIGS. 21 and 22, a gas manifold 220 is shown for distributing gas to the gas tubes 208 in a 400 transducer array design. The gas manifold 220 includes a gas distribution box 222 and piping stubs 224 for connection with gas tubes 208 (shown in FIG. 14). Inside the gas distribution box 222 are two gas distribution plates 226 that form a flow path to assist in distributing the gas equally throughout the gas distribution box 222, to promote substantially equal delivery of gas through the piping stubs 224. The gas manifold 220, as shown in FIGS. 21 and 22, is designed to feed eleven gas tubes 208. For the 400 transducer design, a total of four gas manifolds 220 are required.

Figure 23:
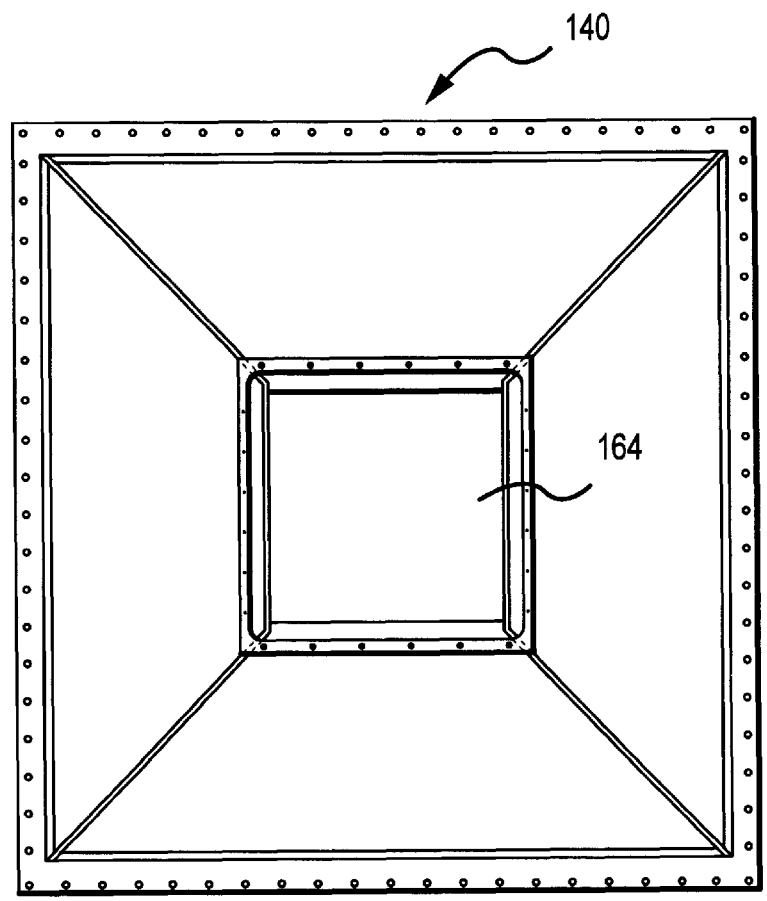
FIG. 23 is a top view of a generator lid of a hood design for use in an aerosol generator of the present invention.
Figure 24:
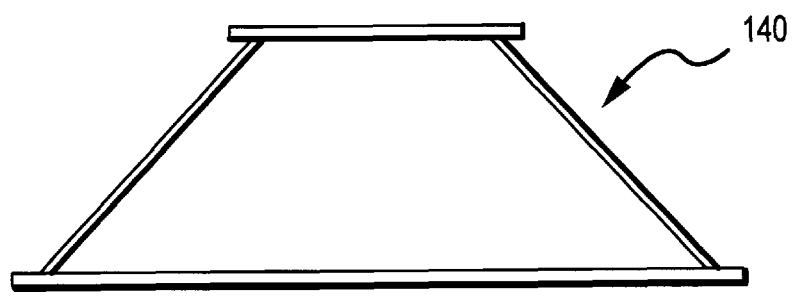
FIG. 24 is a side view of the generator lid shown in FIG. 23.
Figure 26:
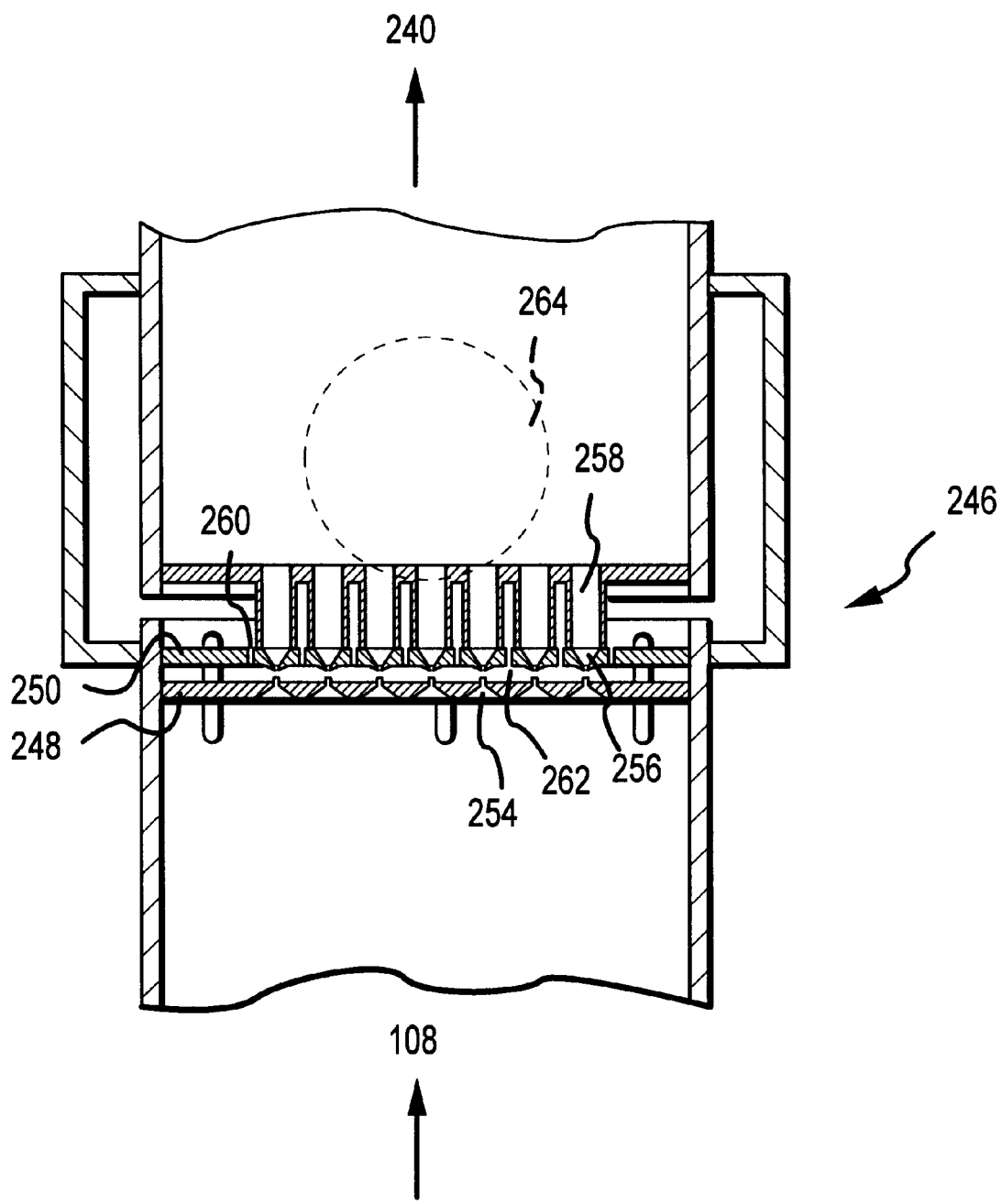
FIG. 26 is a top view in cross section of a virtual impactor that may be used for concentrating an aerosol according to the present invention.
Figure 27:
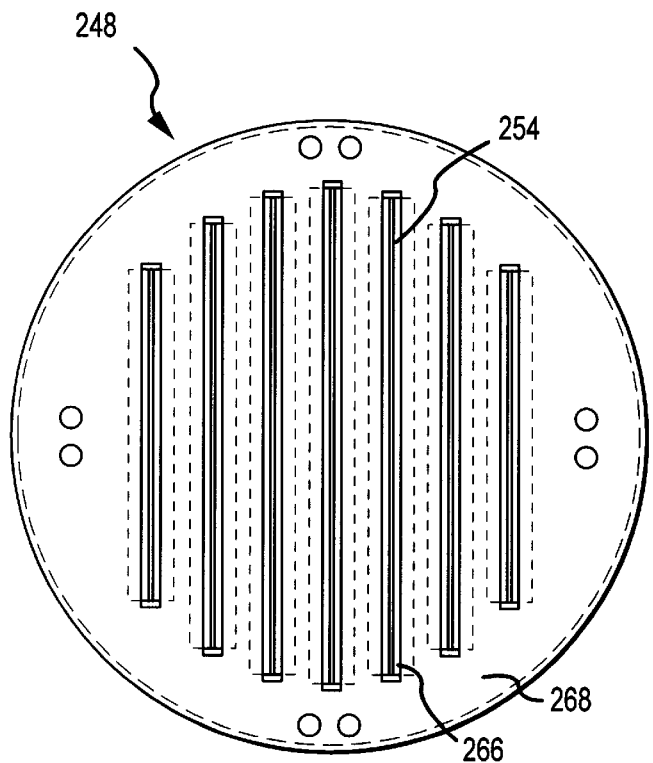
FIG. 27 is a front view of an upstream plate assembly of the virtual impactor shown in FIG. 26.
Figure 29:
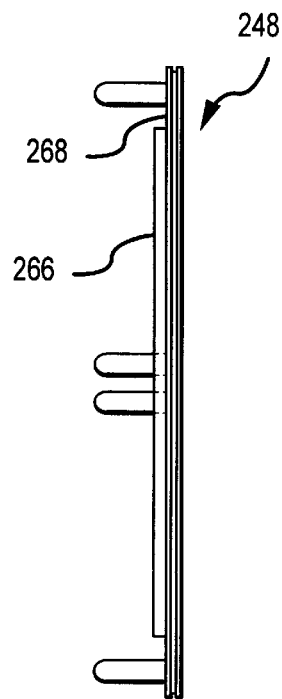
FIG. 29 is a side
Figure 28:
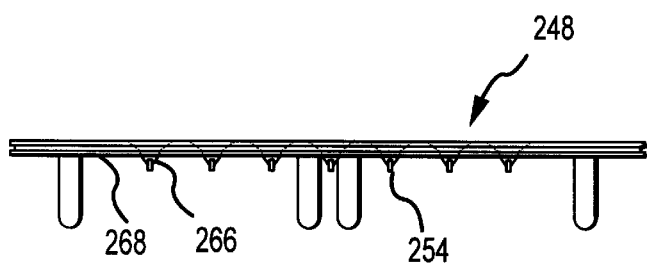
FIG. 28 is a top view of the upstream plate assembly shown in FIG. 27.

Referring now to FIGS. 23 and 24, the generator lid 140 is shown for a 400 transducer array design. The generator lid 140 mates with and covers the liquid feed box 190 (shown in FIGS. 12 and 13). The generator lid 140, as shown in FIGS. 23 and 24, has a hood design to permit easy collection of the aerosol 108 without subjecting droplets in the aerosol 108 to sharp edges on which droplets may coalesce and be lost, and possibly interfere with the proper operation of the aerosol generator 106. When the aerosol generator 106 is in operation, the aerosol 108 would be withdrawn via the aerosol exit opening 164 through the generator cover 140.

Figure 25:
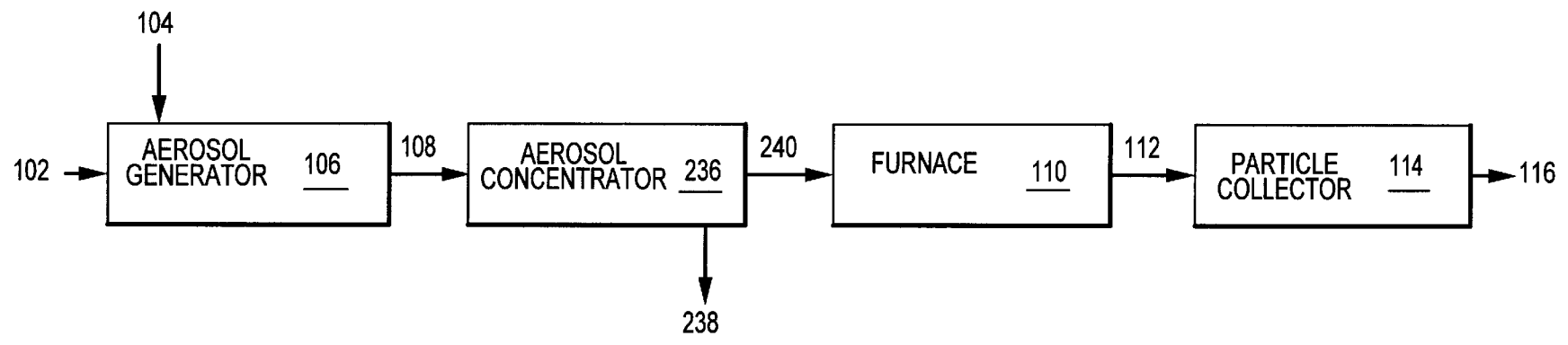

Although the aerosol generator 106 produces a high quality aerosol 108 having a high droplet loading, it is often desirable to further concentrate the aerosol 108 prior to introduction into the furnace 110. Referring now to FIG. 25, a process flow diagram is shown for one embodiment of the present invention involving such concentration of the aerosol 108. As shown in FIG. 25, the aerosol 108 from the aerosol generator 106 is sent to an aerosol concentrator 236 where excess carrier gas 238 is withdrawn from the aerosol 108 to produce a concentrated aerosol 240, which is then fed to the furnace 110.

The aerosol concentrator 236 typically includes one or more virtual impactors capable of concentrating droplets in the aerosol 108 by a factor of greater than about 2, preferably by a factor of greater than about 5, and more preferably by a factor of greater than about 10, to produce the concentrated aerosol 240. According to the present invention, the concentrated aerosol 240 should typically contain greater than about $1 \times 10^7$ droplets per cubic centimeter, and more preferably from about $5 \times 10^7$ to about $5 \times 10^8$ droplets per cubic centimeter. A concentration of about $1 \times 10^8$ droplets per cubic centimeter of the concentrated aerosol is particularly preferred, because when the concentrated aerosol 240 is loaded more heavily than that, then the frequency of collisions between droplets becomes large enough to impair the properties of the concentrated aerosol 240, resulting in potential contamination of the particulate product 116 with an undesirably large quantity of over-sized particles. For example, if the aerosol 108 has a concentration of about $1 \times 10^7$ droplets per cubic centimeter, and the aerosol concentrator 236 concentrates droplets by a factor of 10, then the concentrated aerosol 240 will have a concentration of about $1 \times 10^8$ droplets per cubic centimeter. Stated another way, for example, when the aerosol generator generates the aerosol 108 with a droplet loading of about 0.167 milliliters liquid feed 102 per liter of carrier gas 104, the concentrated aerosol 240 would be loaded with about 1.67 milliliters of liquid feed 102 per liter of carrier gas 104, assuming the aerosol 108 is concentrated by a factor of 10.

Having a high droplet loading in aerosol feed to the furnace provides the important advantage of reducing the heating demand on the furnace 110 and the size of flow conduits required through the furnace. Also, other advantages of having a dense aerosol include a reduction in the demands on cooling and particle collection components, permitting significant equipment and operational savings. Furthermore, as system components are reduced in size, powder holdup within the system is reduced, which is also desirable. Concentration of the aerosol stream prior to entry into the furnace 110, therefore, provides a substantial advantage relative to processes that utilize less concentrated aerosol streams.

The excess carrier gas 238 that is removed in the aerosol concentrator 236 typically includes extremely small droplets that are also removed from the aerosol 108. Preferably, the droplets removed with the excess carrier gas 238 have a weight average size of smaller than about 1.5 μm, and more preferably smaller than about 1 μm and the droplets retained in the concentrated aerosol 240 have an average droplet size of larger than about 2 μm. For example, a virtual impactor sized to treat an aerosol stream having a weight average droplet size of about 3 μm might be designed to remove with the excess carrier gas 238 most droplets smaller than about 1.5 μm in size. Other designs are also possible. When using the aerosol generator 106 with the present invention, however, the loss of these very small droplets in the aerosol concentrator 236 will typically constitute no more than about 10 percent by weight, and more preferably no more than about 5 percent by weight, of the droplets originally in the aerosol stream that is fed to the concentrator 236. Although the aerosol concentrator 236 is useful in some situations, it is normally not required with the process of the present invention, because the aerosol generator 106 is capable, in most circumstances, of generating an aerosol stream that is sufficiently dense. So long as the aerosol stream coming out of the aerosol generator 102 is sufficiently dense, it is preferred that the aerosol concentrator not be used. It is a significant advantage of the present invention that the aerosol generator 106 normally generates such a dense aerosol stream that the aerosol concentrator 236 is not needed. Therefore, the complexity of operation of the aerosol concentrator 236 and accompanying liquid losses may typically be avoided.

It is important that the aerosol stream (whether it has been concentrated or not) that is fed to the furnace 110 have a high droplet flow rate and high droplet loading as would be required for most industrial applications. With the present invention, the aerosol stream fed to the furnace preferably includes a droplet flow of greater than about 0.5 liters per hour, more preferably greater than about 2 liters per hour, still more preferably greater than about 5 liters per hour, even more preferably greater than about 10 liters per hour, particularly greater than about 50 liters per hour and most preferably greater than about 100 liters per hour; and with the droplet loading being typically greater than about 0.04 milliliters of droplets per liter of carrier gas, preferably greater than about 0.083 milliliters of droplets per liter of carrier gas 104, more preferably greater than about 0.167 milliliters of droplets per liter of carrier gas 104, still more preferably greater than about 0.25 milliliters of droplets per liter of carrier gas 104, particularly greater than about 0.33 milliliters of droplets per liter of carrier gas 104 and most preferably greater than about 0.83 milliliters of droplets per liter of carrier gas 104.

One embodiment of a virtual impactor that could be used as the aerosol concentrator 236 will now be described with reference to FIGS. 26–32. A virtual impactor 246 includes an upstream plate assembly 248 (details shown in FIGS. 27–29) and a downstream plate assembly 250 (details shown in FIGS. 25–32), with a concentrating chamber 262 located between the upstream plate assembly 248 and the downstream plate assembly 250.

Through the upstream plate assembly 248 are a plurality of vertically extending inlet slits 254. The downstream plate assembly 250 includes a plurality of Vertically extending exit slits 256 that are in alignment with the inlet slits 254. The exit slits 256 are, however, slightly wider than the inlet slits 254. The downstream plate assembly 250 also includes flow channels 258 that extend substantially across the width of the entire downstream plate assembly 250, with each flow channel 258 being adjacent to an excess gas withdrawal port 260.

During operation, the aerosol 108 passes through the inlet slits 254 and into the concentrating chamber 262. Excess carrier gas 238 is withdrawn from the concentrating chamber 262 via the excess gas withdrawal ports 260. The withdrawn excess carrier gas 238 then exits via a gas duct port 264. That portion of the aerosol 108 that is not withdrawn through the excess gas withdrawal ports 260 passes through the exit slits 256 and the flow channels 258 to form the concentrated aerosol 240. Those droplets passing across the concentrating chamber 262 and through the exit slits 256 are those droplets of a large enough size to have sufficient momentum to resist being withdrawn with the excess carrier gas 238.

As seen best in FIGS. 27–32, the inlet slits 254 of the upstream plate assembly 248 include inlet nozzle extension portions 266 that extend outward from the plate surface 268 of the upstream plate assembly 248. The exit slits 256 of the downstream plate assembly 250 include exit nozzle extension portions 270 extending outward from a plate surface 272 of the downstream plate assembly 250. These nozzle extension portions 266 and 270 are important for operation of the virtual impactor 246, because having these nozzle extension portions 266 and 270 permits a very close spacing to be attained between the inlet slits 254 and the exit slits 256 across the concentrating chamber 262, while also providing a relatively large space in the concentrating chamber 262 to facilitate efficient removal of the excess carrier gas 238.

Also as best seen in FIGS. 27–32, the inlet slits 254 have widths that flare outward toward the side of the upstream plate assembly 248 that is first encountered by the aerosol 108 during operation. This flared configuration reduces the sharpness of surfaces encountered by the aerosol 108, reducing the loss of aerosol droplets and potential interference from liquid buildup that could occur if sharp surfaces were present. Likewise, the exit slits 256 have a width that flares outward towards the flow channels 258, thereby allowing the concentrated aerosol 240 to expand into the flow channels 258 without encountering sharp edges that could cause problems.

As noted previously, both the inlet slits 254 of the upstream plate assembly 248 and the exit slits 256 of the downstream plate assembly 250 are vertically extending. This configuration is advantageous for permitting liquid that may collect around the inlet slits 254 and the exit slits 256 to drain away. The inlet slits 254 and the exit slits 256 need not, however, have a perfectly vertical orientation. Rather, it is often desirable to slant the slits backward (sloping upward and away in the direction of flow) by about five to ten degrees relative to vertical, to enhance draining of liquid off of the upstream plate assembly 248 and the downstream plate assembly 250. This drainage function of the vertically extending configuration of the inlet slits 254 and the outlet slits 256 also inhibits liquid build-up in the vicinity of the inlet slits 248 and the exit slits 250, which liquid build-up could result in the release of undesirably large droplets into the concentrated aerosol 240.

As discussed previously, the aerosol generator 106 of the present invention produces a concentrated, high quality aerosol of micro-sized droplets having a relatively narrow size distribution. It has been found, however, that for many applications the process of the present invention is significantly enhanced by further classifying by size the droplets in the aerosol 108 prior to introduction of the droplets into the furnace 110. In this manner, the size and size distribution of particles in the particulate product 116 are further controlled.

Figure 33:
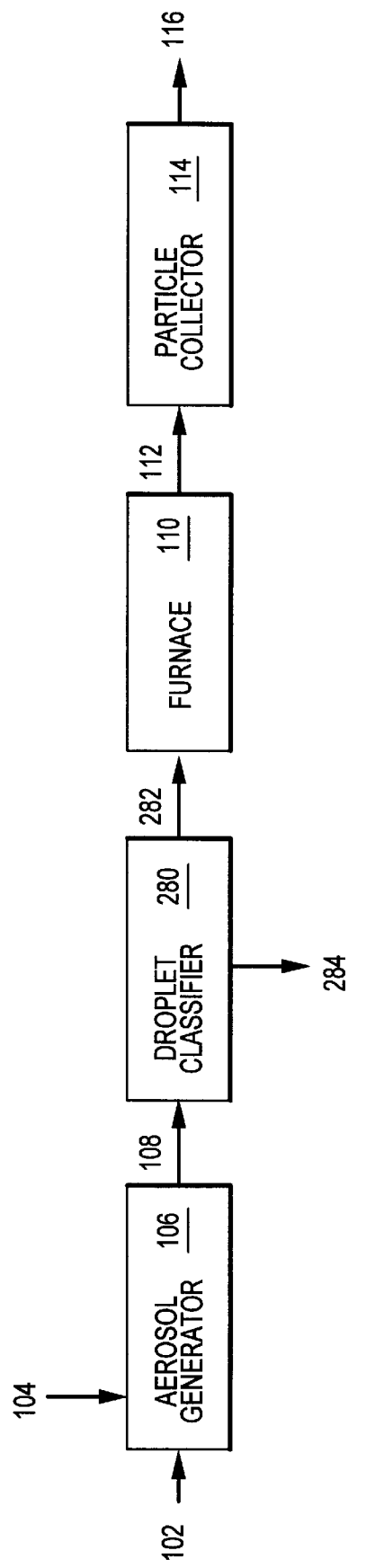

Referring now to FIG. 33, a process flow diagram is shown for one embodiment of the process of the present invention including such droplet classification. As shown in FIG. 33, the aerosol 108 from the aerosol generator 106 goes to a droplet classifier 280 where oversized droplets are removed from the aerosol 108 to prepare a classified aerosol 282. Liquid 284 from the oversized droplets that are being removed is drained from the droplet classifier 280. This drained liquid 284 may advantageously be recycled for use in preparing additional liquid feed 102.

Any suitable droplet classifier may be used for removing droplets above a predetermined size. For example, a cyclone could be used to remove over-size droplets. A preferred droplet classifier for many applications, however, is an impactor. One embodiment of an impactor for use with the present invention will now be described with reference to FIGS. 34–38.

Figure 34:
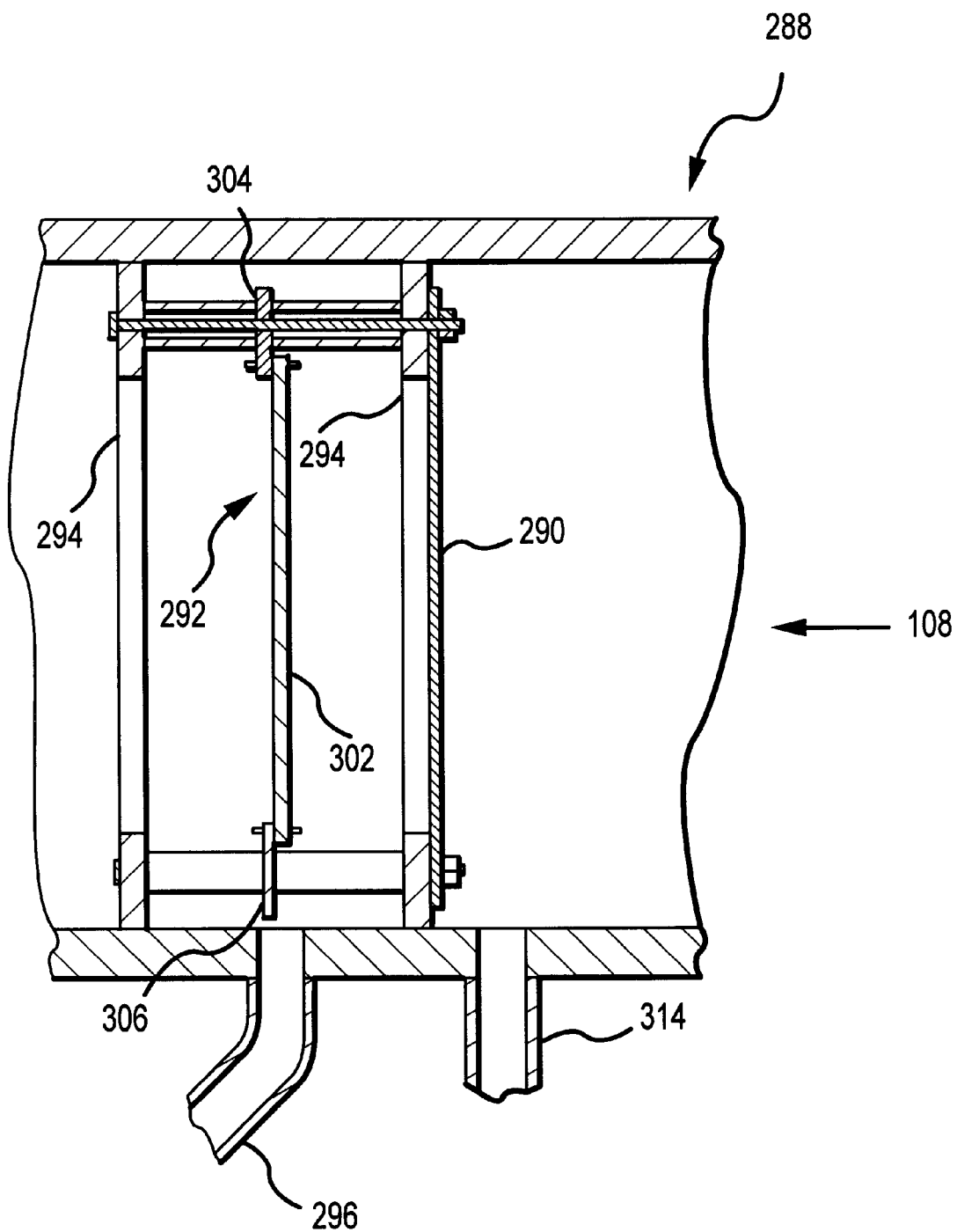

As seen in FIG. 34, an impactor 288 has disposed in a flow conduit 286 a flow control plate 290 and an impactor plate assembly 292. The flow control plate 290 is conveniently mounted on a mounting plate 294.

Figure 35:
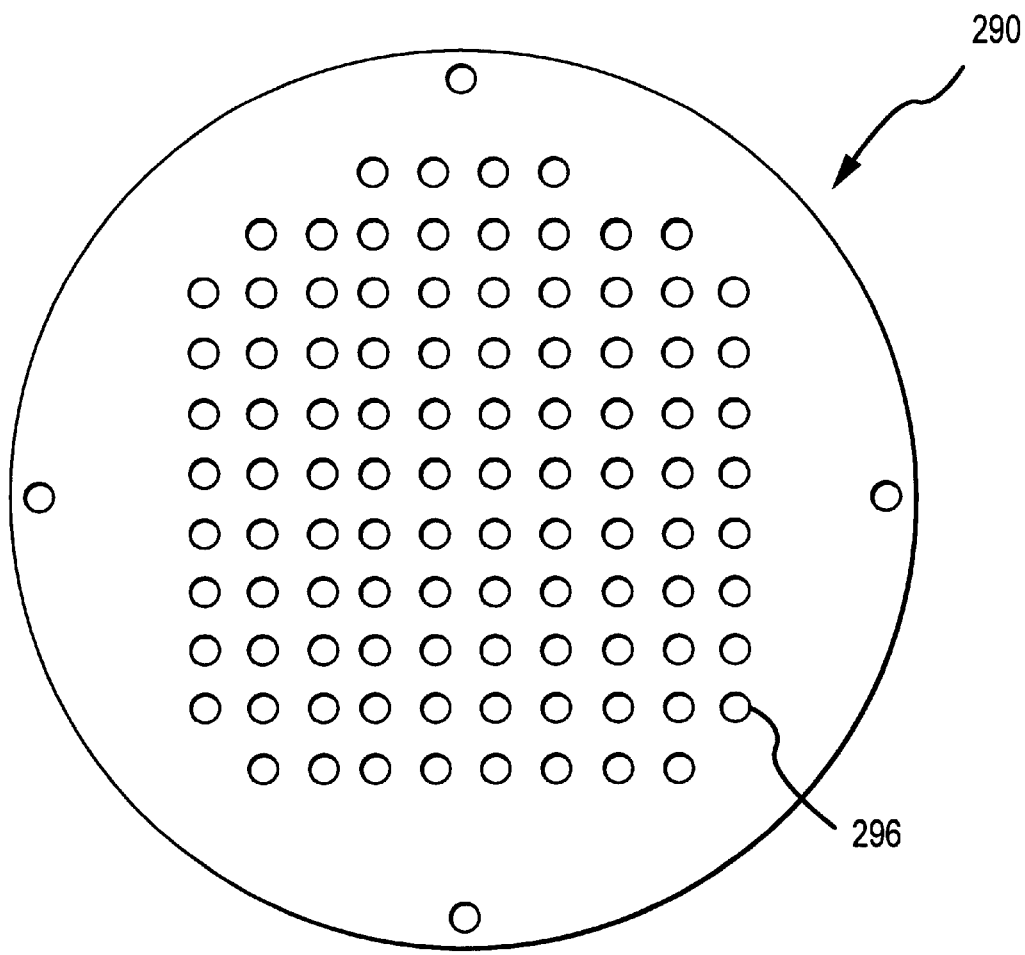

The flow control plate 290 is used to channel the flow of the aerosol stream toward the impactor plate assembly 292 in a manner with controlled flow characteristics that are desirable for proper impaction of oversize droplets on the impactor plate assembly 292 for removal through the drains 296 and 314. One embodiment of the flow control plate 290 is shown in FIG. 35. The flow control plate 290 has an array of circular flow ports 296 for channeling flow of the aerosol 108 towards the impactor plate assembly 292 with the desired flow characteristics.

Figure 36:
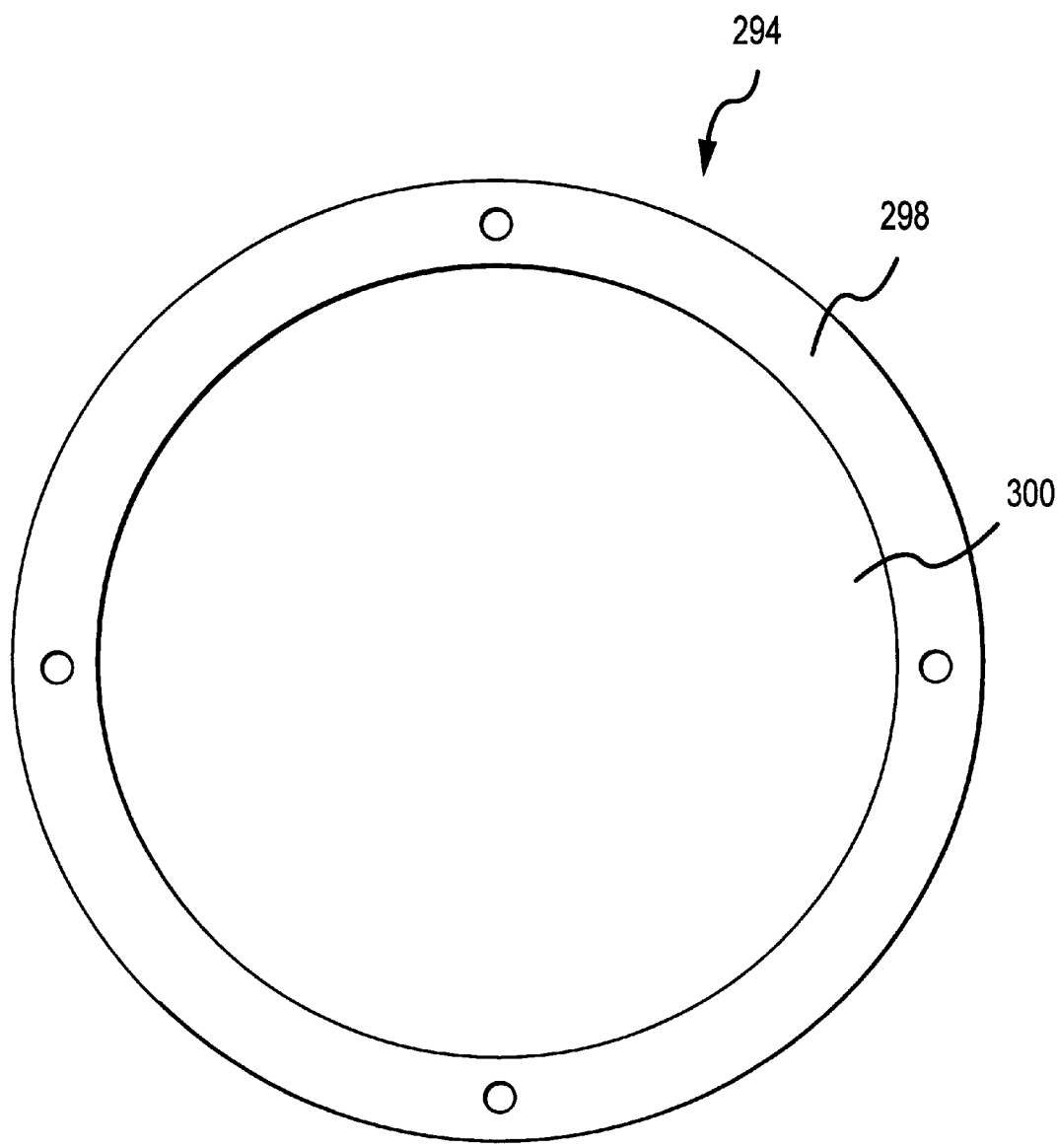

Details of the mounting plate 294 are shown in FIG. 36. The mounting plate 294 has a mounting flange 298 with a large diameter flow opening 300 passing therethrough to permit access of the aerosol 108 to the flow ports 296 of the flow control plate 290 (shown in FIG. 35).

Figure 37:
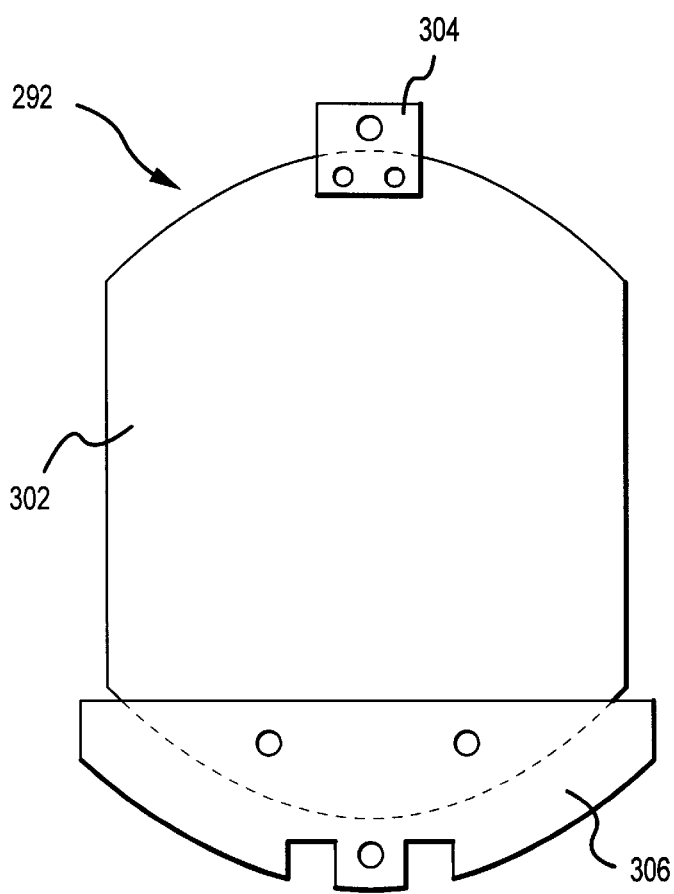
Figure 38:
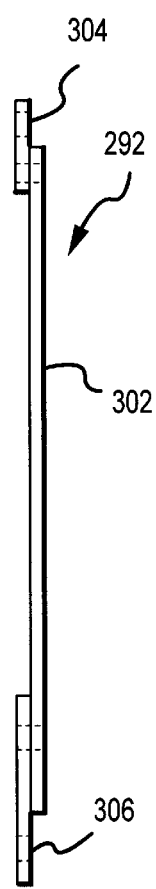
Figure 39:
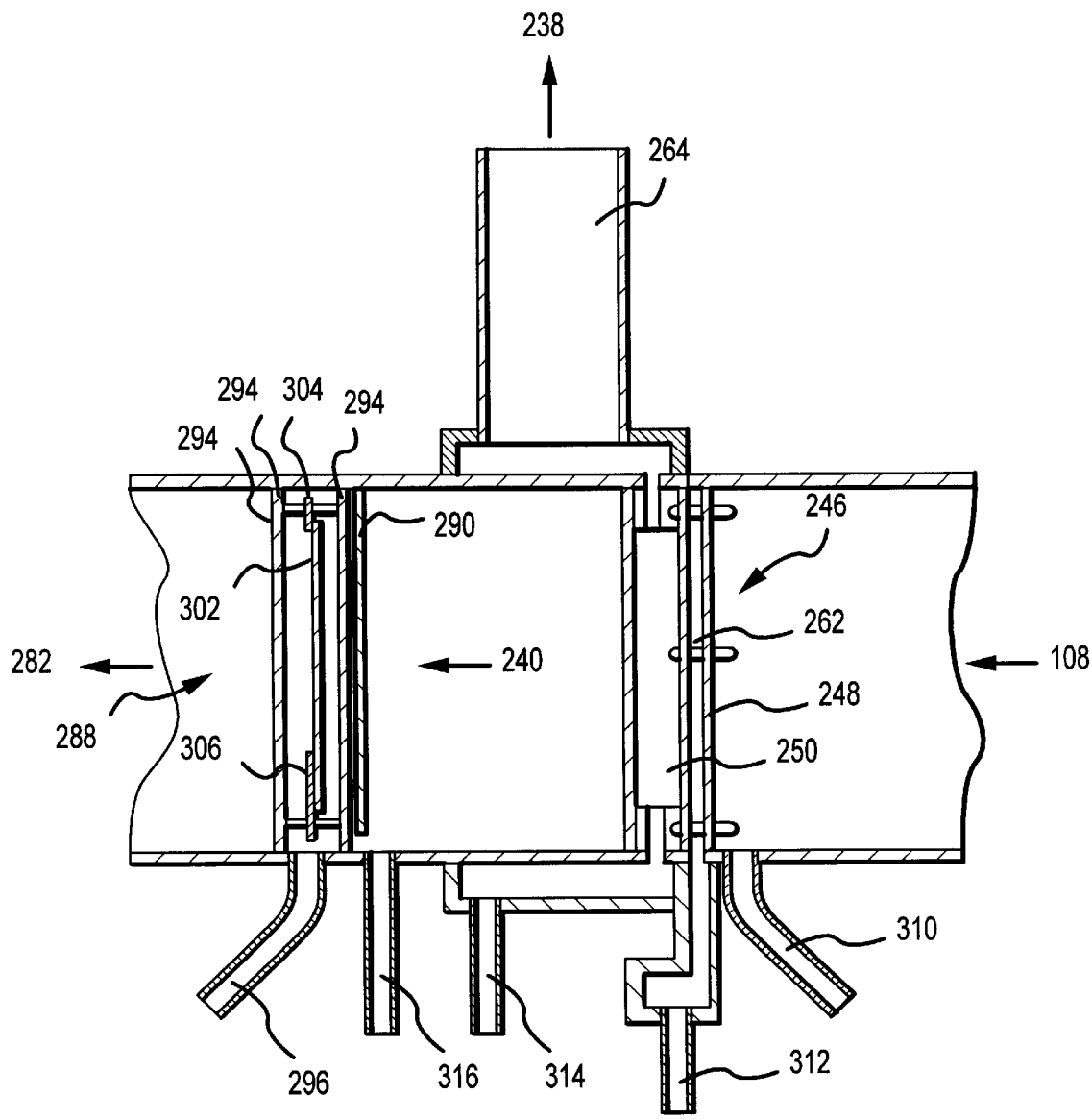
Figure 40:
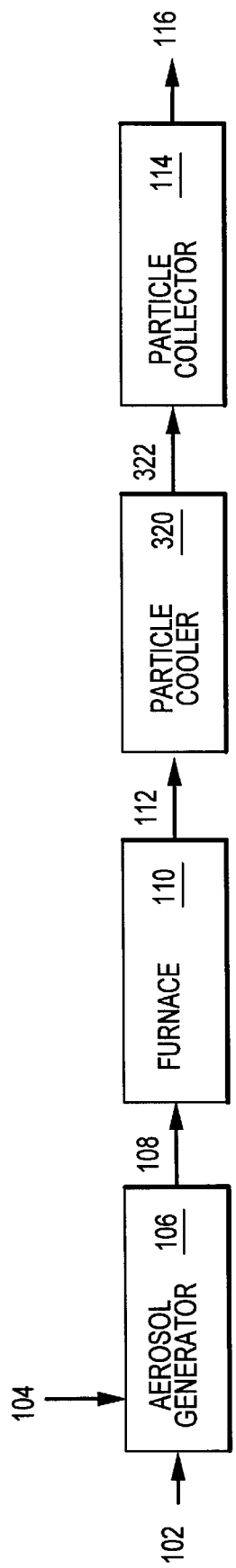

Referring now to FIGS. 37 and 38, one embodiment of an impactor plate assembly 292 is shown. The impactor plate assembly 292 includes an impactor plate 302 and mounting brackets 304 and 306 used to mount the impactor plate 302 inside of the flow conduit 286. The impactor plate 302 and the flow channel plate 290 are designed so that droplets larger than a predetermined size will have momentum that is too large for those particles to change flow direction to navigate around the impactor plate 302.

During operation of the impactor 288, the aerosol 108 from the aerosol generator 106 passes through the upstream flow control plate 290. Most of the droplets in the aerosol navigate around the impactor plate 302 and exit the impactor 288 through the downstream flow control plate 290 in the classified aerosol 282. Droplets in the aerosol 108 that are too large to navigate around the impactor plate 302 will impact on the impactor plate 302 and drain through the drain 296 to be collected with the drained liquid 284 (as shown in FIG. 34).

The configuration of the impactor plate 302 shown in FIG. 33 represents only one of many possible configurations for the impactor plate 302. For example, the impactor 288 could include an upstream flow control plate 290 having vertically extending flow slits therethrough that are offset from vertically extending flow slits through the impactor plate 302, such that droplets too large to navigate the change in flow due to the offset of the flow slits between the flow control plate 290 and the impactor plate 302 would impact on the impactor plate 302 to be drained away. Other designs are also possible.

In a preferred embodiment of the present invention, the droplet classifier 280 is typically designed to remove droplets from the aerosol 108 that are larger than about 15 $\mu$m in size, more preferably to remove droplets larger than about 10 $\mu$m in size, even more preferably to remove droplets of a size larger than about 8 $\mu$m in size and most preferably to remove droplets larger than about 5 $\mu$m in size. The droplet classification size in the droplet classifier is preferably smaller than about 15 $\mu$m, more preferably smaller than about 10 $\mu$m, even more preferably smaller than about 8 $\mu$m and most preferably smaller than about 5 μm. The classification size, also called the classification cut point, is that size at which half of the droplets of that size are removed and half of the droplets of that size are retained. Depending upon the specific application, however, the droplet classification size may be varied, such as by changing the spacing between the impactor plate 302 and the flow control plate 290 or increasing or decreasing aerosol velocity through the jets in the flow control plate 290. Because the aerosol generator 106 of the present invention initially produces a high quality aerosol 108, having a relatively narrow size distribution of droplets, typically less than about 30 weight percent of liquid feed 102 in the aerosol 108 is removed as the drain liquid 284 in the droplet classifier 288, with preferably less than about 25 weight percent being removed, even more preferably less than about 20 weight percent being removed and most preferably less than about 15 weight percent being removed. Minimizing the removal of liquid feed 102 from the aerosol 108 is particularly important for commercial applications to increase the yield of high quality particulate product 116. It should be noted, however, that because of the superior performance of the aerosol generator 106, it is frequently not required to use an impactor or other droplet classifier to obtain a desired absence of oversize droplets to the furnace. This is a major advantage, because the added complexity and liquid losses accompanying use of an impactor may often be avoided with the process of the present invention.

Sometimes it is desirable to use both the aerosol concentrator 236 and the droplet classifier 280 to produce an extremely high quality aerosol stream for introduction into the furnace for the production of particles of highly controlled size and size distribution. Referring now to FIG. 39, one embodiment of the present invention is shown incorporating both the virtual impactor 246 and the impactor 288. Basic components of the virtual impactor 246 and the impactor 288, as shown in FIG. 39, are substantially as previously described with reference to FIGS. 26–38. As seen in FIG. 39, the aerosol 108 from the aerosol generator 106 is fed to the virtual impactor 246 where the aerosol stream is concentrated to produce the concentrated aerosol 240. The concentrated aerosol 240 is then fed to the impactor 288 to remove large droplets therefrom and produce the classified aerosol 282, which may then be fed to the furnace 110. Also, it should be noted that by using both a virtual impactor and an impactor, both undesirably large and undesirably small droplets are removed, thereby producing a classified aerosol with a very narrow droplet size distribution. Also, the order of the aerosol concentrator and the aerosol classifier could be reversed, so that the aerosol concentrator 236 follows the aerosol classifier 280.

One important feature of the design shown in FIG. 39 is the incorporation of drains 310, 312, 314, 316 and 296 at strategic locations. These drains are extremely important for industrial-scale particle production because buildup of liquid in the process equipment can significantly impair the quality of the particulate product 116 that is produced. In that regard, drain 310 drains liquid away from the inlet side of the first plate assembly 248 of the virtual impactor 246. Drain 312 drains liquid away from the inside of the concentrating chamber 262 in the virtual impactor 246 and drain 314 removes liquid that deposits out of the excess carrier gas 238. Drain 316 removes liquid from the vicinity of the inlet side of the flow control plate 290 of the impactor, while the drain 296 removes liquid from the vicinity of the impactor plate 302. Without these drains 310, 312, 314, 316 and 296, the performance of the apparatus shown in FIG. 39 would be significantly impaired. All liquids drained in the drains 310, 312, 314, 316 and 296 may advantageously be recycled for use to prepare the liquid feed 102.

With some applications of the process of the present invention, it may be possible to collect the particles 112 directly from the output of the furnace 110. More often, however, it will be desirable to cool the particles 112 exiting the furnace 110 prior to collection of the particles 112 in the particle collector 114. Referring now to FIG. 40, one embodiment of the process of the present invention is shown in which the particles 112 exiting the furnace 110 are sent to a particle cooler 320 to produce a cooled particle stream 322, which is then feed to the particle collector 114. Although the particle cooler 320 may be any cooling apparatus capable of cooling the particles 112 to the desired temperature for introduction into the particle collector 114, traditional heat exchanger designs are not preferred. This is because a traditional heat exchanger design ordinarily directly subjects the aerosol stream, in which the hot particles 112 are suspended, to cool surfaces. In that situation, significant losses of the particles 112 occur due to thermophoretic deposition of the hot particles 112 on the cool surfaces of the heat exchanger. According to the present invention, a gas quench apparatus is provided for use as the particle cooler 320 that significantly reduces thermophoretic losses compared to a traditional heat exchanger.

Referring now to FIGS. 41–43, one embodiment of a gas quench cooler 330 is shown. The gas quench cooler includes a perforated conduit 332 housed inside of a cooler housing 334 with an annular space 336 located between the cooler housing 334 and the perforated conduit 332. In fluid communication with the annular space 336 is a quench gas inlet box 338, inside of which is disposed a portion of an aerosol outlet conduit 340. The perforated conduit 332 extends between the aerosol outlet conduit 340 and an aerosol inlet conduit 342. Attached to an opening into the quench gas inlet box 338 are two quench gas feed tubes 344. Referring specifically to FIG. 43, the perforated tube 332 is shown. The perforated tube 332 has a plurality of openings 345. The openings 345, when the perforated conduit 332 is assembled into the gas quench cooler 330, permit the flow of quench gas 346 from the annular space 336 into the interior space 348 of the perforated conduit 332. Although the openings 345 are shown as being round holes, any shape of opening could be used, such as slits. Also, the perforated conduit 332 could be a porous screen. Two heat radiation shields 347 prevent downstream radiant heating from the furnace. In most instances, however, it will not be necessary to include the heat radiation shields 347, because downstream-radiant heating from the furnace is normally not a significant problem. Use of the heat radiation shields 347 is not preferred due to particulate losses that accompany their use.

With continued reference to FIGS. 41–43, operation of the gas quench cooler 330 will now be described. During operation, the particles 112, carried by and dispersed in a gas stream, enter the gas quench cooler 330 through the aerosol inlet conduit 342 and flow into the interior space 348 of perforated conduit 332. Quench gas 346 is introduced through the quench gas feed tubes 344 into the quench gas inlet box 338. Quench gas 346 entering the quench gas inlet box 338 encounters the outer surface of the aerosol outlet conduit 340, forcing the quench gas 346 to flow, in a spiraling, swirling manner, into the annular space 336, where the quench gas 346 flows through the openings 345 through the walls of the perforated conduit 332. Preferably, the gas 346 retains some swirling motion even after passing into the interior space 348. In this way, the particles 112 are quickly cooled with low losses of particles to the walls of the gas quench cooler 330. In this manner, the quench gas 346 enters in a radial direction into the interior space 348 of the perforated conduit 332 around the entire periphery, or circumference, of the perforated conduit 332 and over the entire length of the perforated conduit 332. The cool quench gas 346 mixes with and cools the hot particles 112, which then exit through the aerosol outlet conduit 340 as the cooled particle stream 322. The cooled particle stream 322 can then be sent to the particle collector 114 for particle collection. The temperature of the cooled particle stream 322 is controlled by introducing more or less quench gas. Also, as shown in FIG. 41, the quench gas 346 is fed into the quench cooler 330 in counter flow to flow of the particles. Alternatively, the quench cooler could be designed so that the quench gas 346 is fed into the quench cooler in concurrent flow with the flow of the particles 112. The amount of quench gas 346 fed to the gas quench cooler 330 will depend upon the specific material being made and the specific operating conditions. The quantity of quench gas 346 used, however, must be sufficient to reduce the temperature of the aerosol steam including the particles 112 to the desired temperature. Typically, the particles 112 are cooled to a temperature at least below about 200° C., and often lower. The only limitation on how much the particles 112 are cooled is that the cooled particle stream 322 must be at a temperature that is above the condensation temperature for water as another condensible vapor in the stream. The temperature of the cooled particle stream 322 is often at a temperature of from about 50° C. to about 120° C.

Because of the entry of quench gas 346 into the interior space 348 of the perforated conduit 322 in a radial direction about the entire circumference and length of the perforated conduit 322, a buffer of the cool quench gas 346 is formed about the inner wall of the perforated conduit 332, thereby significantly inhibiting the loss of hot particles 112 due to thermophoretic deposition on the cool wall of the perforated conduit 332. In operation, the quench gas 346 exiting the openings 345 and entering into the interior space 348 should have a radial velocity (velocity inward toward the center of the circular cross-section of the perforated conduit 332) of larger than the thermophoretic velocity of the particles 112 inside the perforated conduit 332 in a direction radially outward toward the perforated wall of the perforated conduit 332.

As seen in FIGS. 41–43, the gas quench cooler 330 includes a flow path for the particles 112 through the gas quench cooler of a substantially constant cross-sectional shape and area. Preferably, the flow path through the gas quench cooler 330 will have the same cross-sectional shape and area as the flow path through the furnace 110 and through the conduit delivering the aerosol 108 from the aerosol generator 106 to the furnace 110. In one embodiment, however, it may be necessary to reduce the cross-sectional area available for flow prior to the particle collector 114. This is the case, for example, when the particle collector includes a cyclone for separating particles in the cooled particle stream 322 from gas in the cooled particle stream 322. This is because of the high inlet velocity requirements into cyclone separators.

Figure 44:
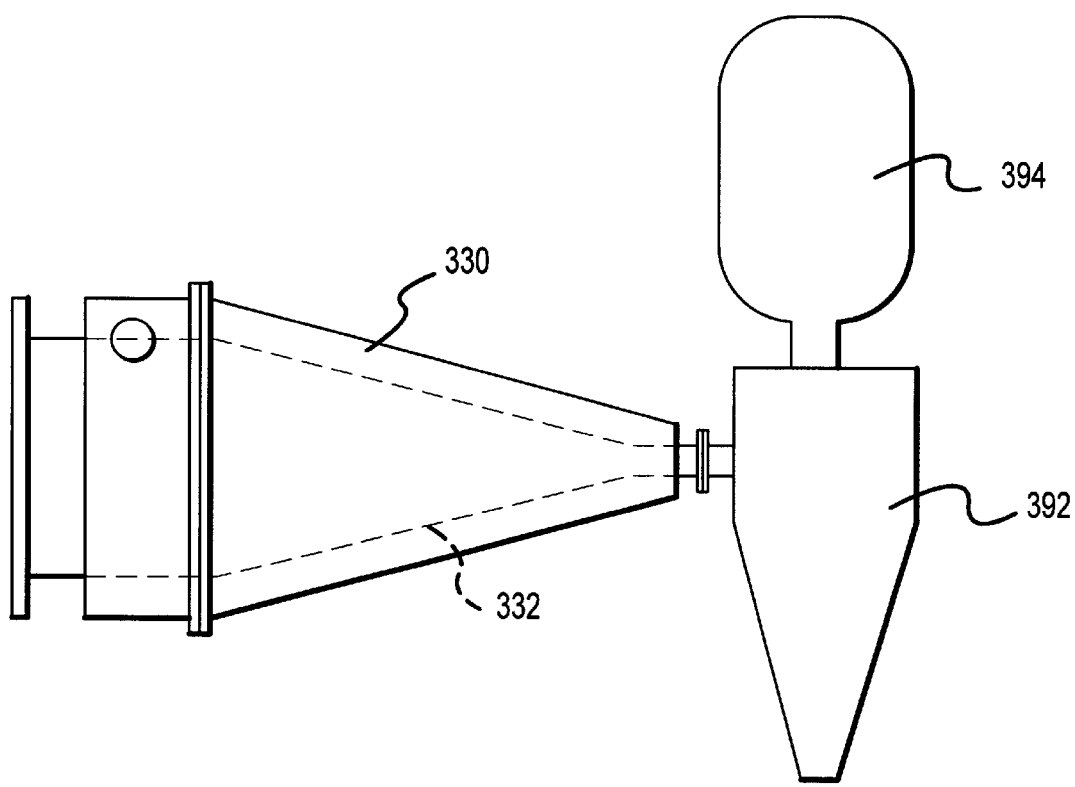
FIG. 44 is a side view showing one embodiment of a gas quench cooler of the present invention connected with a cyclone.
Figure 46:
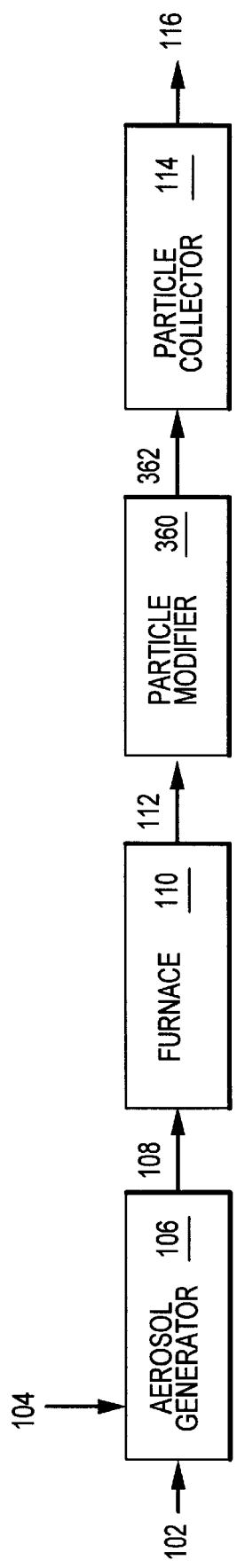
FIG. 46 is a block diagram of one embodiment of the present invention including a particle modifier.

Referring now to FIG. 44, one embodiment of the gas quench cooler 330 is shown in combination with a cyclone separator 392. The perforated conduit 332 has a continuously decreasing cross-sectional area for flow to increase the velocity of flow to the proper value for the feed to cyclone separator 392. Attached to the cyclone separator 392 is a bag filter 394 for final clean-up of overflow from the cyclone separator 392. Separated particles exit with underflow from the cyclone separator 392 and may be collected in any convenient container. The use of cyclone separation is particularly preferred for powder having a weight average size of larger than about 1 μm, although a series of cyclones may sometimes be needed to get the desired degree of separation. Cyclone separation is particularly preferred for powders having a weight average size of larger than about 1.5 μm. Also, cyclone separation is best suited for high density materials. Preferably, when particles are separated using a cyclone, the particles are of a composition with specific gravity of greater than about 5.

In an additional embodiment, the process of the present invention can also incorporate compositional modification of the particles 112 exiting the furnace. Most commonly, the compositional modification will involve forming on the particles 112 a material phase that is different than that of the particles 112, such as by coating the particles 112 with a coating material. One embodiment of the process of the present invention incorporating particle coating is shown in FIG. 45. As shown in FIG. 45, the particles 112 exiting from the furnace 110 go to a particle coater 350 where a coating is placed over the outer surface of the particles 112 to form coated particles 352, which are then sent to the particle collector 114 for preparation of the particulate product 116. Coating methodologies employed in the particle coater 350 are discussed in more detail below.

With continued reference primarily to FIG. 45, in a preferred embodiment, when the particles 112 are coated according to the process of the present invention, the particles 112 are also manufactured via the aerosol process of the present invention, as previously described. The process of the present invention can, however, be used to coat particles that have been premanufactured by a different process, such as by a liquid precipitation route. When coating particles that have been premanufactured by a different route, such as by liquid precipitation, it is preferred that the particles remain in a dispersed state from the time of manufacture to the time that the particles are introduced in slurry form into the aerosol generator 106 for preparation of the aerosol 108 to form the dry particles 112 in the furnace 110, which particles 112 can then be coated in the particle coater 350. Maintaining particles in a dispersed state from manufacture through coating avoids problems associated with agglomeration and redispersion of particles if particles must be redispersed in the liquid feed 102 for feed to the aerosol generator 106. For example, for particles originally precipitated from a liquid medium, the liquid medium containing the suspended precipitated particles could be used to form the liquid feed 102 to the aerosol generator 106. It should be noted that the particle coater 350 could be an integral extension of the furnace 110 or could be a separate piece of equipment.

In a further embodiment of the present invention, following preparation of the particles 112 in the furnace 110, the particles 112 may then be structurally modified to impart desired physical properties prior to particle collection. Referring now to FIG. 46, one embodiment of the process of the present invention is shown including such structural particle modification. The particles 112 exiting the furnace 110 go to a particle modifier 360 where the particles are structurally modified to form modified particles 362, which are then sent to the particle collector 114 for preparation of the particulate product 116. The particle modifier 360 is typically a furnace, such as an annealing furnace, which may be integral with the furnace 110 or may be a separate heating device. Regardless, it is important that the particle modifier 360 have temperature control that is independent of the furnace 110, so that the proper conditions for particle modification may be provided separate from conditions required of the furnace 110 to prepare the particles 112. The particle modifier 360, therefore, typically provides a temperature controlled environment and necessary residence time to effect the desired structural modification of the particles 112.

The structural modification that occurs in the particle modifier 360 may be any modification to the crystalline structure or morphology of the particles 112. For example, the particles 112 may be annealed in the particle modifier 360 to densify the particles 112 or to recrystallize the particles 112 into a polycrystalline or single crystalline form. Also, especially in the case of composite particles 112, the particles may be annealed for a sufficient time to permit redistribution within the particles 112 of different material phases. Particularly preferred parameters for such processes are discussed in more detail below.

The initial morphology of composite particles made in the furnace 110, according to the present invention, could take a variety of forms, depending upon the specified materials involved and the specific processing conditions. Examples of some possible composite particle morphologies, manufacturable according to the present invention are shown in FIG. 47. These morphologies could be of the particles as initially produced in the furnace 110 or that result from structural modification in the particle modifier 360. Furthermore, the composite particles could include a mixture of the morphological attributes shown in FIG. 47.

Figure 48:
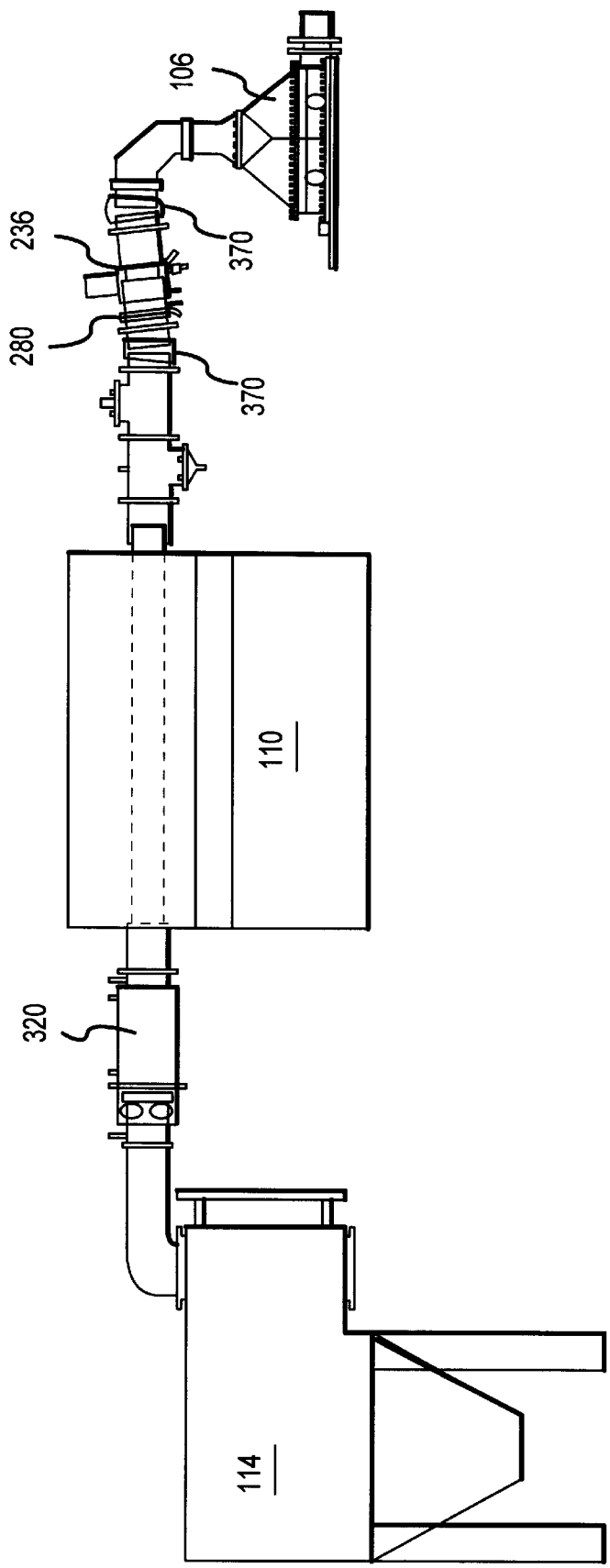
FIG. 48 shows a side view of one embodiment of apparatus of the present invention including an aerosol generator, an aerosol concentrator, a droplet classifier, a furnace, a particle cooler, and a particle collector.

Referring now to FIG. 48, an embodiment of the apparatus of the present invention is shown that includes the aerosol generator 106 (in the form of the 400 transducer array design), the aerosol concentrator 236 (in the form of a virtual impactor), the droplet classifier 280 (in the form of an impactor), the furnace 110, the particle cooler 320 (in the form of a gas quench cooler) and the particle collector 114 (in the form of a bag filter). All process equipment components are connected via appropriate flow conduits that are substantially free of sharp edges that could detrimentally cause liquid accumulations in the apparatus. Also, it should be noted that flex connectors 370 are used upstream and downstream of the aerosol concentrator 236 and the droplet classifier 280. By using the flex connectors 370, it is possible to vary the angle of slant of vertically extending slits in the aerosol concentrator 236 and/or the droplet classifier 280. In this way, a desired slant for the vertically extending slits may be set to optimize the draining characteristics off the vertically extending slits.

Aerosol generation with the process of the present invention has thus far been described with respect to the ultrasonic aerosol generator. Use of the ultrasonic generator is preferred for the process of the present invention because of the extremely high quality and dense aerosol generated. In some instances, however, the aerosol generation for the process of the present invention may have a different design depending upon the specific application. For example, when larger particles are desired, such as those having a weight average size of larger than about 3 $\mu$m, a spray nozzle atomizer may be preferred. For smaller-particle applications, however, and particularly for those applications to produce particles smaller than about 3 $\mu$m, and preferably smaller than about 2 $\mu$m in size, as is generally desired with the particles of the present invention, the ultrasonic generator, as described herein, is particularly preferred. In that regard, the ultrasonic generator of the present invention is particularly preferred for when making particles with a weight average size of from about 0.2 $\mu$m to about 3 $\mu$m.

Although ultrasonic aerosol generators have been used for medical applications and home humidifiers, use of ultrasonic generators for spray pyrolysis particle manufacture has largely been confined to small-scale, experimental situations. The ultrasonic aerosol generator of the present invention described with reference to FIGS. 5–24, however, is well suited for commercial production of high quality powders with a small average size and a narrow size distribution. In that regard, the aerosol generator produces a high quality aerosol, with heavy droplet loading and at a high rate of production. Such a combination of small droplet size, narrow size distribution, heavy droplet loading, and high production rate provide significant advantages over existing aerosol generators that usually suffer from at least one of inadequately narrow size distribution, undesirably low droplet loading, or unacceptably low production rate.

Through the careful and controlled design of the ultrasonic generator of the present invention, an aerosol may be produced typically having greater than about 70 weight percent (and preferably greater than about 80 weight percent) of droplets in the size range of from about 1 $\mu$m to about 10 $\mu$m, preferably in a size range of from about 1 $\mu$m to about 5 $\mu$m and more preferably from about 2 $\mu$m to about 4 $\mu$m. Also, the ultrasonic-generator of the present invention is capable of delivering high output rates of liquid feed in the aerosol. The rate of liquid feed, at the high liquid loadings previously described, is preferably greater than about 25 milliliters per hour per transducer, more preferably greater than about 37.5 milliliters per hour per transducer, even more preferably greater than about 50 milliliters per hour per transducer and most preferably greater than about 100 millimeters per hour per transducer. This high level of performance is desirable for commercial operations and is accomplished with the present invention with a relatively simple design including a single precursor bath over an array of ultrasonic transducers. The ultrasonic generator is made for high aerosol production rates at a high droplet loading, and with a narrow size distribution of droplets. The generator preferably produces an aerosol at a rate of greater than about 0.5 liter per hour of droplets, more preferably greater than about 2 liters per hour of droplets, still more preferably greater than about 5 liters per hour of droplets, even more preferably greater than about 10 liters per hour of droplets and most preferably greater than about 40 liters per hour of droplets. For example, when the aerosol generator has a 400 transducer design, as described with reference to FIGS. 7–24, the aerosol generator is capable of producing a high quality aerosol having high droplet loading as previously described, at a total production rate of preferably greater than about 10 liters per hour of liquid feed, more preferably greater than about 15 liters per hour of liquid feed, even more preferably greater than about 20 liters per hour of liquid feed and most preferably greater than about 40 liters per hour of liquid feed.

Under most operating conditions, when using such an aerosol generator, total particulate product produced is preferably greater than about 0.5 gram per hour per transducer, more preferably greater than about 0.75 gram per hour per transducer, even more preferably greater than about 1.0 gram per hour per transducer and most preferably greater than about 2.0 grams per hour per transducer.

One significant aspect of the process of the present invention for manufacturing particulate materials is the unique flow characteristics encountered in the furnace relative to laboratory scale systems. The maximum Reynolds number attained for flow in the furnace 110 with the present invention is very high, typically in excess of 500, preferably in excess of 1,000 and more preferably in excess of 2,000. In most instances, however, the maximum Reynolds number for flow in the furnace will not exceed 10,000, and preferably will not exceed 5,000. This is significantly different from lab-scale systems where the Reynolds number for flow in a reactor is typically lower than 50 and rarely exceeds 100.

The Reynolds number is a dimensionless quantity characterizing flow of a fluid which, for flow through a circular cross sectional conduit is defined as:

$$Re = \frac{\rho v d}{\mu}$$

Where $\rho$ = fluid density, $v$ = fluid mean velocity, $d$ = conduit inside diameter, and $\mu$ = fluid viscosity.

It should be noted that the values for density, velocity and viscosity will vary along the length of the furnace 110. The maximum Reynolds number in the furnace 110 is typically attained when the average stream temperature is at a maximum, because the gas velocity is at a very high value due to gas expansion when heated.

One problem with operating under flow conditions at a high Reynolds number is that undesirable volatilization of components is much more likely to occur than in systems having flow characteristics as found in laboratory-scale systems. The volatilization problem occurs with the present invention, because the furnace is typically operated over a substantial section of the heating zone in a constant wall heat flux mode, due to limitations in heat transfer capability. This is significantly different than operation of a furnace at a laboratory scale, which typically involves operation of most of the heating zone of the furnace in a uniform wall temperature mode, because the heating load is sufficiently small that the system is not heat transfer limited.

With the present invention, it is typically preferred to heat the aerosol stream in the heating zone of the furnace as quickly as possible to the desired temperature range for particle manufacture. Because of flow characteristics in the furnace and heat transfer limitations, during rapid heating of the aerosol the wall temperature of the furnace can significantly exceed the maximum average target temperature for the stream. This is a problem because, even though the average stream temperature may be within the range desired, the wall temperature may become so hot that components in the vicinity of the wall are subjected to temperatures high enough to undesirably volatilize the components. This volatilization near the wall of the furnace can cause formation of significant quantities of ultrafine particles that are outside of the size range desired.

Therefore, with the present invention, it is preferred that when the flow characteristics in the furnace are such that the Reynolds number through any part of the furnace exceeds. 500, more preferably exceeds 1,000, and most preferably exceeds 2,000, the maximum wall temperature in the furnace should be kept at a temperature that is below the temperature at which a desired component of the final particles would exert a vapor pressure not exceeding about 200 millitorr, more preferably not exceeding about 100 millitorr, and most preferably not exceeding about 50 millitorr. Furthermore, the maximum wall temperature in the furnace should also be kept below a temperature at which an intermediate component, from which a final component is to be at least partially derived, should also have a vapor pressure not exceeding the magnitudes noted for components of the final product.

In addition to maintaining the furnace wall temperature below a level that could create volatilization problems, it is also important that this not be accomplished at the expense of the desired average stream temperature. The maximum average stream temperature must be maintained at a high enough level so that the particles will have a desired high density. The maximum average stream temperature should, however, generally be a temperature at which a component in the final particles, or an intermediate component from which a component in the final particles is at least partially derived, would exert a vapor pressure not exceeding about 100 millitorr, preferably not exceeding about 50 millitorr, and most preferably not exceeding about 25 millitorr.

So long as the maximum wall temperature and the average stream temperature are kept below the point at which detrimental volatilization occurs, it is generally desirable to heat the stream as fast as possible and to remove resulting particles from the furnace immediately after the maximum stream temperature is reached in the furnace. With the present invention, the average residence time in the heating zone of the furnace may typically be maintained at shorter than about 4 seconds, preferably shorter than about 2 seconds, more preferably shorter than about 1 second, still more preferably shorter than about 0.5 second, and most preferably shorter than about 0.2 second.

Another significant issue with respect to operating the process of the present invention, which includes high aerosol flow rates, is loss within the system of materials intended for incorporation into the final particulate product. Material losses in the system can be quite high if the system is not properly operated. If system losses are too high, the process would not be practical for use in the manufacture of particulate products of many materials. This has typically not been a major consideration with laboratory-scale systems.

One significant potential for loss with the process of the present invention is thermophoretic losses that occur when a hot aerosol stream is in the presence of a cooler surface. In that regard, the use of the quench cooler, as previously described, with the process of the present invention provides an efficient way to cool the particles without unreasonably high thermophoretic losses. There is also, however, significant potential for losses occurring near the end of the furnace and between the furnace and the cooling unit.

It has been found that thermophoretic losses in the back end of the furnace can be significantly controlled if the heating zone of the furnace is operated such that the maximum stream temperature is not attained until near the end of the heating zone in the furnace, and at least not until the last third of the heating zone. When the heating zone includes a plurality of heating sections, the maximum average stream temperature should ordinarily not occur until at least the last heating section. Furthermore, the heating zone should typically extend to as close to the exit of the furnace as possible. This is counter to conventional thought which is to typically maintain the exit portion of the furnace at a low temperature to avoid having to seal the furnace outlet at a high temperature. Such cooling of the exit portion of the furnace, however, significantly promotes thermophoretic losses. Furthermore, the potential for operating problems that could result in thermophoretic losses at the back end of the furnace are reduced with the very short residence times in the furnace for the present invention, as discussed previously.

Typically, it would be desirable to instantaneously cool the aerosol upon exiting the furnace. This is not possible. It is possible, however, to make the residence time between the furnace outlet and the cooling unit as short as possible. Furthermore, it is desirable to insulate the aerosol conduit occurring between the furnace exit and the cooling unit entrance. Even more preferred is to insulate that conduit and, even more preferably, to also heat that conduit so that the wall temperature of that conduit is at least as high as the average stream temperature of the aerosol stream. Furthermore, it is desirable that the cooling unit operate in a manner such that the aerosol is quickly cooled in a manner to prevent thermophoretic losses during cooling. The quench cooler, described previously, is very effective for cooling with low losses. Furthermore, to keep the potential for thermophoretic losses very low, it is preferred that the residence time of the aerosol stream between attaining the maximum stream temperature in the furnace and a point at which the aerosol has been cooled to an average stream temperature below about 200° C. is shorter than about 2 seconds, more preferably shorter than about 1 second, and even more preferably shorter than about 0.5 second and most preferably shorter than about 0.1 second. In most instances, the maximum average stream temperature attained in the furnace will be greater than about 800° C. Furthermore, the total residence time from the beginning of the heating zone in the furnace to a point at which the average stream temperature is at a temperature below about 200° C. should typically be shorter than about 5 seconds, preferably shorter than about 3 seconds, more preferably shorter than about 2 seconds, and most preferably shorter than about 1 second.

Another part of the process with significant potential for thermophoretic losses is after particle cooling until the particles are finally collected. Proper particle collection is very important to reducing losses within the system. The potential for thermophoretic losses is significant following particle cooling because the aerosol stream is still at an elevated temperature to prevent detrimental condensation of water in the aerosol stream. Therefore, cooler surfaces of particle collection equipment can result in significant thermophoretic losses.

To reduce the potential for thermophoretic losses before the particles are finally collected, it is important that the transition between the cooling unit and particle collection be as short as possible. Preferably, the output from the quench cooler is immediately sent to a particle separator, such as a filter unit or a cyclone. In that regard, the total residence time of the aerosol between attaining the maximum average stream temperature in the furnace and the final collection of the particles is preferably shorter than about 2 seconds, more preferably shorter than about 1 second, still more preferably shorter than about 0.5 second and most preferably shorter than about 0.1 second. Furthermore, the residence time between the beginning of the heating zone in the furnace and final collection of the particles is preferably shorter than about 6 seconds, more preferably shorter than about 3 seconds, even more preferably shorter than about 2 seconds, and most preferably shorter than about 1 second. Furthermore, the potential for thermophoretic losses may further be reduced by insulating the conduit section between the cooling unit and the particle collector and, even more preferably, by also insulating around the filter, when a filter is used for particle collection. The potential for losses may be reduced even further by heating of the conduit section between the cooling unit and the particle collection equipment, so that the internal equipment surfaces are at least slightly warmer than the aerosol stream average stream temperature. Furthermore, when a filter is used for particle collection, the filter could be heated. For example, insulation could be wrapped around a filter unit, with electric heating inside of the insulating layer to maintain the walls of the filter unit at a desired elevated temperature higher than the temperature of filter elements in the filter unit, thereby reducing thermophoretic particle losses to walls of the filter unit.

Even with careful operation to reduce thermophoretic losses, some losses will still occur. For example, some particles will inevitably be lost to walls of particle collection equipment, such as the walls of a cyclone or filter housing. One way to reduce these losses, and correspondingly increase product yield, is to periodically wash the interior of the particle collection equipment to remove particles adhering to the sides. In most cases, the wash fluid will be water, unless water would have a detrimental effect on one of the components of the particles. For example, the particle collection equipment could include parallel collection paths. One path could be used for active particle collection while the other is being washed. The wash could include an automatic or manual flush without disconnecting the equipment. Alternatively, the equipment to be washed could be disconnected to permit access to the interior of the equipment for a thorough wash. As an alternative to having parallel collection paths, the process could simply be shut down occasionally to permit disconnection of the equipment for washing. The removed equipment could be replaced with a clean piece of equipment and the process could then be resumed while the disconnected equipment is being washed.

For example, a cyclone or filter unit could periodically be disconnected and particles adhering to interior walls could be removed by a water wash. The particles could then be dried in a low temperature dryer, typically at a temperature of lower than about 50° C.

In one embodiment, wash fluid used to wash particles from the interior walls of particle collection equipment includes a surfactant. Some of the surfactant will adhere to the surface of the particles. This could be advantageous to reduce agglomeration tendency of the particles and to enhance dispersibility of the particles in a thick film past formulation. The surfactant could be selected for compatibility with the specific paste formulation anticipated.

Another area for potential losses in the system, and for the occurrence of potential operating problems, is between the outlet of the aerosol generator and the inlet of the furnace. Losses here are not due to thermophoresis, but rather to liquid coming out of the aerosol and impinging and collecting on conduit and equipment surfaces. Although this loss is undesirable from a material yield standpoint, the loss may be even more detrimental to other aspects of the process. For example, water collecting on surfaces may release large droplets that can lead to large particles that detrimentally contaminate the particulate product. Furthermore, if accumulated liquid reaches the furnace, the liquid can cause excessive temperature gradients within the furnace tube, which can cause furnace tube failure, especially for ceramic tubes. One way to reduce the potential for undesirable liquid buildup in the system is to provide adequate drains, as previously described. In that regard, it is preferred that a drain be placed as close as possible to the furnace inlet to prevent liquid accumulations from reaching the furnace. The drain should be placed, however, far enough in advance of the furnace inlet such that the stream temperature is lower than about 80° C. at the drain location.

Another way to reduce the potential for undesirable liquid buildup is for the conduit between the aerosol generator outlet and the furnace inlet be of a substantially constant cross sectional area and configuration. Preferably, the conduit beginning with the aerosol generator outlet, passing through the furnace and continuing to at least the cooling unit inlet is of a substantially constant cross sectional area and geometry.

Another way to reduce the potential for undesirable buildup is to heat at least a portion, and preferably the entire length, of the conduit between the aerosol generator and the inlet to the furnace. For example, the conduit could be wrapped with a heating tape to maintain the inside walls of the conduit at a temperature higher than the temperature of the aerosol. The aerosol would then tend to concentrate toward the center of the conduit due to thermophoresis. Fewer aerosol droplets would, therefore, be likely to impinge on conduit walls or other surfaces making the transition to the furnace.

Another way to reduce the potential for undesirable liquid buildup is to introduce a dry gas into the aerosol between the aerosol generator and the furnace. Referring now to FIG. 49, one embodiment of the process is shown for adding a dry gas 118 to the aerosol 108 before the furnace 110. Addition of the dry gas 118 causes vaporization of at least a part of the moisture in the aerosol 108, and preferably substantially all of the moisture in the aerosol 108, to form a dried aerosol 119, which is then introduced into the furnace 110.

The dry gas 118 will most often be dry air, although in some instances it may be desirable to use dry nitrogen gas or some other dry gas. If sufficient a sufficient quantity of he dry gas 118 is used, the droplets of the aerosol 108 are substantially completely dried to beneficially form dried precursor particles in aerosol form for introduction into the furnace 110, where the precursor particles are then pyrolyzed to make a desired particulate product. Also, the use of the dry gas 118 typically will reduce the potential for contact between droplets of the aerosol and the conduit wall, especially in the critical area in the vicinity of the inlet to the furnace 110. In that regard, a preferred method for introducing the dry gas 118 into the aerosol 108 is from a radial direction into the aerosol 108. For example, equipment of substantially the same design as the quench cooler, described previously with reference to FIGS. 41–43, could be used, with the aerosol 108 flowing through the interior flow path of the apparatus and the dry gas 118 being introduced through perforated wall of the perforated conduit. An alternative to using the dry gas 118 to dry the aerosol 108 would be to use a low temperature thermal preheater/dryer prior to the furnace 110 to dry the aerosol 108 prior to introduction into the furnace 110. This alternative is not, however, preferred.

Still another way to reduce the potential for losses due to liquid accumulation is to operate the process with equipment configurations such that the aerosol stream flows in a vertical direction from the aerosol generator to and through the furnace. For smaller-size particles, those smaller than about 1.5 $\mu$m, this vertical flow should, preferably, be vertically upward. For larger-size particles, such as those larger than about 1.5 $\mu$m, the vertical flow is preferably vertically downward.

Furthermore, with the process of the present invention, the potential for system losses is significantly reduced because the total system retention time from the outlet of the generator until collection of the particles is typically shorter than about 10 seconds, preferably shorter than about 7 seconds, more preferably shorter than about 5 seconds and most preferably shorter than about 3 seconds.

For the production of abrasives such as CMP abrasives, the liquid feed 102 includes at least one abrasive particle precursor for preparation of the abrasive particles 112. The abrasive particle precursor may be a substance in either a liquid or solid phase of the liquid feed 102. Typically, the abrasive particle precursor will be a compound, such as a salt, dissolved in a liquid solvent of the liquid feed 102. The abrasive particle precursor may undergo one or more chemical reactions in the furnace 110 to assist in production of the abrasive particles 112. Alternatively, the abrasive particle precursor may contribute to formation of the abrasive particles 112 without undergoing chemical reaction. This could be the case, for example, when the liquid feed 102 includes suspended particles as a precursor material.

The liquid feed 102 thus includes the chemical components that will form the abrasive particles. For example, the liquid feed 102 can comprise a solution containing metal nitrates, chlorides, sulfates, hydroxides, or oxalates that are capable of forming the desired abrasive compound. For example, preferred precursors for ceria ($CeO_2$) are ceric ammonium nitrate and cerium nitrate and a preferred precursor for alumina ($Al_2O_3$) is aluminum nitrate. Nitrate salts are highly soluble in water and the solutions maintain a low viscosity, even at high concentrations. The solution preferably has a precursor concentration that is unsaturated to avoid the possibility of precipitate formation. The solution preferably includes, for example, a precursor concentration to provide from about 1 to about 50 weight percent, more preferably from about 1 to about 10 weight percent, of the abrasive compound in solution. The final particle size of the abrasive particles 112 is also influenced by the precursor concentration. Generally, lower precursor concentrations will produce smaller particles.

Preferably, the solvent is aqueous-based for ease of operation, although other solvents, such as toluene or ethylene glycol, may be desirable. The use of organic solvents can lead to undesirable carbon concentration in the abrasive particles. The pH of the aqueous-based solutions can be adjusted to alter the solubility characteristics of the precursor in the solution.

The precursor solution can also include other additives such as acids, bases, complexing agents, sintering aids, fluxing agents, and the like. One preferred additive is urea, which can aid in the densification of the particles. Preferably, up to about 1 mole equivalent of urea is added to the solution.

When the liquid feed 102 includes multiple precursors, more than one of the precursors may be an abrasive particle precursor, or one or more of the precursors may contain a component other than the abrasive particle precursor that is contributed to the abrasive particles 112. Different components contributed by different precursors may be present in the particles together in a single material phase, or the different components may be present in different material phases when the abrasive particles 112 are composites of multiple phases. To form composite particles, the liquid feed can include colloids, for example colloidal particles of $Al_2O_3$, $SiO_2$, $CeO_2$, $ZrO_2$ or $TiO_2$.

A carrier gas 104 under controlled pressure is introduced to the aerosol generator to move the droplets away from the generator. The carrier gas 104 may comprise any gaseous medium in which droplets produced from the liquid feed 102 may be dispersed in aerosol form. Also, the carrier gas 104 may be inert, in that the carrier gas 104 does not participate in formation of the abrasive particles 112. Alternatively, the carrier gas 104 may have one or more active component(s), such as oxygen, that contribute to formation of the abrasive particles 112. In that regard, the carrier gas may include one or more reactive components that react in the furnace 110 to contribute to formation of the abrasive particles 112. Examples of preferred carrier gases include reactive carrier gases such as air or oxygen and inert carrier gases such as argon or nitrogen. Air is a preferred carrier gas for forming abrasive particles according to the present invention. However, an oxygen-containing gas may not be needed if sufficient $NO_x$ is produced during pyrolysis of the precursor.

According to the present invention, the stream temperature (reaction temperature) in the heating zone is preferably from about 400° C. to about 1200° C., such as from about 600° C. to about 1100° C., although it will be appreciated that the temperature will depend on the abrasive compound being produced.

When the abrasive particles are coated abrasive particles, precursors to metal oxide coatings can be selected from volatile metal acetates, chlorides, alkoxides or halides. Such precursors are known to react at high temperatures to form the corresponding metal oxides and eliminate supporting ligands or ions. For example, $SiCl_4$ can be used as a precursor to $SiO_2$ coatings where water vapor is present:

$$SiCl_{4(g)} + 2H_2O_{(g)} \rightarrow SiO_{2(s)} + 4HCl_{(g)}$$

$SiCl_4$ also is highly volatile and is a liquid at room temperature, which makes transport into the reactor more controllable.

Metal alkoxides can be used to produce metal oxide films by hydrolysis. The water molecules react with the alkoxide M—O bond resulting in clean elimination of the corresponding alcohol with the formation of M—O—M bonds:

$$Si(OEt)_4 + 2H_2O \rightarrow SiO_2 + 4EtOH$$

Most metal alkoxides have a reasonably high vapor pressure and are therefore well suited as coating precursors.

Metal acetates are also useful as coating precursors since they readily decompose upon thermal activation by acetic anhydride elimination:

$$Mg(O_2CCH_3)_2 \rightarrow MgO + CH_3C(O)OC(O)CH_3$$

Metal acetates are advantageous as coating precursors since they are water stable and are reasonably inexpensive.

Coatings can be generated on the abrasive particle surface by a number of different mechanisms. One or more precursors can vaporize and fuse to the hot particle surface and thermally react resulting in the formation of a thin-film coating by chemical vapor deposition (CVD). Preferred coatings deposited by CVD include metal oxides and elemental metals. Further, the coating can be formed by physical vapor deposition (PVD) wherein a coating material physically deposits on the surface of the particles. Preferred coatings deposited by PVD include organic materials and elemental metals. Alternatively, the gaseous precursor can react in the gas phase forming small particles, for example less than about 5 nanometers in size, which then diffuse to the larger particle surface and sinter onto the surface, thus forming a coating. This method is referred to as gas-to-particle conversion (GPC). Whether such coating reactions occur by CVD, PVD or GPC is dependent on the reactor conditions, such as temperature, precursor partial pressure, water partial pressure and the concentration of particles in the gas stream. Another possible surface coating method is surface conversion of the surface of the particles by reaction with a vapor phase reactant to convert the surface of the particles to a different material than that originally contained in the particles.

In addition, a volatile coating material such as PbO, $MoO_3$ or $V_2O_5$ can be introduced into the reactor such that the coating deposits on the particles by condensation. Highly volatile metals can also be deposited by condensation. Further, the particles can be coated using other techniques. For example, a soluble precursor to both the abrasive powder and the coating can be used in the precursor solution wherein the coating precursor is involatile, (e.g. $Al(NO_3)_3$ or volatile (e.g. $Sn(OAc)_4$ where Ac is acetate). In another embodiment, a colloidal precursor and a soluble nickel precursor can be used to form a particulate colloidal coating on the nickel particle. It will be appreciated that multiple coatings can be deposited on the surface of the abrasive particles if such multiple coatings are desirable.

The present invention is directed to abrasive powder batches that are particularly useful in CMP slurries, wherein the abrasive particles constituting the powder batch have a spherical morphology, a small average particle size and a narrow particle size distribution. The particles constituting the powder batch are also substantially unagglomerated. The powders of the present invention offer numerous advantages over prior art abrasive particles that do not meet these criteria. The slurries according to the present invention are particularly useful for the chemical-mechanical planarization of integrated circuit components, including dielectric (oxide) layers, referred to as ILD (interlayer dielectrics) and metal film layers, as well as flat panel display screens.

The abrasive powder batches according to the present invention include a commercially useful quantity of abrasive particles. The abrasive particles according to the present invention preferably include non-metallic compounds which have a hardness equal to or greater than the surface being polished. Thus, the abrasive particles can be abrasive compounds such as oxides, carbides, nitrides, silicides and borides. Preferred abrasive compounds for use in CMP slurries are simple and complex metal oxides. For example, the abrasive compound can be selected from complex oxides such as YAG (yttrium aluminum garnet) and glasses such as borosilicate glasses.

Particularly preferred abrasive compounds according to present invention are binary metal oxides. Oxides such as alumina ($Al_2O_3$), silica ($SiO_2$), titania ($TiO_2$) magnesia (MgO) and hafnia ($HfO_2$) are mechanically hard and have good abrasive qualities and alumina and silica are particularly preferred for CMP slurries used in integrated circuit manufacture. Complex oxides, such as YAG ($Y_3Al_5O_{12}$) can also be useful as an abrasive compound. Abrasive compounds which can accelerate the removal of substrate material through chemical activity include ceria ($CeO_2$), zirconia ($ZrO_2$), manganese dioxide ($MnO_2$), vanadium oxide ($V_2O_5$), tin oxide ($SnO_2$), zinc oxide (ZnO), iron oxide ($Fe_2O_3/Fe_3O_4$), and chromium oxide ($Cr_2O_3$). Such materials contribute to the chemistry of the slurry to accelerate the material removal rate.

For example, a preferred abrasive compound that is chemically active is ceria. Ceria is commonly used for polishing technical glasses. Ceria is chemically active under typical slurry conditions:

$$2CeO_2 + 2e^- \rightarrow Ce_2O_3 + O^{2-}$$

Thus, ceria can accelerate the removal of silica by chemically reacting and bonding with the silica surface. Ceria abrasives are able to reduce the silica and bond with the surface being treated. Bonding between the abrasive and atoms at the surface increases the shearing force of the abrasive particle, increasing the probability that material will be removed from the surface. Further, since the abraded material remains bonded to the abrasive particle, the probability that the abraded material will be removed from the vicinity of the surface increases. As a result, an abrasive particle such as ceria will yield higher removal rates than abrasives that do not exhibit this chemical action.

Particularly preferred abrasive compounds according to the present invention are $SiO_2$, $Al_2O_3$, $CeO_2$ and $ZrO_2$.

According to one embodiment of the present invention, the abrasive powder comprises particles that have luminescent properties such that the particles can be detected under the application of light or other energy source. Thus, the abrasive particles include a luminescent or phosphorescent compound associated therewith. In a preferred embodiment, the abrasive particles include a phosphor compound. Contamination of a polished IC wafer by the abrasive particles after polishing is a serious problem for IC manufacturers. Abrasive particles having luminescent properties would enable the detection of residual particles by simply viewing the polished IC under ultraviolet or infrared light. Preferred phosphor compounds are photoluminescent or up-converter phosphors, which are capable of emitting visible light upon the application of UV or infrared radiation. The particles could then be detected using a photodetector array, such as a CCD camera. According to this embodiment, the abrasive particles preferably comprise a phosphor compound such as $Y_2O_3$ doped with an two activator ion, such as a rare-earth element (e.g. Eu). The abrasive particle can consist entirely of the phosphor compound, or, as is discussed below, may be a composite particle of an abrasive compound such as $SiO_2$ with a luminescent compound as a second phase or an abrasive particle coated with a luminescent compound, such as a phosphor.

It will be appreciated that the abrasive powder batches and the polishing slurries formed using the powder batches can include abrasive particles of one or more of the foregoing abrasive compounds. For many applications it will be desirable to include at least two such compounds in the same polishing slurry, such as $CeO_2$ and $SiO_2$, to achieve a combination of chemical and mechanical activity during polishing.

The abrasive powders according to the present invention include particles having a small average particle size. Although the preferred average size of the particles will vary according to the particular CMP application, the weight average particle size of the abrasive particles is preferably at least about 0.05 μm and more preferably is at least about 0.1 μm. Further, the weight average particle sizer is preferably not greater than about 3 μm. For most applications, the weight average particle size is more preferably not greater than about 2 μm and even more preferably is not greater than about 1 μm. According to one preferred embodiment, the weight average particle size is from about 0.1 μm to about 0.75 μm, Abrasive powder batches having such an average particle size are particularly useful in CMP slurries for planarizing integrated circuit layers.

According to a preferred embodiment of the present invention, the powder batch of abrasive particles has a narrow particle size distribution, such that the majority of particles are about the same size. Preferably, at least about 90 weight percent and more preferably at least about 95 weight percent of the particles are not larger than twice the weight average particle size. Thus, when the average particle size is about 0.5 μm, it is preferred that at least about 90 weight percent of the particles are not larger than 1 μm and it is more preferred that at least about 95 weight percent of the particles are not larger than 1 μm. Further, it is preferred that at least about 90 weight percent and more preferably at least about 95 weight percent of the particles are not larger than about 1.5 times the weight average particle size. Thus, when the average particle size is about 0.5 μm, it is preferred that at least about 90 weight percent of the particles are not larger than 0.75 μm and it is more preferred that at least about 95 weight percent of the particles are not larger than 0.75 μm.

Such a narrow size distribution of abrasive particles advantageously produces a CMP slurry with increased reliability and reproducibility. The number of defects due to large abrasive particles will be reduced. Such a CMP slurry will save manufacturers of IC devices the costs associated with low yields of acceptable devices and will reduce the time required to planarize a substrate.

It is also possible according to the present invention to provide an abrasive powder batch having a bimodal particle size distribution. That is, the powder batch can include abrasive particles having two different and distinct average particle sizes, each with a narrow size distribution as discussed above. In one embodiment, the powder batch includes two different abrasive particles, having different average particle sizes.

The abrasive particles of the present invention can be substantially single crystal particles or may be comprised of a number of crystallites. The particles can also be amorphous. The methodology of the present invention advantageously permits control over the crystallinity of the particles, and hence, permits control over the particle properties such as hardness. It is believed that particles having a high crystallinity, i.e. a large average crystallite size, increase the removal rates of material during CMP processes and thus make the process more efficient and easier to control. According to one embodiment of the present invention, the average crystallite size is preferably at least about 10 nanometers, more preferably is at least about 20 nanometers.

The abrasive particles of the present invention also have a high degree of purity and it is preferred that the particles include no more than about 0.1 atomic percent impurities and more preferably no more than about 0.01 atomic percent impurities. Impurities in abrasive particles used for CMP slurries can contaminate the layers in the integrated circuit, resulting in a defective product. Abrasive particles formed by flame combustion processes often are formed from chloride precursors and include contaminants, such as residual chlorides, that are detrimental to the integrated circuit.

The abrasive particles according to one embodiment of the present invention are preferably dense (e.g. not porous), as measured by helium pycnometry. According to this embodiment, the abrasive particles have a particle density of at least about 80% of the theoretical value, more preferably at least about 90% of the theoretical value and even more preferably at least about 95% of the theoretical value for the particular abrasive compound. In one embodiment, the particle density is at least about 99% of the theoretical value. High density particles provide many advantages over porous particles, including an increased compression strength.

However, for some applications, particularly when larger sized particles (e.g. 2–3 μm) are utilized, it may be advantageous to use hollow or porous particles to lower the particle density and enhance the stability of the particles in the slurry, particularly when the abrasive compound is a relatively high density compound. Hollow particles allow the abrasive to remain stable in the slurry for a longer period of time, leading to a more stable slurry and eliminate the need for point-of-use mixing of the abrasive particles and the other slurry components. The methodology of the present invention advantageously permits control over the morphology of the particles in this regard. Such larger, hollow particles can be formed with sufficient compressive strength to be used for CMP polishing without crushing and fragmenting.

The abrasive particles of the present invention are also substantially spherical. That is, the particles are not jagged or irregular in shape. Spherical abrasive particles are particularly advantageous in CMP slurries because they lead to a more uniform removal rate, reduce the number of scratch defects and are easier to clean from the surface of the substrate after polishing and planarization due to the reduced surface area in contact with the substrate. Although the particles are substantially spherical, the particles may become faceted and/or equiaxed as the crystallite size increases and becomes close to the average particle size. Further, the particle surface may have a wrinkled, raisin-like surface structure, although the overall particle is substantially spherical.

In addition, the abrasive powder according to the present invention has a decreased surface area as compared to prior art powders. Elimination of larger particles from the powder batches eliminates the porosity that is associated with open pores on the surface of such larger particles. Due to the elimination of the larger particles and particle agglomerates, the powder advantageously has a lower surface area. Surface area is typically measured using a BET nitrogen adsorption method which is indicative of the surface area of the powder, including the surface area of accessible surface pores on the surface of the powder. For a given particle size distribution, a lower value of a surface area per gram of powder indicates solid and non-porous particles.

In addition, the powder batches of abrasive particles according to the present invention are substantially unagglomerated, that is, they include substantially no agglomerates of particles. Hard agglomerates are physically coalesced lumps of two or more particles that behave as one larger, non-uniform particle. Agglomerates are disadvantageous in most CMP applications since they tend to create scratch defects in the surface of the substrate being polished and also produce erratic polishing rates. Preferably, no more than about 3 weight percent, more preferably no more than about 1 weight percent and most preferably no more than about 0.5 weight percent of the particles are in the form of hard agglomerates.

According to one embodiment of the present invention, the abrasive particles can be composite abrasive particles wherein the individual particles include an abrasive phase and at least one second phase dispersed throughout the abrasive phase. The second phase can advantageously be a second abrasive compound. For example, the composite abrasive articles according to the present invention can include $SiO_2/Al_2O_3$, $SiO_2/CeO_2$, $Al_2O_3/CeO_2$ or $MnO_2/Mn_3O_4$. Such composite particles can advantageously provide one particle having the desired mechanical and chemical polishing effects. The ability to incorporate a second phase in the particles also permits accurate control over the particle properties, such as hardness, such that one material can be selectively removed in the presence of another during polishing. Also, as is discussed above, the second phase can be a luminescent compound that is adapted to enable the detection of residual particles after polishing. The ability to incorporate a second phase in the particles also permits accurate control over the particle properties, such as hardness, such that one material can be selectively removed in the presence of another during polishing.

Depending upon the application of the abrasive powder, the composite particles preferably include at least about 1 weight percent of the second phase, more preferably from about 2 to about 50 weight percent of the second phase and even more preferably from about 5 to 35 weight percent of the second phase.

According to another embodiment of the present invention, the abrasive particles can be coated abrasive particles that include a particulate coating (FIG. 47d) or non-particulate (film) coating (FIG. 47a) on the outer surface of the particles. The coating for abrasive particles is a preferably non-metallic coating, such as a metal oxide or an organic compound. Preferably, the coating is very thin and has an average thickness of not greater than about 200 nanometers, more preferably not greater than about 100 nanometers, and even more preferably not greater than about 50 nanometers. While the coating is thin, the particulate or non-particulate coating should substantially encapsulate the entire particle. Accordingly, the coating preferably has a thickness of at least about 5 nanometers. The coating can be, for example, silica, alumina or ceria. In one embodiment of the present invention, the abrasive particle comprises $SiO_2$ with an $Al_2O_3$ coating encapsulating the $SiO_2$ core or $SiO_2$ particles with a $CeO_2$ coating. Such coatings can be produced in a manner discussed hereinabove. Such coatings can advantageously provide accurate control over the particle density, for example when a high density coating is placed on a low density particle, and can also provide control over the chemical and mechanical action of the particles during polishing.

The abrasive particles can also include a coating of an organic compound such as PMMA (polymethylmethacrylate), polystyrene or the like. The organic coating preferably has a thickness of not greater than about 50 nanometers and is substantially dense and continuous about the particle. The organic coatings can advantageously prevent corrosion of the particles and also can improve the dispersion characteristics of the particles in the slurry. For example, a coating can influence the redox characteristics of the particles. Such coatings can also extend the shelf-life of the slurries. Presently available slurries have a limited shelf-life primarily due to the high surface area of the particles, which exposes the surfaces to the slurry components, causing the surfaces to become hydrophobic.

The coating can also be comprised of one or more monolayer coatings, such as from about 1 to 3 monolayer coatings. A monolayer coating is formed by the reaction of an organic or an inorganic molecule with the surface of the particles to form a coating layer that is essentially one molecular layer thick. In particular, the formation of a monolayer coating by reaction of the surface of the abrasive particle with a functionalized organo silane such as halo- or amino-silanes, for example hexamethyidisilazane or trimethylsilylchloride, can be used to modify the hydrophobicity and hydrophilicity of the powders. Such coatings can permit greater control over the dispersion characteristics of the powder in a slurry.

The monolayer coatings may also be applied to abrasive powders that have already been coated with an organic or inorganic coating thus providing better control over the corrosion characteristics as well as dispersibility of the particles.

In addition to the foregoing, the coating can be a consumable coating wherein the coating is chemically active and is consumed during polishing such that the polishing action substantially stops when the coating is consumed. Such a coated abrasive particle could be used to remove a pre-selected amount or thickness of material, effectively behaving as an etch-stop mechanism.

The abrasive powders according to the present invention, including composite powders and coated powders, are useful in a number of applications and can be used to fabricate a number of intermediate products, such as CMP slurries and other polishing slurries or pastes. Such intermediate products are included within the scope of the present invention.

As is discussed above, the abrasive powders of the present invention can be used in CMP slurry compositions. A typical CMP slurry consists of abrasive particles, which are usually prepared by gas combustion techniques (fumed) or are prepared by solution precipitation methods. The concentration of the abrasive particles in a CMP slurry is typically from about 0.5 to 60 weight percent, preferably from about 1 to about 20 weight percent, such as from about 7 to 15 weight percent. Generally, higher concentrations of abrasive particles will lead to higher polish rates.

Water, such as deionized or distilled water, is typically a major ingredient in CMP slurries and is the liquid in which the abrasive particles are dispersed and other components are dissolved. The pH of the aqueous based slurry is typically adjusted with acids or bases, often utilizing a buffer system such as acetic acid/sodium acetate which allows the slurry to resist changes in the pH. The pH can be adjusted away from the isoelectric point of the abrasive compound to help aid in particle suspension.

Another class of chemical ingredient typically added to CMP slurries are surfactants which also aid in the stability of the slurry by helping to prevent particle agglomeration, flocculation and settling. Dispersive agents such as these are typically incorporated in the slurry in an amount of up to about 20 weight percent. Agglomeration, precipitation, flocculation and settling of the abrasive particles will drastically effect the performance and shelf life of the slurry. Surfactants can include the alkali sulfonates, sulfates, lignosulfonates, carboxylates and phosphates.

Another class of chemical ingredient typically added to metal CMP slurries are oxidizing agents. The oxidizing agents are added to the slurry to oxidize the metal surface to the metal oxide which is then mechanically abraded. Examples of oxidizing agents include, but are not limited to, oxidizing metal salts, chlorates, perchlorates, chlorites, iodates, nitrates, persulfates, peroxides, ozinated water and oxygenated water. Oxidizing agents are typically incorporated in the slurry at concentrations of up to about 20 weight percent.

Further, the CMP slurries, particularly metal CMP slurries, can include complexing agents. Complexing agents, such as ammonia, can be beneficial in aiding in the dissolution of the removed metal species into the slurry.

CMP slurries are primarily utilized to polish and planarize different layers during the production of integrated circuits. Typically, from about 3 to 10 CMP steps are required to manufacture an integrated circuit. The surface being treated can include a metal oxide, such as an interlayer dielectric, a metal film and/or an organic material, such as a polymer film. Common metal films and plugs which are planarized during integrated circuit manufacture include tungsten, copper, aluminum and tantalum. Common metal oxides which are planarized during integrated circuit manufacture include silica, interlayer dielectrics, "low K" dielectric materials and other insulative materials.

Depending upon the surface being polished, the slurry can include abrasive particles of one or more of the abrasive compounds disclosed herein. For many applications, it will be desirable to include at least two different compounds, such as $SiO_2$ and $CeO_2$, to achieve a particular combination of mechanical and chemical action. Generally, the slurry is applied to a pad which is then rotated and placed against the integrated circuit surface.

Figure 50:
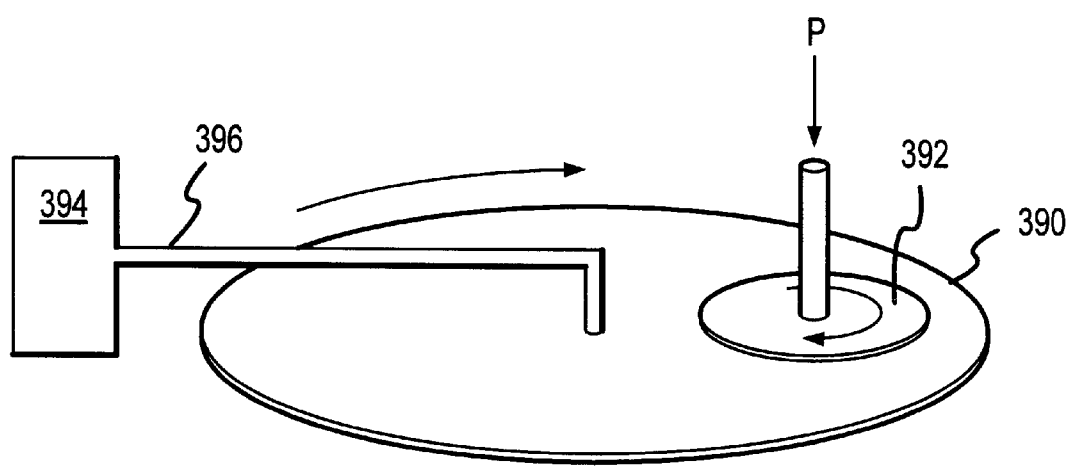
FIG. 50 illustrates a device for planarizing a substrate according to an embodiment of the present invention.

A device for planarizing an integrated circuit is illustrated in FIG. 50. The device includes a polishing pad 390 (or platen) which is adapted to be rotated upon its axis. The polishing pad 390 is typically fabricated from a material such as polyurethane. The integrated circuit wafer 392 is brought into contact with the polishing pad 390 with applied pressure P, typically from about 3 to 7 psi. In the embodiment illustrated in FIG. 50, both polishing pad 390 and the wafer 392 are slowly rotated simultaneously, typically in the same direction.

A CMP slurry is housed in a reservoir 394. The reservoir 394 provides slurry via slurry conduits 396 to the polishing pad. Slurry is provided to the polishing pad 390 in a controlled fashion so that the polishing rate of the wafer 392 is controlled.

Figure 51:
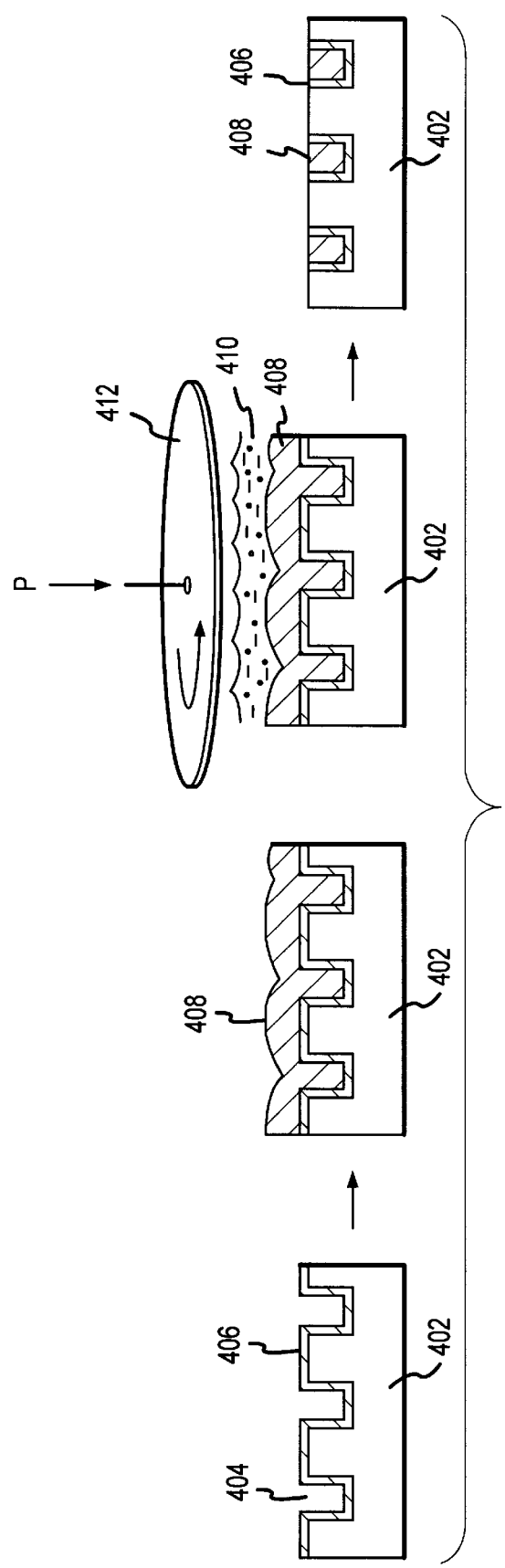
FIG. 51 illustrates the various steps in a chemical mechanical planarization process according to an embodiment of the present invention.

FIG. 51 illustrates the various stages in the formation of the integrated circuit layer, including a chemical mechanical planarization step, wherein the integrated circuit layer includes a metal plug, such as a tungsten plug. The integrated circuit layer includes a silicon substrate 402 including channels 404 which are coated with a dielectric material 406. A coating process is used to deposit a further metal layer 408 over the dielectric layer 406. The metal layer 408 is nonuniform and produces a non-planarized surface.

During the chemical mechanical planarization step, a CMP slurry 410 is placed between the metal layer 408 and a polishing pad 412. As the polishing pad 412 rotates, it abrades the slurry 410, including the abrasive particles, against the metal layer 408 until the metal layer 408 and the upper surface of the dielectric layer 406 are removed from the substrate creating a metal plug 408.

Figure 52:
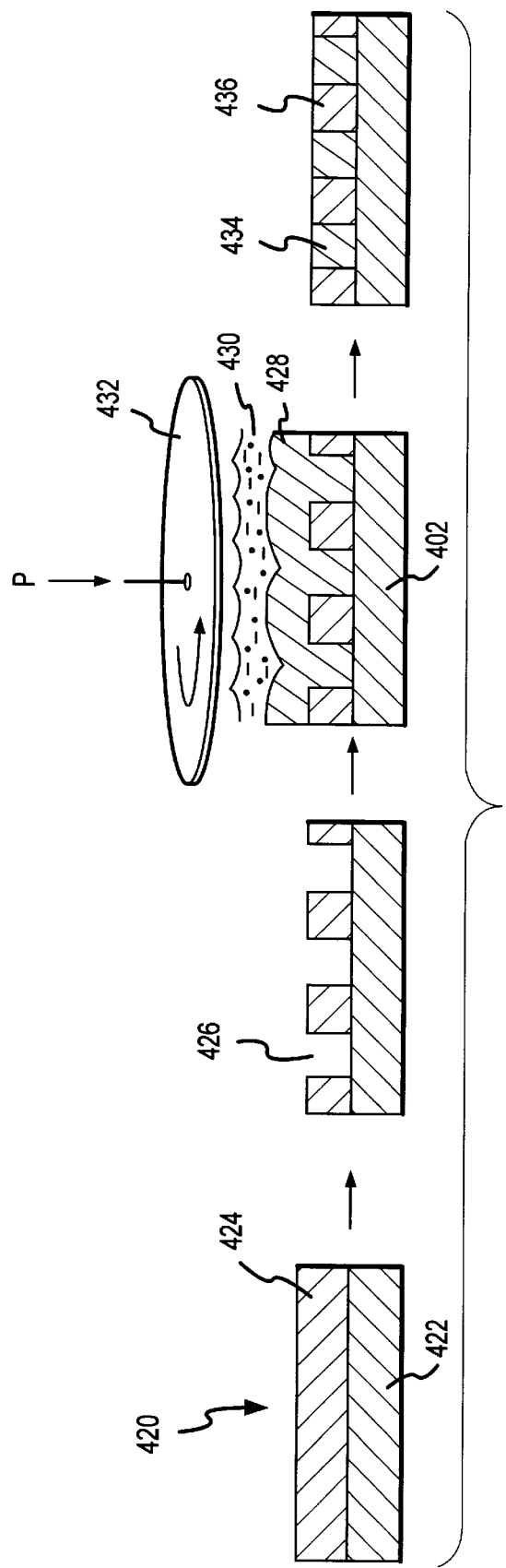
FIG. 52 illustrates a damascene process according to an embodiment of the present invention.

A damascene process is illustrated by FIG. 52. In the damascene process, an insulating material is deposited on the wafer, which is then patterned and etched to form voids. A metal, such as copper, is then deposited from a chemical vapor to fill the voids and cap the wafer. The excess metal is then removed to create a smooth surface inlaid with conductive vias and traces. Referring to FIG. 52, a wafer 420 includes a silicon layer 422 overlaid with a dielectric material 424. The dielectric material 424 is then pattern etched to form voids 426. Thereafter, a metal layer 428 is deposited over the dielectric layer 424. During the chemical mechanical planarization step, a CMP slurry 430 is placed between the metal layer 428 and a polishing pad 432 and the polishing pad 432 rotates to abrade the slurry 430, including the abrasive particles, against the metal layer 428 until the metal layer 428 is removed from the substrate. The resulting structure consists of interconnect metal 434 and interlayer dielectric 436.

The CMP slurries of the present invention provide numerous advantages during this process. The use of the slurries comprising abrasive particles having the properties described herein will result in highly reliable polishing operations. Number of scratch defects, the RMS roughness and surface contamination will be significantly reduced. Further, the abrasive particles of the present invention will permit the use of a lower pressure on the polishing pad against the integrated circuit surface.

Figure 53:
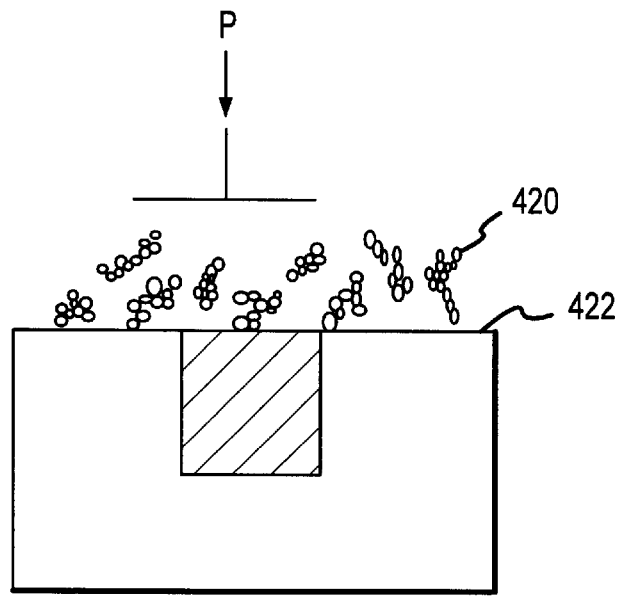
FIG. 53 illustrates a chemical mechanical planarization process using a conventional CMP slurry.
Figure 54:
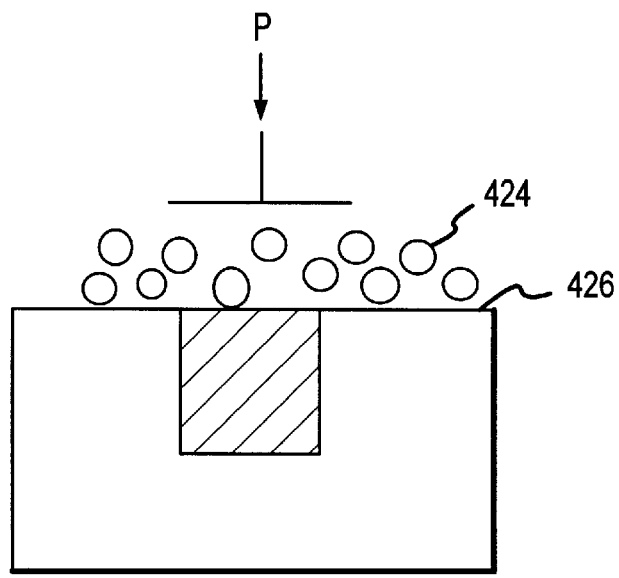
FIG. 54 illustrates a chemical mechanical planarization process according to the present invention.

The foregoing advantages of the present invention can be understood with reference to FIGS. 53 and 54. FIG. 53 illustrates the polishing of a surface feature with a conventional CMP slurry. The CMP slurry includes particles 420 which are abraded against a surface feature 422 under an applied pressure P. The particles 420 are agglomerated and non-spherical, and result in a number of scratches on the surface 422 of the feature. Scratches and other surface defects produced by such particles directly result in a defective product.

A similar process utilizing the slurry according to the present invention is illustrated in FIG. 54. The particles 424 are spherical and do not include any sharp or jagged edges. Therefore, when the particles 424 are abraded against the surface 426 the resulting surface 426 has a minimal number of scratches or other defects that can produce a defective integrated circuit product.

After planarizing of the integrated circuit layer using the CMP slurry, the slurry must be cleaned from the surface before further processing of the integrated circuit. Small agglomerated particles are difficult to completely remove from the surface of the integrated circuit. Spherical particles are easier to remove since such particles flow more easily along the surface of the integrated circuit layer. For some applications, the abrasive particles are embedded into the polishing pad rather than placed into a slurry.

EXAMPLES

Cerium oxide ($CeO_2$) is a preferred abrasive compound according to an embodiment of the present invention. Accordingly, the effect of different process variables on the production of cerium oxide particles was evaluated. For each of the following examples, precursor solutions were atomized using an ultrasonic transducer. For each example, an impactor was used to narrow the droplet size distribution in the aerosol by removing droplets from the aerosol. The cut-point for the impactor was about 10 $\mu$m. Air was used as the gas to carry the aerosol through the heated reaction zone. The precursor concentrations are given as a weight percent of the oxide in solution.

A. Effect of Precursor Type

Examples 1–3, summarized in Table 1, illustrate the effect of the type of precursor on the formation of the abrasive particles.

TABLE I

Effect of Precursor Type

| Example | Precursor Type | Precursor Concentration | Other Additives | Transducer Frequency | Reactor Temperature |
|---|---|---|---|---|---|
| 1 | CAN | 5 w/o | — | 1.6 MHz | 1000° C. |
| 2 | CN | 5 w/o | — | 1.6 MHz | 1000° C. |
| 3 | CC | 5 w/o | — | 1.6 MHz | 1000° C. |

Referring to Table I, CAN stands for cerium (IV) ammonium nitrate which has a chemical formula of $(NH_4)_2Ce(NO)_6$, CN stands for cerium nitrate hexahydrate which has a chemical formula of $Ce(NO)_3 \cdot 6H_2O$ and CC stands for cerium chloride which has a chemical composition of $CeCl_3 \cdot 7H_2O$. Each of these precursors was formed into a solution including 5 weight percent of the oxide and an aerosol was created from the solution using an ultrasonic transducer. The aerosol was carried through a tube furnace heated to 1000° C.

Figure 55:
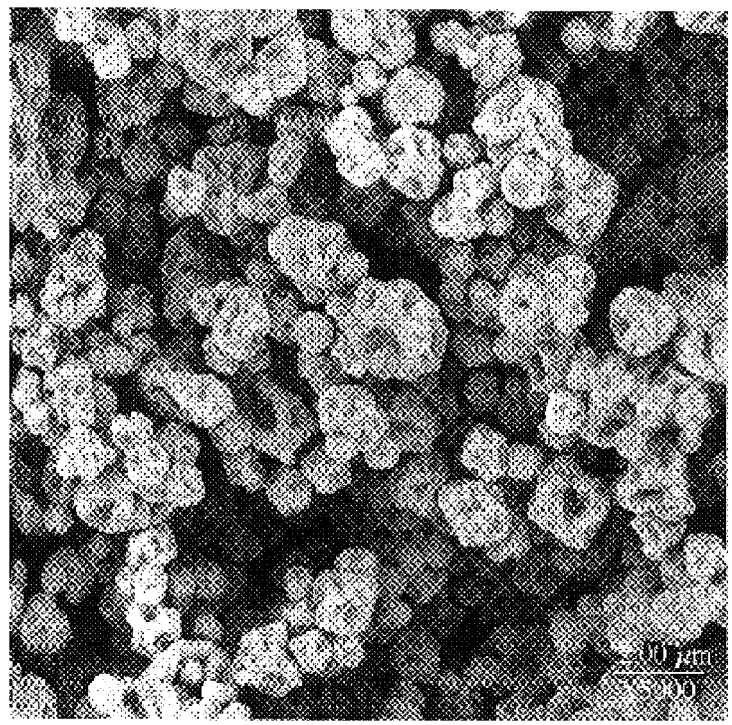
FIG. 55 illustrates a photomicrograph of CMP abrasive particles according to an embodiment of the present invention.
Figure 56:
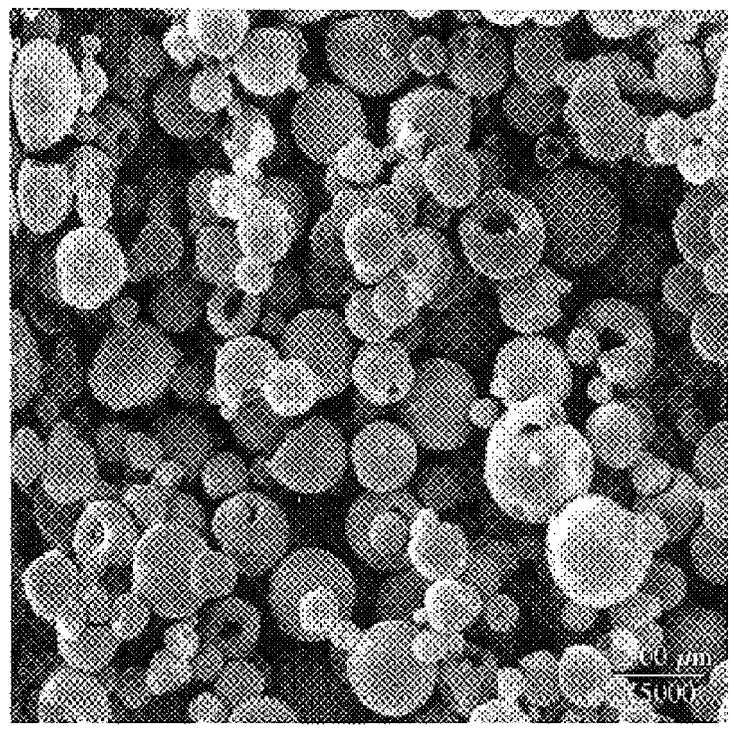
FIG. 56 illustrates a photomicrograph of CMP abrasive particles according to an embodiment of the present invention.
Figure 57:
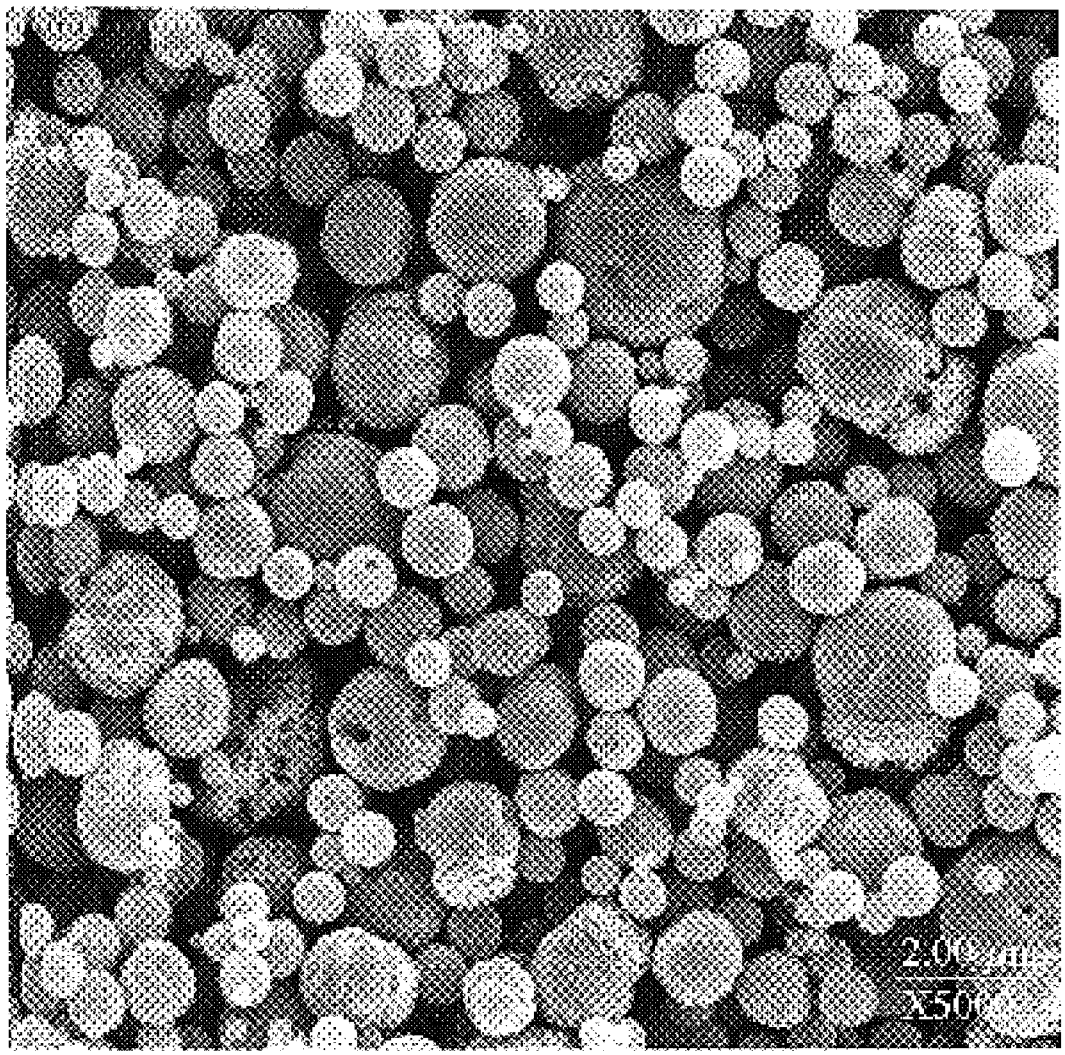
FIG. 57 illustrates a photomicrograph of CMP abrasive particles according to an embodiment of the present invention.

The particles produced from the CAN precursor are illustrated in FIG. 55. The particles have a wrinkled raisin-like surface on hollow particles. FIG. 56 illustrates the particles produced from the CN precursor. The particles produced from the CN precursor had a smoother surface, however, there are many rigid walled hollow particles. This morphology is undesirable for CMP applications because of the likelihood for disintegration of the particles during use resulting in uncontrolled polishing. FIG. 57 illustrates the particles produced from the CC precursor. The particles had a desirable spherical morphology. Although there is still some retention of hollow particles in the powder batch, the number of hollow particles is reduced as compared to Example 2.

In summary, the CAN and CC are the preferable precursors since the number of hollow particles is minimal. The CAN precursor is more preferable primarily because decomposition of the CC forms HCl, which can cause significant corrosion of the process equipment.

B. Effect of Precursor Concentration

Examples 1 and 4 (Table II) illustrate the effect of precursor concentration on the properties of the final particles.

TABLE II

Effect of Precursor Concentration

| Example | Precursor Type | Precursor Concentration | Other Additives | Transducer Frequency | Reactor Temperature |
|---|---|---|---|---|---|
| 1 | CAN | 5 w/o | — | 1.6 MHZ | 1000° C. |
| 4 | CAN | 1 w/o | — | 1.6 MHZ | 1000° C. |

Figure 58:
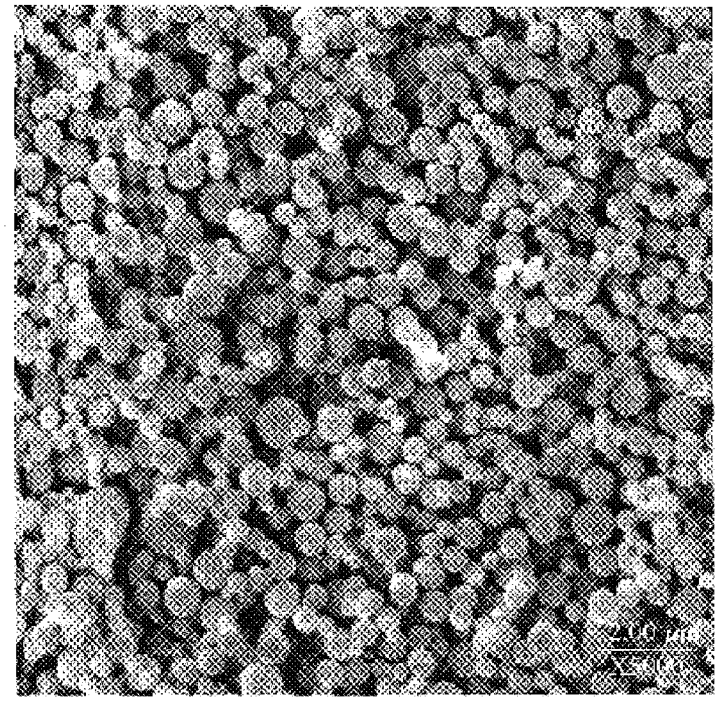
FIG. 58 illustrates a photomicrograph of CMP abrasive particles according to an embodiment of the present invention.
Figure 59:
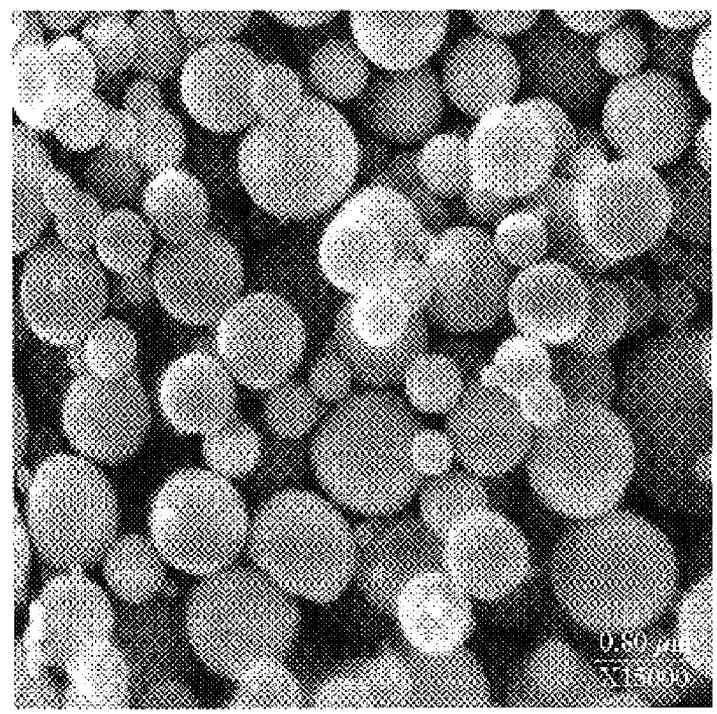
FIG. 59 illustrates a photomicrograph of CMP abrasive particles according to an embodiment of the present invention.

The powder produced according to Example 1 is illustrated in FIG. 55. The average particle size is about 1 $\mu$m and the particles have a wrinkled surface. FIGS. 58 and 59 illustrate the powder produced according to Example 4, from a 1 weight percent precursor solution. The particle size decreased to about 0.7 $\mu$m and the particles had a spherical morphology with smooth outer surfaces. Very few of the particles appeared to be hollow. Thus, decreasing the concentration of the precursor solution reduces the average particle size of the abrasive particles, and the particles have a substantially spherical morphology. The powder also appears to have a narrower size distribution. Such a powder is well-suited for use in CMP slurries according to the present invention C. Frequency of Atomization The preferred technique for generating an aerosol according to the present invention is by the use of an ultrasonic transducer. The effect of the transducer frequency on the properties of abrasive particles was investigated, as summarized in Table III.

TABLE III

Effect of Atomization Frequency

| Example | Precursor Type | Precursor Concentration | Transducer Frequency | Reactor Temperature |
|---|---|---|---|---|
| 1 | CAN | 5 w/o | 1.6 MHZ | 1000° C. |
| 5 | CAN | 5 w/o | 2.4 MHZ | 1000° C. |

Figure 60:
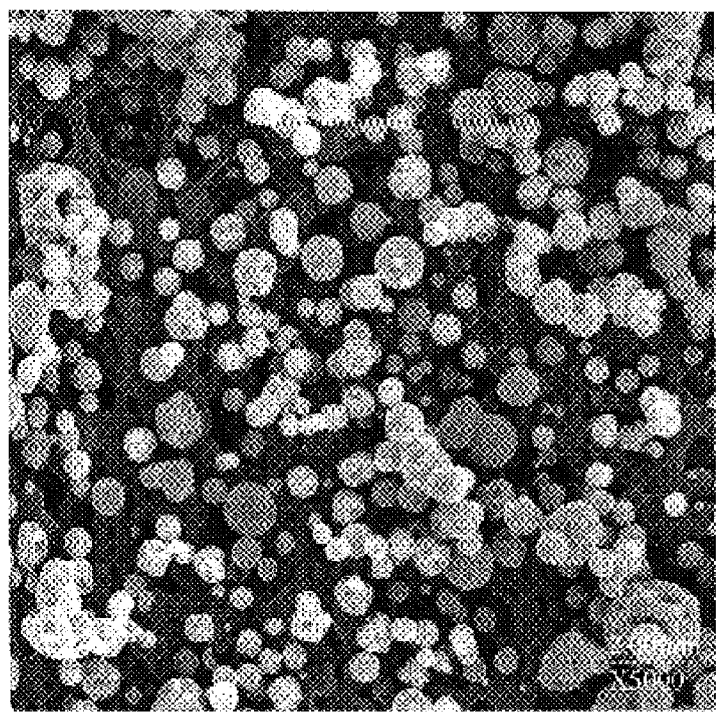
FIG. 60 illustrates a photomicrograph of CMP abrasive particles according to an embodiment of the present invention.

The powder produced according to Example 1 is illustrated in FIG. 55 and the powder produced according to Example 5 is illustrated in FIG. 60. When the frequency was increased from 1.6 MHZ to 2.4 MHZ, the average size of the abrasive particles decreased from about 1 $\mu$m to about 0.7 $\mu$m. Although the average particle size decreased, the particles retained a wrinkled morphology. This result suggests that the surface morphology of the particles is primarily controlled by the precursor type and concentration.

D. Effect of Reactor Temperature

An experiment was conducted to determine the effect of varying the reactor temperature on the formation of the abrasive particles. The results are illustrated by Examples 6 and 7 (Table IV).

TABLE IV

Effect of Reactor Temperature

| Example | Precursor Type | Precursor Concentration | Transducer Frequency | Reactor Temperature |
|---|---|---|---|---|
| 6 | CAN | 3 w/o | 2.4 MHz | 1000° C. |
| 7 | CAN | 3 w/o | 2.4 MHz | 600° C. |

Figure 61:
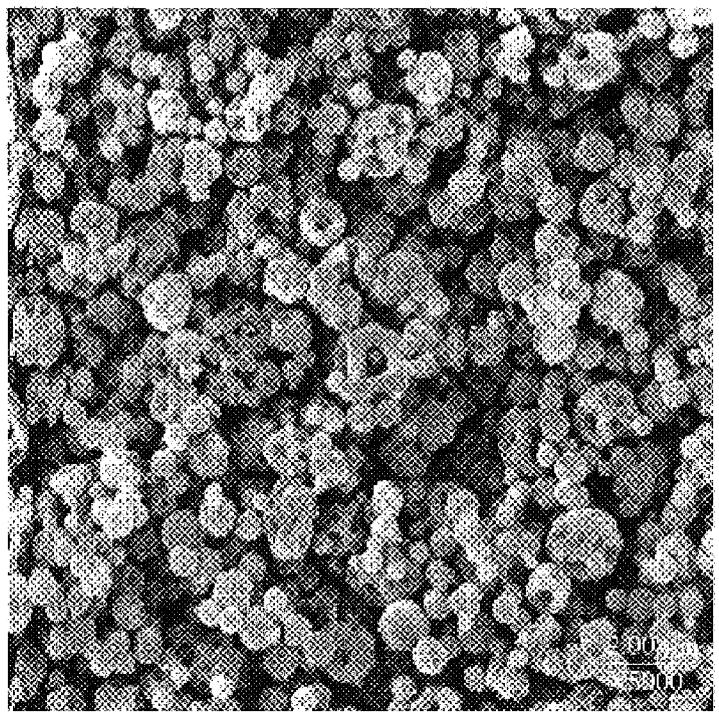
FIG. 61 illustrates a photomicrograph of CMP abrasive particles according to an embodiment of the present invention.
Figure 62:
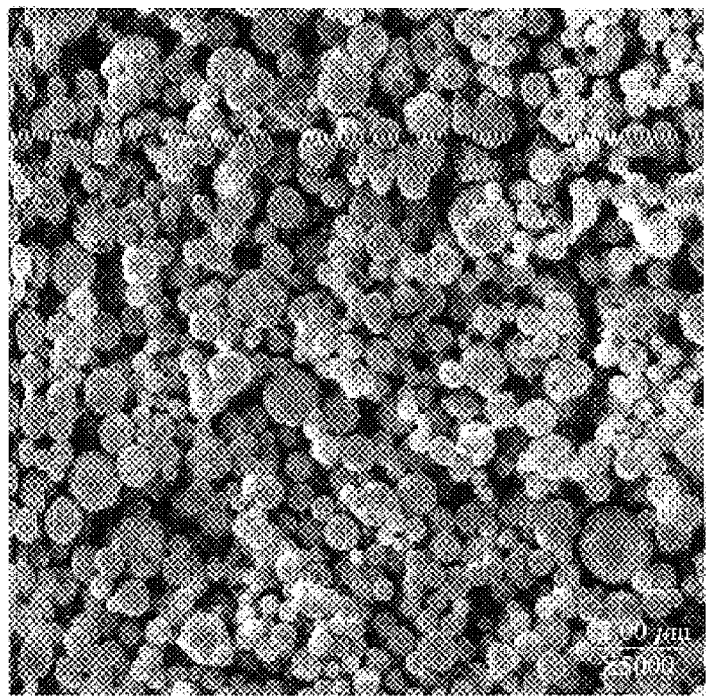
FIG. 62 illustrates a photomicrograph of CMP abrasive particles according to an embodiment of the present invention.

FIG. 61 (Example 6) and FIG. 62 (Example 7) illustrate the effect that the reactor temperature has on the morphology and crystallinity of the abrasive particles. At 600° C., the particles had a similar average particle size as the particles produced at 1000° C., but had a smoother and more spherical morphology. Lowering the reaction temperature decreases the amount of surface wrinkles and produces smoother and more spherical particles. However, some particles were hollow, as evidenced by presence of fragments. Also, the relative average crystallite size decreased from about 25 nanometers to about 11 nanometers when the temperature was decreased from 1000° C. to 600° C.

E. Effect of Additives to Precursor Solution

The effect of different additives to the precursor solution was also investigated. These Examples are illustrated in Table V.

TABLE V

Effect of Additives to the Precursor Solution

| Example | Precursor Type | Precursor Concentration | Other Additives | Transducer Frequency | Reactor Temperature |
|---|---|---|---|---|---|
| 1 | CAN | 5 w/o | — | 1.6 MHz | 1000° C. |
| 8 | CAN | 5 w/o | 1 eq. urea | 1.6 MHz | 1000° C. |
| 2 | CN | 5 w/o | — | 1.6 MHz | 1000° C. |
| 9 | CN | 5 w/o | 1 eq. urea | 1.6 MHz | 1000° C. |
| 10 | CAN | 3 w/o | 3 eq. glucose + 3 eq. urea | 2.4 MHz | 1000° C. |
| 6 | CAN | 3 w/o | — | 2.4 MHz | 1000° C. |
| 11 | CAN | 3 w/o | 3 eq. glucose | 2.4 MHz | 1000° C. |
| 12 | CAN | 3 w/o | 3 eq. urea | 2.4 MHz | 1000° C. |

Urea and glucose were added to the precursor solution in an attempt to further densify the particles. It is believed that the additives can aid in the densification of the particles by at least two mechanisms. First, the additives may act as a fuel which causes the particles to burst or explode upon ignition creating debris and fragments which can further sinter into smaller particles with increased density. Ideally, the fuel would cause the dry particle to explode before densification or cause the initial droplets to explode into smaller droplets. In the second mechanism, the additive acts as a chemical binder to link the precursor molecules together, diminishing the formation of hollow particles.

Figure 63:
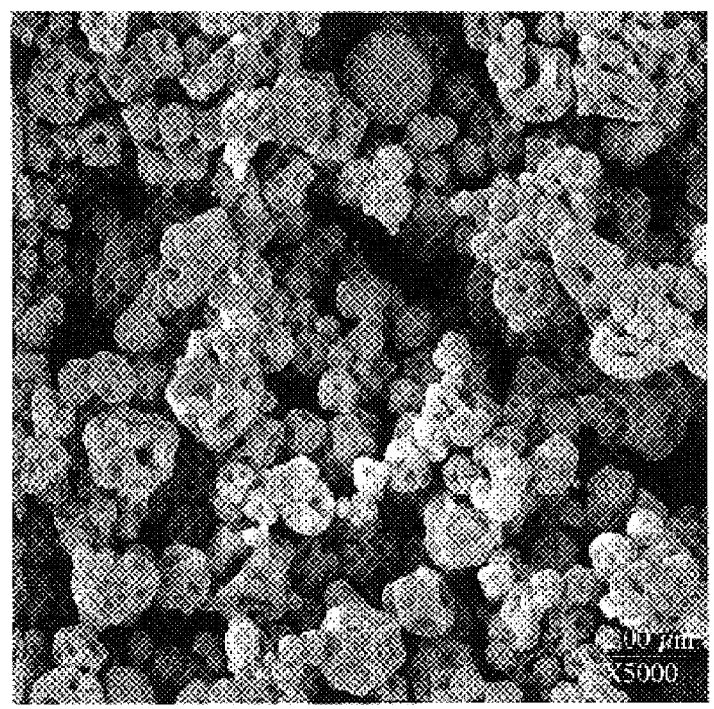
FIG. 63 illustrates a photomicrograph of CMP abrasive particles according to an embodiment of the present invention.
Figure 64:
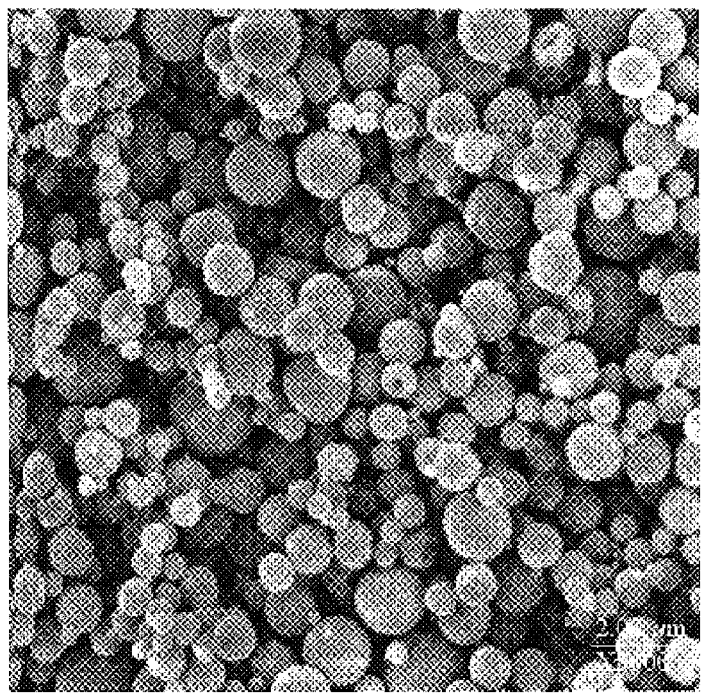
FIG. 64 illustrates a photomicrograph of CMP abrasive particles according to an embodiment of the present invention.

FIGS. 63 and 64 illustrate Examples 8 and 9, which demonstrate the effect of the addition of urea to CAN and CN precursor solutions. The effect on the particles made from CAN (FIG. 63) were minimal. The particles have a wrinkled surface and the size decreased only slightly. The effect was more pronounced for the particles produced from CN, illustrated in FIG. 64. The addition of urea to the precursor resulted in particles having a reduced particle size and fewer particles appeared to be hollow, as compared to Example 2 (FIG. 56).

Figure 65:
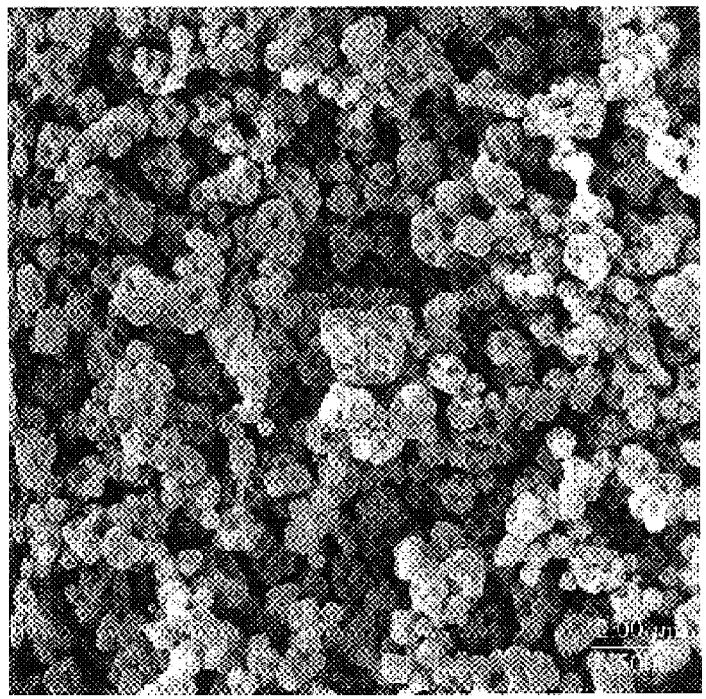
FIG. 65 illustrates a photomicrograph of CMP abrasive particles according to an embodiment of the present invention.
Figure 66:
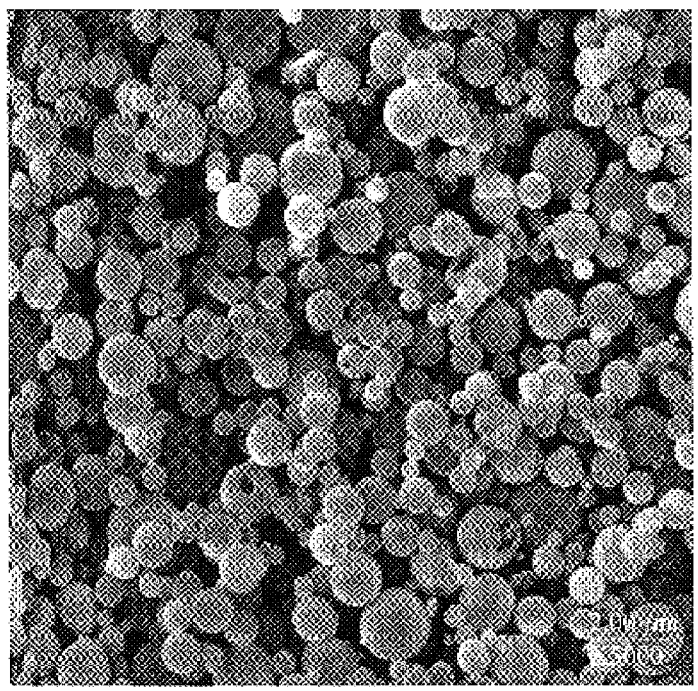
FIG. 66 illustrates a photomicrograph of CMP abrasive particles according to an embodiment of the present invention.
Figure 67:
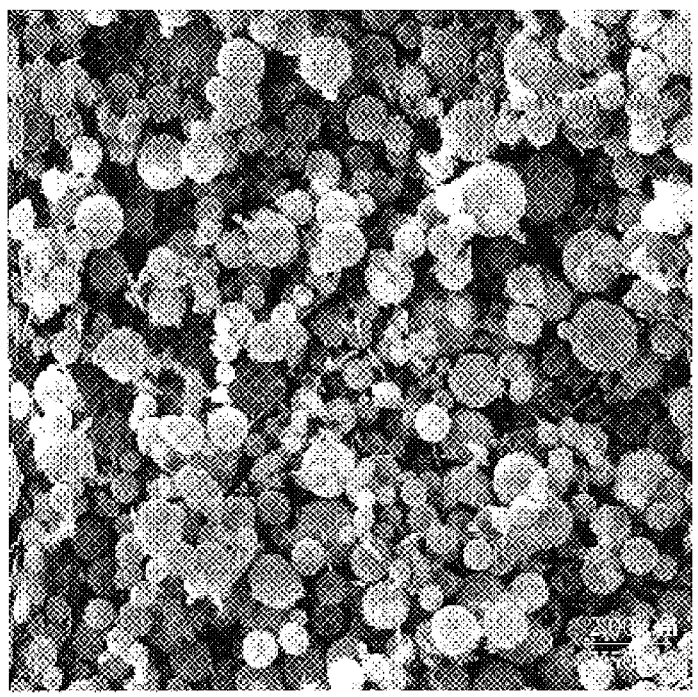
FIG. 67 illustrates a photomicrograph of CMP abrasive particles according to an embodiment of the present invention.

Examples 10, 6, 11 and 12 illustrate the effect of higher concentrations of the additives urea and glucose when the precursor solution is atomized at 2.4 MHz. FIG. 59 (Example 6) illustrates the powder without any additives, which has a wrinkled surface morphology. The addition of urea (Example 12, FIG. 65) does not alter the surface morphology, but the average particle size appears to be slightly smaller. The addition of glucose (Example 11, FIG. 66) produced many fragments and debris. The addition of both urea and glucose together, Example 10 (FIG. 67), produced large spherical particles with a high degree of hollowness. Thus, glucose does not appear to be an effective additive and the use of both additives together appears to be counter productive.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A method for the production of abrasive particles adapted for use in a CMP slurry, comprising the steps of:
    a) generating an aerosol of droplets from a liquid wherein said liquid comprises an abrasive compound precursor and wherein said droplets have a size distribution such that at least about 80 weight percent of said droplets have a size of not greater than about 5 μm;
    b) moving said droplets in a carrier gas; and
    c) heating said droplets to remove liquid therefrom and form abrasive particles of said abrasive compound.

2. A method as recited in claim 1, wherein said carrier gas comprises air.

3. A method as recited in claim 1, wherein said heating step comprises passing said droplets through a heating zone having a temperature of from about 400° C. to about 1200° C.

4. A method as recited in claim 1, wherein said abrasive particles have a particle density of at least about 90 percent of the theoretical density of said abrasive compound.

5. A method as recited in claim 1, wherein said droplets have a droplet size distribution such that no greater than about 20 weight percent of the droplets in said aerosol are larger than about twice the weight average droplet size.

6. A method as recited in claim 1, further comprising the step of removing a portion of droplets from said aerosol, wherein said removed droplets have an aerodynamic diameter greater than a preselected maximum diameter.

7. A method as recited in claim 1, wherein said liquid is an aqueous-based solution comprising an abrasive compound precursor selected from the group consisting of nitrates, hydroxides, chlorides, sulfates and oxalates.

8. A method as recited in claim 1, wherein said liquid comprises a colloidal suspension.

9. A method as recited in claim 1, further comprising the step of coating an outer surface of said abrasive particles.

10. A method as recited in claim 1, further comprising the step of coating an outer surface of said abrasive particles with a metal oxide coating.

11. A method as recited in claim 1, wherein said abrasive compound is selected from the group consisting of $Al_2O_3$, $SiO_2$, $CeO_2$ and $ZrO_2$.

12. A method as recited in claim 1, wherein said step of generating an aerosol comprises the step of using a plurality of ultrasonic transducers.

13. A method as recited in claim 1, wherein said step of generating an aerosol comprises the step of using a plurality of ultrasonic transducers having a frequency of at least about 1.7 MHz.

14. A method as recited in claim 1, wherein said liquid further comprises a densification aid.

15. A method as recited in claim 1, wherein said liquid further comprises urea.

16. A method for the production of abrasive particles adapted for use in a CMP slurry, comprising the steps of:
   a) generating an aerosol of droplets from a liquid wherein said liquid comprises a silica precursor and wherein said droplets have a size distribution such that at least about 80 weight percent of said droplets have a size of not greater than about 5 µm;
   b) moving said droplets in a carrier gas; and
   c) heating said droplets to remove liquid therefrom and form abrasive particles comprising silica.

17. A method as recited in claim 16, wherein said carrier gas comprises air.

18. A method as recited in claim 16, wherein said heating step comprises passing said droplets through a heating zone having a temperature of from about 400° C. to about 1200° C.

19. A method as recited in claim 16, wherein said droplets have a size distribution such that no greater than about 20 weight percent of the droplets in said aerosol are larger than about twice the weight average droplet size.

20. A method as recited in claim 16, further comprising the step of removing a portion of droplets from said aerosol, wherein said removed droplets have an aerodynamic diameter greater than a preselected maximum diameter.

21. A method as recited in claim 16, wherein said liquid comprises a colloidal suspension.

22. A method as recited in claim 16, further comprising the step of coating an outer surface of said abrasive particles.

23. A method as recited in claim 16, wherein said step of generating an aerosol comprises the step of using a plurality of ultrasonic transducers having a frequency of at least about 1.7 MHz.

24. A method for the production of abrasive particles adapted for use in a CMP slurry, comprising the steps of:
   a) generating an aerosol of droplets from a liquid wherein said liquid comprises an alumina precursor and wherein said droplets have a size distribution such that at least about 80 weight percent of said droplets have a size of less than about 5 µm;
   b) moving said droplets in a carrier gas; and
   c) heating said droplets to remove liquid therefrom and form abrasive particles comprising alumina.

25. A method as recited in claim 24, wherein said carrier gas comprises air.

26. A method as recited in claim 24, wherein said heating step comprises passing said droplets through a heating zone having a temperature of from about 400° C. to about 1200° C.

27. A method as recited in claim 24, wherein said droplets have a size distribution such that no greater than about 20 weight percent of the droplets in said aerosol are larger than about twice the weight average droplet size.

28. A method as recited in claim 24, further comprising the step of removing a portion of droplets from said aerosol, wherein said removed droplets have an aerodynamic diameter greater than a preselected maximum diameter.

29. A method as recited in claim 24, wherein said alumina precursor comprises aluminum nitrate.

30. A method as recited in claim 24, wherein said liquid comprises a colloidal suspension.

31. A method as recited in claim 24, further comprising the step of coating an outer surface of said abrasive particles.

32. A method as recited in claim 24, wherein said step of generating an aerosol comprises the step of using a plurality of ultrasonic transducers having a frequency of at least about 1.7 MHz.

33. A method for the production of abrasive compound particles adapted for use in a CMP slurry, comprising the steps of:
   a) generating an aerosol of droplets from a liquid wherein said liquid comprises a ceria precursor and wherein said droplets have a size distribution such that at least about 80 weight percent of said droplets have a size of less than about 5 µm;
   b) moving said droplets in a carrier gas; and
   c) heating said droplets to remove liquid therefrom and form abrasive particles comprising ceria.

34. A method as recited in claim 33, wherein said carrier gas comprises air.

35. A method as recited in claim 33, wherein said heating step comprises passing said droplets through a heating zone having a temperature of from about 600° C. to about 1100° C.

36. A method as recited in claim 33, wherein said droplets have a size distribution such that no greater than about 20 weight percent of the droplets in said aerosol are larger than about twice the weight average droplet size.

37. A method as recited in claim 33, further comprising the step of removing a portion of droplets from said aerosol, wherein said removed droplets having aerodynamic diameter greater than a preselected maximum diameter.

38. A method as recited in claim 33, wherein said liquid is an aqueous-based solution comprising a ceria precursor selected from the group consisting of cerium ammonium nitrate, cerium nitrate and cerium chloride.

39. A method as recited in claim 33, wherein said liquid comprises a colloidal suspension.

40. A method as recited in claim 33, further comprising the step of coating an outer surface of said abrasive particles.

41. A method as recited in claim 33, wherein said step of generating an aerosol comprises the step of using ultrasonic transducers.

42. A method for the production of coated abrasive particles, comprising the steps of:
   a) forming a liquid solution comprising an abrasive compound precursor;
   b) generating an aerosol of droplets from said liquid solution;
   c) moving said droplets in a carrier gas;
   d) heating said droplets to remove liquid therefrom and form abrasive particles comprising said abrasive compound; and
   e) coating an outer surface of said abrasive particles.

43. A method as recited in claim 42, wherein said abrasive compound is selected from the group consisting of $Al_2O_3$, $SiO_2$, $CeO_2$ and $ZrO_2$.

44. A method as recited in claim 42, wherein said coating comprises a compound selected from $SiO_2$ and $Al_2O_3$.

45. A method as recited in claim 42, wherein said coating comprises an organic compound.

46. A method as recited in claim 42, wherein said coating step comprises contacting said abrasive particles with a volatile coating precursor.

47. A method as recited in claim 42, wherein said coating step comprises contacting said metal particles with a volatile coating precursor selected from the group consisting of metal chlorides, metal acetates and metal alkoxides.

48. A method as recited in claim 42, wherein said abrasive compound precursor is a silica precursor and wherein said coating comprises alumina.

49. A method as recited in claim 42, wherein said coating is adapted to be consumed during use of said slurry in a polishing process.

* * * * *

UNITED STATES PATENT AND TRADEMARK OFFICE
CERTIFICATE OF CORRECTION

PATENT NO. : 6,730,245 B2
DATED : May 4, 2004
INVENTOR(S) : Hampden-Smith et al.

Page 1 of 1

It is certified that error appears in the above-identified patent and that said Letters Patent is hereby corrected as shown below:

Column 1,
Line 13, insert the following paragraph:
-- STATEMENT REGARDING FEDERALLY-SPONSORED RESEARCH/ DEVELOPMENT
This invention was made with Government support under contracts N00014-95-C-0278 and N00014-96-C-0395 awarded by the Office of Naval Research. The Government has certain rights in the invention. --

Signed and Sealed this

Nineteenth Day of April, 2005

JON W. DUDAS
*Director of the United States Patent and Trademark Office*